United States Patent  
Richardson et al.

(10) Patent No.: US 11,032,026 B2
(45) Date of Patent: *Jun. 8, 2021

(54) HIGH PERFORMANCE, FLEXIBLE, AND COMPACT LOW-DENSITY PARITY-CHECK (LDPC) CODE

(71) Applicant: QUALCOMM Incorporated, San Diego, CA (US)

(72) Inventors: Thomas Joseph Richardson, South Orange, NJ (US); Shrinivas Kudekar, Roswell, GA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/289,113

(22) Filed: Feb. 28, 2019

(65) Prior Publication Data

US 2019/0199475 A1    Jun. 27, 2019

Related U.S. Application Data

(63) Continuation of application No. 15/622,008, filed on Jun. 13, 2017, now Pat. No. 10,291,354.

(Continued)

(51) Int. Cl.
*H04L 1/00* (2006.01)
*H04L 1/18* (2006.01)
(Continued)

(52) U.S. Cl.
CPC ........ *H04L 1/0058* (2013.01); *H03M 13/036* (2013.01); *H03M 13/116* (2013.01);
(Continued)

(58) Field of Classification Search
CPC ... H04L 1/0058; H04L 1/0067; H04L 1/1812; H04L 1/0009; H03M 13/1148; H03M 13/1177; H04B 7/0413
See application file for complete search history.

(56) References Cited

U.S. PATENT DOCUMENTS 5,583,500 A    12/1996    Allen et al.
5,844,918 A    12/1998    Kato
(Continued)

FOREIGN PATENT DOCUMENTS

CN    101188428 A    5/2008
CN    101682381 A    3/2010
(Continued)

OTHER PUBLICATIONS

Abbasfar A., et al., "Accumulate Repeat Accumulate Codes", Dec. 2, 2003, XP002585965, Retrieved from the Internet: URL: http://trs-new.jpl.nasa.gov/dspace/bitstream/2014/8047/1/03-3469.pdf [retrieved on Jun. 4, 2010], 6 pages.

(Continued)

*Primary Examiner* — Guy J Lamarre
(74) *Attorney, Agent, or Firm* — Qualcomm IP Dept.; James Hunt Yancey, Jr.

(57) ABSTRACT

Certain aspects of the present disclosure generally relate to techniques for puncturing of structured low-density parity-check (LDPC) codes. Certain aspects of the present disclosure generally relate to methods and apparatus for a high-performance, flexible, and compact LDPC code. Certain aspects can enable LDPC code designs to support large ranges of rates, blocklengths, and granularity, while being capable of fine incremental redundancy hybrid automatic repeat request (IR-HARQ) extension while maintaining good floor performance, a high-level of parallelism to deliver high throughout performance, and a low description complexity.

34 Claims, 29 Drawing Sheets

Related U.S. Application Data

(60) Provisional application No. 62/374,514, filed on Aug. 12, 2016, provisional application No. 62/349,784, filed on Jun. 14, 2016.

(51) Int. Cl.
  *H03M 13/03* (2006.01)
  *H03M 13/11* (2006.01)
  *H03M 13/00* (2006.01)

(52) U.S. Cl.
  CPC ..... *H03M 13/1148* (2013.01); *H03M 13/616* (2013.01); *H03M 13/6306* (2013.01); *H03M 13/6393* (2013.01); *H03M 13/6505* (2013.01); *H03M 13/6516* (2013.01); *H04L 1/0041* (2013.01); *H04L 1/0056* (2013.01); *H04L 1/0067* (2013.01); *H04L 1/1812* (2013.01); *H04L 1/1819* (2013.01)

(56) References Cited

U.S. PATENT DOCUMENTS

| | | |
|---|---|---|
| 6,633,865 B1 | 10/2003 | Liao |
| 6,854,082 B1 | 2/2005 | Rhee |
| 6,931,581 B1 | 8/2005 | Cassiday et al. |
| 6,961,388 B2 | 11/2005 | Ling et al. |
| 6,961,888 B2 | 11/2005 | Jin et al. |
| 7,133,853 B2 | 11/2006 | Richardson et al. |
| 7,222,284 B2 | 5/2007 | Stolpman |
| 7,493,551 B2 | 2/2009 | Berens et al. |
| 7,526,717 B2 | 4/2009 | Kyung et al. |
| 7,552,097 B2 | 6/2009 | Richardson et al. |
| 7,571,372 B1 | 8/2009 | Burd et al. |
| 7,581,159 B2 | 8/2009 | Hocevar |
| 7,627,801 B2 | 12/2009 | Jin et al. |
| 7,747,934 B2 | 6/2010 | Livshitz |
| 7,793,194 B2 | 9/2010 | Seo et al. |
| 7,840,880 B1 | 11/2010 | Bain |
| 7,979,784 B2 | 7/2011 | Shao et al. |
| 7,986,622 B2 | 7/2011 | Frazier et al. |
| 8,006,162 B2 | 8/2011 | Choi et al. |
| 8,117,516 B2 | 2/2012 | Kim et al. |
| 8,132,072 B2 | 3/2012 | El-Khamy et al. |
| 8,151,157 B2 | 4/2012 | Lee et al. |
| 8,271,846 B2 | 9/2012 | Myung et al. |
| 8,356,227 B2 | 1/2013 | Chung et al. |
| 8,418,015 B2 | 4/2013 | Cao et al. |
| 8,484,545 B2 | 7/2013 | McLaughlin et al. |
| 8,516,334 B2 | 8/2013 | Xu et al. |
| 8,601,345 B1 | 12/2013 | Huang |
| 8,687,751 B1 | 4/2014 | Lee et al. |
| 8,751,902 B2 | 6/2014 | Jin et al. |
| 8,892,979 B2 | 11/2014 | Richardson et al. |
| 9,362,956 B2 | 6/2016 | Mahdavifar et al. |
| 9,479,375 B1 | 10/2016 | Ankarali et al. |
| 9,667,381 B2 | 5/2017 | Jeong et al. |
| 9,692,451 B2 | 6/2017 | Vasista Srinivasan Ranganathan et al. |
| 9,917,675 B2 | 3/2018 | Kudekar et al. |
| 10,291,354 B2* | 5/2019 | Richardson ........ H03M 13/1148 |
| 2002/0147954 A1 | 10/2002 | Shea |
| 2003/0033575 A1 | 2/2003 | Richardson et al. |
| 2003/0053435 A1 | 3/2003 | Sindhushayana et al. |
| 2003/0123409 A1 | 7/2003 | Kwak et al. |
| 2004/0187129 A1 | 9/2004 | Richardson |
| 2005/0078765 A1 | 4/2005 | Jeong et al. |
| 2005/0149842 A1 | 7/2005 | Kyung et al. |
| 2005/0246617 A1 | 11/2005 | Kyung et al. |
| 2005/0283707 A1 | 12/2005 | Sharon et al. |
| 2005/0283708 A1 | 12/2005 | Kyung et al. |
| 2006/0020868 A1 | 1/2006 | Richardson et al. |
| 2006/0020872 A1 | 1/2006 | Richardson et al. |
| 2006/0156199 A1 | 7/2006 | Palanki et al. |
| 2006/0184855 A1 | 8/2006 | Wang et al. |
| 2006/0294445 A1 | 12/2006 | Divsalar et al. |
| 2007/0011567 A1 | 1/2007 | Choi et al. |
| 2007/0101243 A1 | 5/2007 | Kim et al. |
| 2007/0113147 A1 | 5/2007 | Hong et al. |
| 2007/0113148 A1 | 5/2007 | Hong et al. |
| 2007/0136636 A1 | 6/2007 | Tsai et al. |
| 2008/0059862 A1 | 3/2008 | Kyung et al. |
| 2008/0062975 A1 | 3/2008 | Mes et al. |
| 2008/0126916 A1 | 5/2008 | Chung et al. |
| 2008/0178065 A1 | 7/2008 | Khandekar et al. |
| 2008/0207120 A1 | 8/2008 | Kurina et al. |
| 2008/0320353 A1 | 12/2008 | Blankenship et al. |
| 2009/0158129 A1 | 6/2009 | Myung et al. |
| 2009/0204868 A1 | 8/2009 | Park et al. |
| 2009/0217129 A1 | 8/2009 | Myung et al. |
| 2009/0259915 A1 | 10/2009 | Livshitz et al. |
| 2009/0300461 A1 | 12/2009 | Shor et al. |
| 2010/0023834 A1 | 1/2010 | Richardson et al. |
| 2010/0077275 A1 | 3/2010 | Yu et al. |
| 2010/0107033 A1 | 4/2010 | Kuri et al. |
| 2010/0185926 A1 | 7/2010 | Lawson et al. |
| 2010/0199153 A1 | 8/2010 | Okamura et al. |
| 2010/0211844 A1 | 8/2010 | Yuda et al. |
| 2010/0257425 A1 | 10/2010 | Yue et al. |
| 2010/0275089 A1 | 10/2010 | Mow et al. |
| 2010/0325511 A1 | 12/2010 | Oh et al. |
| 2011/0047433 A1 | 2/2011 | Abu-Surra et al. |
| 2011/0066916 A1 | 3/2011 | Abu-Surra et al. |
| 2011/0096862 A1 | 4/2011 | Kuri et al. |
| 2011/0126072 A1 | 5/2011 | Yoshimoto et al. |
| 2011/0161772 A1 | 6/2011 | Yoshii et al. |
| 2012/0084625 A1 | 4/2012 | Pisek et al. |
| 2012/0166917 A1 | 6/2012 | El-Khamy et al. |
| 2012/0240001 A1 | 9/2012 | Abu-Surra et al. |
| 2012/0317461 A1 | 12/2012 | Hwang et al. |
| 2013/0051556 A1 | 2/2013 | Myung et al. |
| 2013/0117344 A1 | 5/2013 | Gross et al. |
| 2013/0272378 A1 | 10/2013 | Sole Rojals et al. |
| 2014/0003533 A1 | 1/2014 | He et al. |
| 2014/0019820 A1 | 1/2014 | Vardy et al. |
| 2014/0040214 A1 | 2/2014 | Ma et al. |
| 2014/0173376 A1 | 6/2014 | Jeong et al. |
| 2014/0201592 A1 | 7/2014 | Shen et al. |
| 2014/0229788 A1 | 8/2014 | Richardson |
| 2014/0229789 A1 | 8/2014 | Richardson |
| 2014/0304574 A1 | 10/2014 | Seo et al. |
| 2014/0365842 A1 | 12/2014 | Li et al. |
| 2014/0365845 A1 | 12/2014 | Pantelias et al. |
| 2015/0120798 A1 | 4/2015 | Jeong et al. |
| 2015/0188666 A1 | 7/2015 | Mahdavifar et al. |
| 2015/0229337 A1 | 8/2015 | Alhussien et al. |
| 2015/0293716 A1 | 10/2015 | Jiang et al. |
| 2015/0381208 A1 | 12/2015 | Li et al. |
| 2016/0013810 A1 | 1/2016 | Gross et al. |
| 2016/0013931 A1 | 1/2016 | Pisek et al. |
| 2016/0087648 A1 | 3/2016 | Korb et al. |
| 2016/0164537 A1 | 6/2016 | Pisek et al. |
| 2016/0164629 A1 | 6/2016 | Ahn et al. |
| 2016/0173132 A1 | 6/2016 | Cho |
| 2016/0218750 A1 | 7/2016 | Ma |
| 2016/0380763 A1 | 12/2016 | Ahn et al. |
| 2017/0047947 A1 | 2/2017 | Hong et al. |
| 2017/0141798 A1 | 5/2017 | Kudekar et al. |
| 2017/0187489 A1 | 6/2017 | Myung et al. |
| 2017/0222663 A1 | 8/2017 | Parthasarathy et al. |
| 2017/0230149 A1 | 8/2017 | Wang et al. |
| 2017/0331494 A1 | 11/2017 | Richardson et al. |
| 2017/0331497 A1 | 11/2017 | Richardson et al. |
| 2017/0353267 A1 | 12/2017 | Kudekar et al. |
| 2017/0353269 A1 | 12/2017 | Lin et al. |
| 2017/0359086 A1 | 12/2017 | Kudekar et al. |
| 2017/0359148 A1 | 12/2017 | Richardson et al. |
| 2018/0034593 A1 | 2/2018 | Xu et al. |
| 2018/0152205 A1 | 5/2018 | Kim et al. |
| 2018/0205498 A1 | 7/2018 | Kudekar et al. |
| 2018/0226992 A1 | 8/2018 | Panteleev et al. |
| 2018/0358984 A1 | 12/2018 | Richardson et al. |
| 2018/0367245 A1 | 12/2018 | Soriaga et al. |
| 2018/0367253 A1 | 12/2018 | Nammi et al. |

(56) References Cited

U.S. PATENT DOCUMENTS

| | | |
|---|---|---|
| 2019/0013900 A1 | 1/2019 | Patel et al. |
| 2019/0052400 A1 | 2/2019 | Soriaga et al. |
| 2019/0245654 A1 | 8/2019 | Richardson et al. |
| 2019/0260507 A1 | 8/2019 | Lin et al. |
| 2019/0280817 A1 | 9/2019 | Kudekar et al. |
| 2019/0356337 A1 | 11/2019 | Richardson et al. |
| 2020/0052817 A1 | 2/2020 | Kudekar et al. |
| 2020/0059317 A1 | 2/2020 | Patel et al. |
| 2020/0067641 A1 | 2/2020 | Ma et al. |
| 2020/0162109 A1 | 5/2020 | Zhang et al. |
| 2020/0322085 A1 | 10/2020 | Kudekar et al. |
| 2020/0412387 A1 | 12/2020 | Kudekar |
| 2021/0058192 A1 | 2/2021 | Richardson |

FOREIGN PATENT DOCUMENTS

| | | |
|---|---|---|
| CN | 102017426 A | 4/2011 |
| CN | 102437858 A | 5/2012 |
| CN | 102651652 A | 8/2012 |
| CN | 102783206 A | 11/2012 |
| CN | 103188044 A | 7/2013 |
| CN | 103746708 A | 4/2014 |
| CN | 103780329 A | 5/2014 |
| CN | 105227189 A | 1/2016 |
| CN | 105284053 A | 1/2016 |
| CN | 105306165 A | 2/2016 |
| CN | 105337696 A | 2/2016 |
| CN | 106341138 A | 1/2017 |
| EP | 1601109 A2 | 11/2005 |
| EP | 2091171 A2 | 8/2009 |
| EP | 2096760 A1 | 9/2009 |
| EP | 2899912 A1 | 7/2015 |
| EP | 3046259 A1 | 7/2016 |
| EP | 3264611 A1 | 1/2018 |
| JP | 2007507156 A | 3/2007 |
| JP | 2011514049 A | 4/2011 |
| JP | 2016539534 A | 12/2016 |
| KR | 101157246 B1 | 6/2012 |
| KR | 20170053589 A | 5/2017 |
| RU | 2520406 C2 | 6/2014 |
| TW | 200711359 A | 3/2007 |
| WO | 2002062002 A1 | 8/2002 |
| WO | WO-2009011134 A1 | 1/2009 |
| WO | WO-2015139297 A1 | 9/2015 |
| WO | 2017092693 A1 | 6/2017 |
| WO | WO-2017091244 A1 | 6/2017 |
| WO | WO-2017209837 A1 | 12/2017 |
| WO | WO-2018029633 A1 | 2/2018 |
| WO | WO-2018030927 A1 | 2/2018 |
| WO | 2018050062 A1 | 3/2018 |
| WO | WO-2018128560 A1 | 7/2018 |
| WO | WO-2018144560 A1 | 8/2018 |

OTHER PUBLICATIONS

Alcatel-Lucent et al., "LDPC Coding Proposal for LBC", 3GPP2 Draft; C30-20070226-002_C30-20070212-034R1_AHLQRZ_LDPC_PROPOSAL_FOR_LBC, Mar. 27, 2007, XP062206073, Retrieved from the Internet: URL:http://ftp.3gpp2.org/TSGC/Working/2007/2007-03-Atlanta/TSG-C-2007-03-Atlanta/WG3/LDPC Ad Hoc Call,2007.02.26/ pp. 1-27.

Arikan E., "A Survey of Reed-Muller Codes From Polar Coding Perspective", Information Theory Workshop (ITW), Piscataway, NJ, USA, Jan. 6, 2010, pp. 1-5, XP031703947, ISBN: 978-1-4244-6372-5.

Arikan E., "Channel Polarization: a Method for Constructing Capacity-Achieving Codes for Symmetric Binary-Input Memoryless Channels," IEEE Transactions on Information Theory, vol. 55 (7), 2009, pp. 3051-3073, XP080428257.

Chen B., et al., "List Viterbi Algorithms for Continuous Transmission", IEEE Transactions on Communications, vol. 49 No. 5, XP011009921, May 1, 2001, pp. 784-792.

Chen T.Y., et al., "Protograph-based Raptor-Like LDPC Codes with Low Thresholds", IEEE International Conference on Communications, Jun. 10, 2012, DOI: 10.1109/ICC.2012.6363996, ISBN: 978-1-4577-2052-9, pp. 2161-2165.

Chiu M.C., et al., "Reduced-Complexity SCL Decoding of Multi-CRC-Aided Polar Codes", Sep. 28, 2016, XP055384603, pp. 1-9, Retrieved from the Internet: URL:https://arxiv.org/pdf/1609.08813.pdf [retrieved on Jun. 23, 2017].

Deng X., et al., "Segmented Cyclic Redundancy Check: A Data Protection Scheme for Fast Reading RFID Tag's Memory," IEEE Wireless Communications and Networking Conference, 2008, pp. 1576-1581.

El-Khamy M., et al., "Binary Polar Codes are Optimized Codes for Bitwise Multistage Decoding", Computer Science, Information Theory,Arxiv.org, Cornell University Library, 201 Olin Library Cornell University Ithaca, NY 14853, Apr. 12, 2016, XP080695103, DOI: 10.1049/EL.2016.0837, 2 pages.

Ericsson: "Design Parameters and Implementation Aspects of LPDC Codes," 3GPP Draft; R1-1703537 Design Parameters and Implementation Aspects of LDPC Codes, 3rd Generation Partnership Project (3GPP), Mobile Competence Centre; 650, Route Des Lucioles; F-06921 Sophia-Antipolis, vol. RAN WG1, No. Athens, Greece; Feb. 13, 2017-Feb. 17, 2017, Feb. 15, 2017, XP051222070, 10 pages, Retrieved from the Internet: URL: http://www.3gpp.org/ftp/tsg_ran/WG1_RL1/TSGR1_88/Docs/ [retrieved on Feb. 15, 2017].

Ericsson: "Performance and Complexity of Per-Segment CRC Attachment Methods" 3GPP Draft; R1-073741, 3rd Generation Partnership Project (3GPP), Mobile Competence Centre, 650, Route Des Lucioles, F-06921, Sophia-Antipolis Cedex, France, vol. RAN WG1, No. Athens, Greece; Aug. 15, 2007, XP050107330, 3 pages.

Hashemi S.A., et al., "Partitioned Successive-Cancellation List Decoding of Polar Codes", 2016 IEEE International Conference on Acoustics. Speech and Signal Processing (ICASSP), Mar. 20, 2016, pp. 957-960, XP032900743, DOI: 10.1109/ICASSP.2016.7471817, [retrieved on May 18, 2016].

IEEE: "IEEEStd 802.16e-2005, Air Interface For Fixed and Mobile Broadband Wireless Access Systems," Amendment 2 and Corrigendum 1 to IEEE Std 802.16-2004, IEEE STD 802.16E-2005, Feb. 28, 2006 (Feb. 28, 2006), pp. 626-630, XP002515198.

Jun Lin et al., "A reduced latency list decoding algorithm for polar codes", 2014 IEEE Workshop on Signal Processing Systems (SIPS), Oct. 1, 2014, p. 1-6.

Liu J., et al., "Rate-Compatible LDPC Codes with Short Block Lengths Based on Puncturing and Extension Techniques," 2014, pp. 1-20.

Lucas R et al., "Improved Soft-Decision Decoding of Reed-Muller Codes as Generalized Multiple Concatenated Codes", ITG-FACHBERI, vol. 183, VDE-Verlag, DE, No. 146, Mar. 5, 1998, pp. 137-142.

Mahdavifar H., et al., "On the Construction and Decoding of Concatenated Polar Codes", IEEE International Symposium on Information Theory, Jul. 7, 2013, pp. 952-956, XP032497043, ISSN: 2157-8095, DOI: 10.1109/ISIT.2013.6620367 [retrieved on Oct. 3, 2013].

Myung S., et al., "Extension of Quasi-cyclic LDPC Codes by Lifting," Proc ., IEEE International Symposium on Information Theory, ISIT 2005, Adelaide, Australia, Sep. 4, 2005 (Sep. 4, 2005),-Sep. 9, 2005 (Sep. 9, 2005), pp. 2305-2309, XP010845965, ISBN: 978-0-7803-9151-2.

Myung S., et al., "Lifting Methods for Quasi-Cyclic LDPC Codes", IEEE Communications Letters, Jun. 2006, vol. 10, No. 6, pp. 489-491.

Nguyen T.V., et al., "The Design of Rate-Compatible Protograph LDPC Codes", IEEE Transactions on Communications, Oct. 1, 2012, vol. 60, No. 10, XP011469171, ISSN: 0090-6778, DOI: 10.1109/TCOMM.2012.081012.110010, pp. 2841-2850.

Niu K., et al., "CRC-Aided Decoding of Polar Codes," IEEE Communications Letters, Oct. 2012, vol. 16, No. 10, pp. 1668-1671.

Richardson T., et al., "Design of Low-Density Parity Check Codes for 5G New Radio," IEEE Communications Magazine, vol. 56 (3), Mar. 1, 2018, pp. 28-34, XP055480192.

(56) References Cited

OTHER PUBLICATIONS

Shea J.M., et al., "Multidimensional Codes" In: "Wiley Encyclopedia of Telecommunications," Jan. 1, 2003, vol. 3, pp. 1538-1551, XP055402230.

Tal I., et al., "List Decoding of Polar Codes", IEEE Transactions on Information Theory, Institute of Electrical and Electronics Engineers, May 2015, vol. 61, No. 5, pp. 2213-2226.

<span style="font-family: calibri;">Guo J., et al., "Multi-CRC Polar Codes and Their Applications", IEEE Communications Letters,< span style="font-family: calibri;">Feb. 2016, vol. 20, No. 2, pp. 212-215.

Arikan E., "Challenges and some new directions in channel coding," Computer Science, Information Theory, arXiv:1504.03916, Apr. 15, 2015, 11 pages.

Leroux C., et al., "A Semi-Parallel Successive-Cancellation Decoder for Polar Codes," IEEE Transactions on Signal Processing, Jan. 2013, vol. 61, No. 2, pp. 1-11.

Mahdavifar H., et al., "Fast Multi-dimensional Polar Encoding and Decoding," Information Theory and Applications Workshop (ITA), IEEE, 2014, 5 pages.

Ericsson: "System Information for Low Complexity and Extended Coverage", 3GPP Draft; R1-1708730—SYSINFO for Low Complexity and EXT Coverage, 3rd Generation Partnership Project (3GPP), Mobile Competence Centre; 650, Route Des Lucioles; F-06921 Sophia-Antipolis Cedex; France, vol. RAN WG1, No. Hangzhou, China; May 15, 2017-May 19, 2017 May 7, 2017, XP051263297, Retrieved from the Internet: URL:http://www.3gpp.org/ftp/tsg_ran/WG1_RL1/TSGR1_89/Docs/ [retrieved on May 7, 2017], 3 pages.

Nokia et al., "LDPC Design for eMBB", 3GPP Draft; R1-1705857_LDPC Design for EMBB, 3rd Generation Partnership Project (3GPP), Mobile Competence Centre; 650, Route Des Lucioles; F-06921 Sophia-Antipolis Cedex; France, vol. RAN WG1, No. Spokane, WA, USA; Apr. 3, 2017-Apr. 7, 2017 Mar. 24, 2017, XP051250965, Retrieved from the Internet: URL:http://www.3gpp.org/ftp/tsg_ran/WG1_RL1/TSGR1_88b/Docs/ [retrieved on Mar. 24, 2017], 8 pages.

Qualcomm Incorporated: "LDPC Rate Matching", 3GPP Draft; R1-1708640_LDPC RATE_MATCHING, 3rd Generation Partnership Project (3GPP), Mobile Competence Centre; 650, Route Des Lucioles; F-06921 Sophia-Antipolis Cedex; France, vol. RAN WG1, No. Hangzhou, China; May 15, 2017-May 19, 2017 May 14, 2017, XP051273827, Retrieved from the Internet: URL:http://www.3gpp.org/ftp/Meetings_3GPP_SYNC/RAN1/Docs/ [retrieved on May 14, 2017], 3 pages.

Stolte N., Rekursive Codes mit der Plotkin-Konstruktion und ihre Decodierung, D17 Darmstadter Dissertation, Jan. 1, 2002, 151 pages, (in particular, pp. 13-30), XP055241445, URL:http:I/tuprints.ulb.tu-darmstadt.de/epda/000183/stolte.pdf, Techn. Universitat, Diss., 2002 (Nicht f. d. Austausch)_Darmstadt [retrieved on Jan. 14, 2016].

Tal I., et al., "List Decoding of Polar Codes", IEEE Transactions on Information Theory, May 31, 2012, pp. 1-11.

Trifonov P., "Efficient Design and Decoding of Polar Codes", IEEE Transactions on Communications, vol. 60, No. 11, Nov. 1, 2012, XP011473857, ISSN: 0090-6778, DOI: 10.1109/TCOMM.2012.081512.110872, pp. 3221-3227.

Trifonov P., et al., "Generalized Concatenated Codes based on Polar Codes", 8th International Symposium on Wireless Communication Systems, Nov. 6, 2011, XP032090122, pp. 442-446, DOI: 10.11 09/ISWCS.2011.6125399, ISBN: 978-1-61284-403-9.

Trifonov P., et al., "Fast Encoding of Polar Codes with Reed-Solomon Kernel," IEEE Transactions on Communications, May 2016, pp. 1-8.

Wang T., et al., "Parity-Check-Concatenated Polar Codes", IEEE Communications Letters, IEEE Service Center, Piscataway, NJ, US, vol. 20, No. 12, Dec. 1, 2016, pp. 2342-2345, XP011636292, ISSN: 1089-7798, DOI: 10.1109/LCOMM.2016.2607169 [retrieved on Dec. 8, 2016].

Wang Y., et al., "Concatenations of Polar Codes With Outer BCH Codes and Convolutional Codes", 2014 52nd Annual Allerton Conference on Communication, Control, and Computing (Allerton), Sep. 30, 2014, pp. 813-819, XP032731136, DOI: 10.1109/ALLERTON.2014.7028538 [retrieved on Jan. 30, 2015].

Zhou H., et al., "Segmented CRC-Aided SC List Polar Decoding", 2016 IEEE 83rd Vehicular Technology Conference, May 15, 2016, XP032918751, pp. 1-5, DOI: 10.1109/VTCSPRING.2016.7504469, [retrieved on Jul. 5, 2016].

Interdigital Inc: "Code Block Segmentation for Data Channel", 3GPP Draft; R1-1710958, Code Block Segmentation for Data Channel, 3rd Generation Partnership Project (3GPP), Mobile Competence Centre; 650 Route Des Lucioles; F-06921, Sophia-Antipolis Cedex; France, vol. RAN WG1, No. Qingdao; Jun. 27, 2017-Jun. 30, 2017, Jun. 26, 2017 (Jun. 26, 2017), XP051300159, Retrieved from the Internet: URL: http://www.3gpp.org/ftp/Meetings_3GPP_SYNC/RAN1/Docs/ [retrieved on Jun. 26, 2017].

Shi L., "Research on Polar Code Characters and its Encoding and Decoding Method", Chinese Master's Theses Full-Text Database, Information Science and Technology, Issue No. 12, Dec. 15, 2015.

Qualcomm Incorporated: "LDPC Segmentation", 3GPP Draft; R1-1711211, LDPC Segmentation, 3rd Generation Partnership Project (3GPP), Mobile Competence Centre, 650, Route Des Lucioles, F-06921, Sophia-Antipolis Cedex, France, vol. RAN WG1, No. Qingdao, China; Jun. 27, 2017-Jun. 30, 2017, Jun. 26, 2017 (Jun. 26, 2017), XP051300410, pp. 1-6, Retrieved from the Internet: URL: http://www.3gpp.org/ftp/Meetings_3GPP_SYNC/RAN1/Docs/ [retrieved on Jun. 26, 2017].

ZTE: "NR LDPC Design", 3GPP Draft; R1-1709289, NR LDPC design, 3rd Generation Partnership ProjecT (3GPP), Mobile Competence Centre; 650, Route Des Lucioles; F-06921, Sophia-Antipolis Cedex; France, vol. RAN WG1, No. Hangzhou, China; May 15, 2017-May 19, 2017, May 16, 2017 (May 16, 2017), XP051285041, pp. 1-12, Retrieved from the Internet: URL: http://www.3gpp.org/ftp/tsg_ran/WG1_RL1/TSGR1_89/Docs/ [retrieved on May 16, 2017].

Shi L., Chinese Master's Theses Full-Text Database, Information Science and Technology, Issue No. 12, Dec. 15, 2015.

Examiner Requisition for CA03021881 dated Nov. 7, 2018.

Examiner Requisition for CA03021881 dated Jan. 28, 2019.

Qualcomm Incorporated: "LDPC Design Overview", 3GPP TSG-RAN WG1#85, R1-164697, May 2016, pp. 1-5, URL: http://www.3gpp.org/ftp/tsg_ran/WG1_RL1/TSGR1_812/Docs/R1-164697.zip.

Qualcomm Incorporated: "Polar code design overview", 3GPP Draft, 3GPP TSG-RAN WG1 #85, R1-164699_POLAR_DESIGN_OVERVIEW, 3rd Generation Partnership Project (3GPP), Mobile Competence Centre, 650, Route Des Lucioles, F-06921 Sophia-Antipolis Cedex, France, vol. RAN WG1, No. Nanjing, China, May 23, 2016-May 27, 2016 May 14, 2016 (May 14, 2016), XP051089936, 3 pages, Retrieved from the Internet:URL:http://www.3gpp.org/ftp/tsg_ran/WG1_RL1/TSGR1_85/Docs/ [retrieved on May 14, 2016].

Richardson T., et al., "LDPC Proposal Update", 3GPP2-Drafts, Dec. 18, 2006 (Dec. 18, 2006), pp. 1-30, XP040476671, ftp://ftp.3gpp2.org/TSGC/Working/2007/2007-01-Vancouver/TSG-C-2007-01-Vancouver/WG3/Distribution%202006.12.18/C30-20061218-004_QCOM_LDPC_proposal_update.pdf.

Supplementary European Search Report—EP16910045—Search Authority—Munich—dated Feb. 27, 2020.

Taiwan Search Report—TW106119825—TIPO—dated Jul. 25, 2019.

Taiwan Search Report—TW108126369—TIPO—dated Nov. 26, 2019.

Ericsson: "Implementation and Performance of LDPC Decoder", 3GPP TSG RAN WG1 AH_NR Meeting R1-1700111, Jan. 20, 2017, 8 Pages.

European Search Report—EP20155417—Search Authority—Munich—dated May 19, 2020.

Intel Corporation: "LDPC Code Design for NR", 3GPP TSG RAN WG1 Meeting #85, 3GPP Draft; R1-164183, 3rd Generation Partnership Project (3GPP), Mobile Competence Centre; 650, Route Des Lucioles; F-06921 Sophia-Antipolis Cedex; France, vol. RAN WG1, No. Nanjing, China; May 23, 2016-May 27, 2016, May 14, 2016 (May 14, 2016), 4 Pages, XP051090075, Retrieved from the

(56) References Cited

OTHER PUBLICATIONS

Internet: URL: http://www.3gpp.org/ftp/tsg_ran/WG1_RL1/TSGR1_85/Docs/ [retrieved on May 14, 2016] p. 1-p. 3.
CNIPA, Notice on the First Office Action for Application No. 201680065876.1, Jun. 18, 2020, 19 pages (Native language CNIPA Office Action and English-language translation provided by foreign counsel).
CNIPA Office Action for CN application No. 201780033491.1, Mar. 26, 2019, 13 pages.
Huawei: "Details of the Polar code design", 3GPP TSG RAN WG1 Meeting #87, R1-1611254, Reno, USA, Nov. 10-14, 2016, 15 pages.
Samsung: "Flexibility of LDPC—Length, Rate and IR-HARQ", R1-164007, 3GPP TSG RAN WG1 #85, Nanjing, China, May 23-27, 2016, 8 Pages.
Samsung: "Preliminary evaluation results on new channel coding scheme for NR-LDPC code for high throughput", 3GPP TSG-RAN WG1#85, R1-164812, May 14, 2016, 17 Pages.
Intel Corporation: "LDPC Coding Chain" [online], 3GPP Draft, 3GPP TSG RAN WG1 Meeting NR-Adhoc#2, R1-1711344, 3rd Generation Partnership Project (3GPP), Mobile Competence Centre, 650, Route Des Lucioles, F-06921 Sophia-Antipolis Cedex, France, vol. RAN WG1, No. Qingdao, P.R. China, Jun. 27, 2017-Jun. 30, 2017, Jun. 20, 2017 (Jun. 20, 2017), XP051305812, pp. 1-6, Retrieved from the Internet: URL: http://www.3gpp.org/ftp/tsg_ran/WG1_RL1/TSGR1_AH/NR_AH_1706/Docs/ [retrieved on Jun. 20, 2017].
Nokia: "Rate Matching for LDPC" [online], 3GPP TSG RAN WG1 NR Ad-Hoc#2, R1-1711536, Jun. 19, 2017, 5 Pages, Internet URL: http://www.3gpp.org/ftp/tsg_ran/WG1_RL1/TSGR1_AH/NR_AH_1706/Docs/R1-1711536.zip. (In particular, refer to Section 2).
Qualcomm Incorporated: "LDPC Rate Compatible Design" [online], 3GPP TSG-RAN WG1 #89, R1-1709181, May 13, 2017, pp. 1-11, Retrieved from the Internet URL:http://www.3gpp.org/ftp/tsg_ran/WG1_RL1/TSGR1_89/Docs/R1-1709181.zip. (In particular, refer to Section 1).
Alcatel-Lucent et al., "LDPC Coding Proposal for LBC", 3GPP2-Drafts, 2500 Wilson Boulevard, Suite 300, Arlington, Virginia 22201, USA, Mar. 15, 2007, XP040477608, 32 pages.
El-Khamy M., et al., "Design of Rate Compatible Structured LDPC Codes for Hybrid ARQ Applications", IEEE, Aug. 1, 2009, vol. 27(6), pp. 965-973.
"IEEE Standard for Local and Metropolitan Area Networks Part 16: Air Interface for Broadband Wireless Access Systems; IEEE Std 802.16-2009 (Revision of IEEE Std 802.16-2004)", May 29, 2009, XP068045637, ISBN: 978-0-7381-5919-5, pp. 1-2080.
International Search Report and Written Opinion—PCT/CN2017/077868—ISA/EPO—dated Jun. 2, 2017.
International Search Report and Written Opinion—PCT/US2017/037465—ISA/EPO—dated Sep. 27, 2017.
International Search Report and Written Opinion—PCT/US2017/037468—ISA/EPO—dated Sep. 22, 2017.
Jiang M., et al., "An Improved Variable Length Coding Scheme Using Structured LDPC Codes", IEEE, Oct. 1, 2010, 5 Pages.
Mackay D.J.C., "Good Error-Correcting Codes Based on Very Sparse Matrices," IEEE Transactions on Information Theory, Mar. 1999, vol. 45 (2), pp. 399-431.
Mediatek Inc: "Multi-Codebook Embedded Compact QC-LDPC Designs", 3GPP TSG-RAN WG1 NR, R1-1706175, Apr. 4, 2017, XP051252463, Retrieved from the Internet: URL:http://www.3gpp.org/ftp/tsg_ran/WG1_RL1/TSGR1_88b/Docs/, 14 pages.
Qualcomm Incorporated: "LDPC Codes—HARQ, Rate", 3GPP Draft; R1-162209, LDPC_RATECOMPATIBILITY_HIGHLEVELDESIGN, 3rd Generation Partnership Project (3GPP), Mobile Competence Centre, 650, Route Des Lucioles ; F-06921 Sophia-Antipolis Cedex; France, vol. RAN WG1, No. Busan, Korea; Apr. 2, 2016, XP051080037, Retrieved from the Internet: URL:http://www.3gpp.org/ftp/tsg_ran/WG1_RL1/TSGR1_84b/Docs/, 4 pages.
Qualcomm Incorporated: "LDPC Rate Compatible Design Overview", 3GPP Draft; R1-1610137, 3rd Generation Partnership Project (3GPP), Mobile Competence Centre, 650, Route Des Lucioles; F-06921; Sophia-Anti Polis Cedex, vol. RAN WG1. No. Lisbon, Portugal, Oct. 9, 2016, 27 pages, XP051150160, Retrieved from the Internet: URL: http://www.3gpp.org/ftp/Meetings_3GPP_SYNC/RAN1/Docs/ [retrieved on Oct. 9, 2016].
Roth C., et al., "A 15.8 pJ/bit/iter Quasi-Cyclic LDPC Decoder for IEEE 802.11n in 90 nm CMOS," IEEE Asian Solid-State Circuits Conference, Nov. 8-10, 2010, 4 pages.
Surra S.A., et al., "Gigabit Rate Achieving Low-Power LDPC Codes: Design and Architecture", IEEE, Mar. 1, 2011, pp. 1994-1999.
Xie Y., et al., "Design of Rate Compatible Protograph-based LDPC Codes with Mixed Circulants", IEEE, 6th International Symposium on Turbo Codes & Iterative Information Processing, Sep. 2010, pp. 434-438.
Zhang Z., et al., "An Efficient 10GBASE-T Ethernet LDPC Decoder Design With Low Error Floors," IEEE Journal of Solid-State Circuits, Apr. 2010, vol. 45 (4), pp. 843-855.
ZTE: "Structured LDPC Coding with Rate Matching", 3GPP Draft; R1-060115, Mobile Competence Centre ; 650, Route Des Lucioles; F-06921 Sophia-Antipolis Cedex; France, vol. RAN WG1, No. Helsinki, Finland; Jan. 19, 2006, XP050950962, Retrieved from the Internet: URL:http://www.3gpp.org/ftp/tsg_ran/WG1_RL1/TSGR1_AH/LTE_AH_0601/Docs/, 13 pages.
European Search Report—EP20155376—Search Authority—Munich—dated Nov. 27, 2020.
Zte et al., "Compact LDPC Design for eMBB", 3GPP Draft, 3GPP TSG RAN WG1 AH NR Meeting, R1-1700247 Compact LDPC Design for EMBB_Final, 3rd Generation Partnership Project (3GPP), Mobile Competence Centre, 650, Route Des Lucioles, F-06921 Sophia-Antipolis Cedex, France, vol. RAN WG1. No. Spokane, USA, Jan. 16, 2017-Jan. 20, 2017 Jan. 10, 2017 (Jan. 10, 2017), XP051202750, pp. 1-16, Retrieved from the Internet: URL:http://www.3gpp.org/ftp/tsg_ran/WG1_RL1/TSGR1_AH/NR_AH_1701/Docs/ [retrieved on-Jan. 10, 2017] p. 1-p. 13.

\* cited by examiner

| $k_b$ | 24 | 25 | 26 | 27 | 28 | 29 | 30 |
|---|---|---|---|---|---|---|---|
| 3-Deg of Check 1 | 14 | 15 | 16 | 16 | 16 | 17 | 17 |
| 3-Deg of Check 2 | 9 | 9 | 9 | 9 | 10 | 11 | 12 |
| 3-Deg of Check 3 | 13 | 13 | 14 | 15 | 16 | 16 | 17 |
| 3-Deg of Check 4 | 10 | 10 | 10 | 11 | 12 | 12 | 12 |
| 3-Deg of Check 5 | 10 | 11 | 12 | 12 | 12 | 13 | 14 |
| 3-Deg of Check 6 | 12 | 12 | 13.5 | 14 | 13 | 13 | 13 |
| Avg 3-Deg with one punct. edge | 10.5 | 11 | 11.25 | 11.75 | 12.75 | 15 | 15.5 |
| Avg 3-Deg with two punct. edge | | 15 | 16 | 16 | 16 | 13 | 13.5 |
| Maximal 3-Deg | 14 | 15 | 16 | 16 | 16 | 17 | 17 |

| $k_b$ | Row 1 deg | Row 2 deg | Row 3 deg | Row 4 deg | Row 5 deg | Row 6 deg |
|---|---|---|---|---|---|---|
| 30 | 14 | 14 | 14 | 14 | 14 | 14 |
| 29 | 13 | 14 | 14 | 13 | 14 | 13 |
| 28 | 13 | 13 | 13 | 13 | 13 | 13 |
| 27 | 13 | 12 | 12 | 12 | 13 | 12 |
| 26 | 12 | 12 | 11 | 12 | 12 | 12 |
| 25 | 12 | 11 | 11 | 12 | 12 | 11 |
| 24 | 11 | 11 | 11 | 11 | 11 | 11 |

FIG. 20

| $k_b$ | Row 1 | Row 2 | Row 3 | Row 4 | Row 5 | Row 6 | Row 7 | Row 8 |
|---|---|---|---|---|---|---|---|---|
| 20 | 7 | 7 | 6 | 7 | 7 | 7 | 6 | 7 |
| 19 | 6 | 7 | 6 | 7 | 6 | 7 | 6 | 6 |
| 18 | 6 | 6 | 6 | 6 | 6 | 6 | 6 | 6 |
| 17 | 5 | 5 | 6 | 6 | 6 | 5 | 6 | 6 |
| 16 | 5 | 5 | 6 | 6 | 5 | 5 | 5 | 5 |

| $k_b$ | Row 1 | Row 2 | Row 3 | Row 4 | Row 5 | Row 6 | Row 7 | Row 8 | Row 9 | Row 10 |
|---|---|---|---|---|---|---|---|---|---|---|
| 10 | 2 | 2 | 3 | 3 | 3 | 2 | 2 | 3 | 2 | 2 |
| 9 | 2 | 2 | 2 | 3 | 2 | 2 | 2 | 2 | 2 | 2 |
| 8 | 2 | 2 | 2 | 2 | 2 | 2 | 2 | 1 | 1 | 2 |

2200

| $k_b$ | 16 | 17 | 18 | 19 | 20 |
|---|---|---|---|---|---|
| 3-Deg of Check 1 | 7 | 7 | 7 | 8 | 8 |
| 3-Deg of Check 2 | 7 | 8 | 8 | 8 | 8 |
| 3-Deg of Check 3 | 4 | 4 | 4 | 5 | 6 |
| 3-Deg of Check 4 | 5 | 6 | 7 | 7 | 7 |
| 3-Deg of Check 5 | 6 | 6 | 6 | 6 | 7 |
| 3-Deg of Check 6 | 4 | 4 | 5 | 6 | 6 |
| 3-Deg of Check 7 | 4 | 5 | 5 | 5 | 5 |
| 3-Deg of Check 8 | 5 | 5 | 6 | 6 | 7 |
| Avg 3-Deg with one punct. edge | 7 | 7.5 | 7.5 | 8 | 8 |
| Avg 3-Deg with two punct. edge | 4.67 | 5 | 5.5 | 5.83 | 6.3 |
| Maximal 3-Deg | 7 | 8 | 8 | 8 | 8 |

| $k_b$ | 8 | 9 | 10 |
|---|---|---|---|
| 3-Deg of Check 1 | 3 | 3 | 3 |
| 3-Deg of Check 2 | 3 | 3 | 4 |
| 3-Deg of Check 3 | 3 | 4 | 4 |
| 3-Deg of Check 4 | 3 | 3 | 3 |
| 3-Deg of Check 5 | 1 | 1 | 1 |
| 3-Deg of Check 6 | 1 | 1 | 1 |
| 3-Deg of Check 7 | 1 | 1 | 1 |
| 3-Deg of Check 8 | 1 | 1 | 2 |
| 3-Deg of Check 9 | 1 | 2 | 3 |
| 3-Deg of Check 10 | 1 | 2 | 3 |
| Avg 3-Deg with one punct. edge | 3 | 3.25 | 3.5 |
| Avg 3-Deg with two punct. edge | 1 | 1.33 | 1.83 |
| Maximal 3-Deg | 3 | 4 | 4 |

HIGH PERFORMANCE, FLEXIBLE, AND COMPACT LOW-DENSITY PARITY-CHECK (LDPC) CODE

CROSS-REFERENCE TO RELATED APPLICATIONS & PRIORITY CLAIM

This application is a continuation of U.S. patent application Ser. No. 15/622,008, filed Jun. 13, 2017 (issued as U.S. Pat. No. 10,291,354 on May 14, 2019), which claims benefit of and priority to U.S. Provisional Patent Application Ser. No. 62/349,784, filed Jun. 14, 2016, and to U.S. Provisional Patent Application Ser. No. 62/374,514, filed Aug. 12, 2016, which are herein incorporated by reference in their entirety for all applicable purposes.

TECHNICAL FIELD

Certain aspects of the technology discussed below generally relate to methods and apparatus for a high-performance, flexible, and compact low-density parity-check (LDPC) code. More particularly, certain aspects provide techniques for LDPC code designs for large ranges of code rates, blocklengths, and granularity, while being capable of fine incremental redundancy hybrid automatic repeat request (IR-HARM) extension and maintaining good error floor performance, a high-level of parallelism for high throughout performance, and a low description complexity.

INTRODUCTION

Wireless communication systems are widely deployed to provide various types of communication content such as voice, video, data, messaging, broadcasts, and so on. These systems may employ multiple-access technologies capable of supporting communication with multiple users by sharing available system resources (e.g., bandwidth and transmit power). Examples of such multiple-access systems include code division multiple access (CDMA) systems, time division synchronous CDMA (TD-SCDMA), time division multiple Access (TDMA) systems, frequency division multiple access (FDMA) systems, single-carrier FDMA (SC-FDMA) systems, orthogonal frequency division multiple access (OFDMA) systems, long term evolution (LTE) systems, $3^{rd}$ Generation Partnership Project (3GPP) LTE systems, LTE Advanced (LTE-A) systems. These multiple access technologies have been adopted in various telecommunication standards to provide a common protocol that enables different wireless devices to communicate on a municipal, national, regional, and even global level. An example of an emerging telecommunication standard is new radio (NR), for example, 5G radio access. NR is a set of enhancements to the LTE mobile standard promulgated by 3GPP. It is designed to better support mobile broadband Internet access by improving spectral efficiency, lowering costs, improving services, making use of new spectrum, and better integrating with other open standards using OFDMA with a cyclic prefix (CP) on the downlink (DL) and on the uplink (UL) as well as support beamforming, multiple-input multiple-output (MIMO) antenna technology, and carrier aggregation.

Generally, a wireless multiple-access communication system can simultaneously support communication for multiple wireless nodes. Each node communicates with one or more base stations (BSs) via transmissions on forward and reverse links. The forward link (or downlink) refers to a communication link from BSs to nodes, and a reverse link (or uplink) refers to a communication link from nodes to base stations. Communication links may be established via a single-input single-output, multiple-input single-output, or a MIMO system.

In some examples, a wireless multiple-access communication system may include a number of BSs, each simultaneously supporting communication for multiple communication devices, otherwise known as user equipment (UEs). In an LTE or LTE-A network, a set of one or more BSs may define an e NodeB (eNB). In other examples (e.g., in a next generation, NR, or 5G network), a wireless multiple access communication system may include a number of distributed units (DUs) (e.g., edge units (EUs), edge nodes (ENs), radio heads (RHs), smart radio heads (SRHs), transmission reception points (TRPs), etc.) in communication with a number of central units (CUs) (e.g., central nodes (CNs), access node controllers (ANCs), etc.), where a set of one or more DUs, in communication with a CU, may define an access node (e.g., a BS, a NR BS, a 5G BS, a NB, an eNB, NR NB, a 5G NB, an access point (AP)), a network node, a gNB, a TRP, etc.). A BS, AN, or DU may communicate with a UE or a set of UEs on downlink channels (e.g., for transmissions from a BS or to a UE) and uplink channels (e.g., for transmissions from a UE to a BS, AN, or DU).

Binary values (e.g., ones and zeros), are used to represent and communicate various types of information, such as video, audio, statistical information, etc. Unfortunately, during storage, transmission, and/or processing of binary data errors may be unintentionally introduced; for example, a "1" may be changed to a "0" or vice versa.

Generally, in the case of data transmission, a receiver observes each received bit in the presence of noise or distortion and only an indication of the bit's value is obtained. Under these circumstances, the observed values are interpreted as a source of "soft" bits. A soft bit indicates a preferred estimate of the bit's value (e.g., a 1 or a 0) together with some indication of the reliability of that estimate. While the number of errors may be relatively low, even a small number of errors or level of distortion can result in the data being unusable or, in the case of transmission errors, may necessitate retransmission of the data.

To provide a mechanism to check for errors and, in some cases, to correct errors, binary data can be coded to introduce carefully designed redundancy. Coding of a unit of data produces what is commonly referred to as a code word. Because of its redundancy, a code word will often include more bits than the input unit of data from which the code word was produced. Redundant bits are added by an encoder to the transmitted bit stream to create a code word. When signals arising from transmitted code words are received or processed, the redundant information included in the code word as observed in the signal can be used to identify and/or correct errors in, or remove distortion from, the received signal in order to recover the original data unit. Such error checking and/or correcting can be implemented as part of a decoding process. In the absence of errors, or in the case of correctable errors or distortion, decoding can be used to recover from the source data being processed, the original data unit that was encoded. In the case of unrecoverable errors, the decoding process may produce some indication that the original data cannot be fully recovered. Such indications of decoding failure can initiate retransmission of the data.

As the use of fiber optic lines for data communication and the rate at which data can be read from and stored to data storage devices (e.g., disk drives, tapes, etc.) increases, there is an increasing need for efficient use of data storage and transmission capacity and also for the ability to encode and decode data at high rates.

BRIEF SUMMARY

The following summarizes some aspects of the present disclosure to provide a basic understanding of the discussed technology. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in summary form as a prelude to the more detailed description that is presented later. After considering this discussion, and particularly after reading the section entitled "Detailed Description" one will understand how the features of this disclosure provide advantages that include improved communications between access points and stations in a wireless network.

While encoding efficiency and high data rates are important, for an encoding and/or decoding system to be practical for use in a wide range of devices (e.g., consumer devices), it is also important that the encoders and/or decoders can be implemented at reasonable cost.

Communication systems often need to operate at several different rates. Adjustable low-density parity-check (LDPC) codes can be used for simple implementation to provide coding and decoding at different rates. For example, higher-rate LDPC codes can be generated by puncturing lower-rate LDPC codes.

As the demand for mobile broadband access continues to increase, there exists a need for further improvements in NR technology. Preferably, these improvements should be applicable to other multi-access technologies and the telecommunication standards that employ these technologies. One area for improvements is the area of encoding/decoding, applicable to NR. For example, techniques for high performance LDPC codes for NR are desirable.

Certain aspects of the present disclosure generally relate to methods and apparatus for a high-performance, flexible, and compact low-density parity-check (LDPC) code design. The LDPC code designs can support large ranges of code rates, blocklengths, and granularity, while being capable of fine incremental redundancy hybrid automatic repeat request (IR-HARQ) extension and maintaining good error floor performance, a high-level of parallelism to deliver high throughput performance, and a low description complexity.

In one aspect, a method is provided for wireless communications by a transmitting device. The method generally includes determining a plurality of transmission rate regions associated with a transmission rate to be used for transmitting information bits. The transmitting device selects a family of lifted LDPC codes of a set of families of lifted LDPC codes for encoding information bits for each of the transmission rate regions, encodes the information bits using at least one lifted LDPC code from the selected family of lifted LDPC codes for transmission in each respective transmission rate region to produce one or more code words, and transmits the one or more code words over a medium.

In one aspect, an apparatus, such as a transmitting device, is provided for wireless communications. The apparatus generally includes means for determining a plurality of transmission rate regions associated with a transmission rate to be used for transmitting information bits. The transmitting device includes means for selecting a family of lifted LDPC codes of a set of families of lifted LDPC codes for encoding information bits for each of the transmission rate regions, means for encoding the information bits using at least one lifted LDPC code from the selected family of lifted LDPC codes for transmission in each respective transmission rate region to produce one or more code words, and means for transmitting the one or more code words over a medium.

In one aspect, an apparatus, such as a transmitting device, is provided for wireless communications. The apparatus generally includes at least one processor coupled with a memory. The at least one processor determines a plurality of transmission rate regions associated with a transmission rate to be used for transmitting information bits. The at least one processor also selects a family of lifted LDPC codes of a set of families of lifted LDPC codes for encoding information bits for each of the transmission rate regions, and encodes the information bits using at least one lifted LDPC code from the selected family of lifted LDPC codes for transmission in each respective transmission rate region to produce one or more code words. The transmitting device also includes a transmitter configured to transmit the one or more code words over a medium.

In one aspect, a computer readable medium is provided. The computer readable medium has computer executable code stored thereon for wireless communications by a transmitting device. The code generally includes code for determining a plurality of transmission rate regions associated with a transmission rate to be used for transmitting information bits. The code also includes code for selecting a family of lifted LDPC codes of a set of families of lifted LDPC codes for encoding information bits for each of the transmission rate regions, code for encoding the information bits using at least one lifted LDPC code from the selected family of lifted LDPC codes for transmission in each respective transmission rate region to produce one or more code words, and code for transmitting the one or more code words over a medium.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. The appended drawings illustrate only certain typical aspects of this disclosure, however, and are therefore not to be considered limiting of its scope, for the description may admit to other equally effective aspects.

FIG. 18 is a table illustrating degree three checks and puncturing for a high rate code, in accordance with certain aspects of the present disclosure.

FIG. 19 shows the core of an exemplary code family, in accordance with certain aspects of the present disclosure.

FIG. 19A is a table illustrating the row degrees of the shortened submatrix of the core illustrated in FIG. 19, in accordance with certain aspects of the present disclosure.

FIG. 20 shows the core of another exemplary code family, in accordance with certain aspects of the present disclosure.

FIG. 20A is a table illustrating the row degrees of the shortened submatrix of the core illustrated in FIG. 20, in accordance with certain aspects of the present disclosure.

FIG. 21 shows the core of yet another exemplary code family, in accordance with certain aspects of the present disclosure.

FIG. 21A is a table illustrating the row degrees of the shortened submatrix of the core illustrated in FIG. 21, in accordance with certain aspects of the present disclosure.

FIG. 22 is a table illustrating degree three checks and puncturing for a medium rate code, in accordance with certain aspects of the present disclosure.

FIG. 22A is a table illustrating the core part of the PCM, having a lifting size value of 8, used to get the table illustrated in FIG. 22, in accordance with certain aspects of the present disclosure.

FIG. 23 is a table illustrating degree three checks and puncturing for a low rate code, in accordance with certain aspects of the present disclosure.

FIG. 23A is a table illustrating the core part of the PCM, having a lifting size value of 8, used to get the table illustrated in FIG. 23, in accordance with certain aspects of the present disclosure.

FIG. 27 is an example of the core lifted PCM illustrated in FIG. 25 with a single edge removed, in accordance with certain aspects of the present disclosure.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
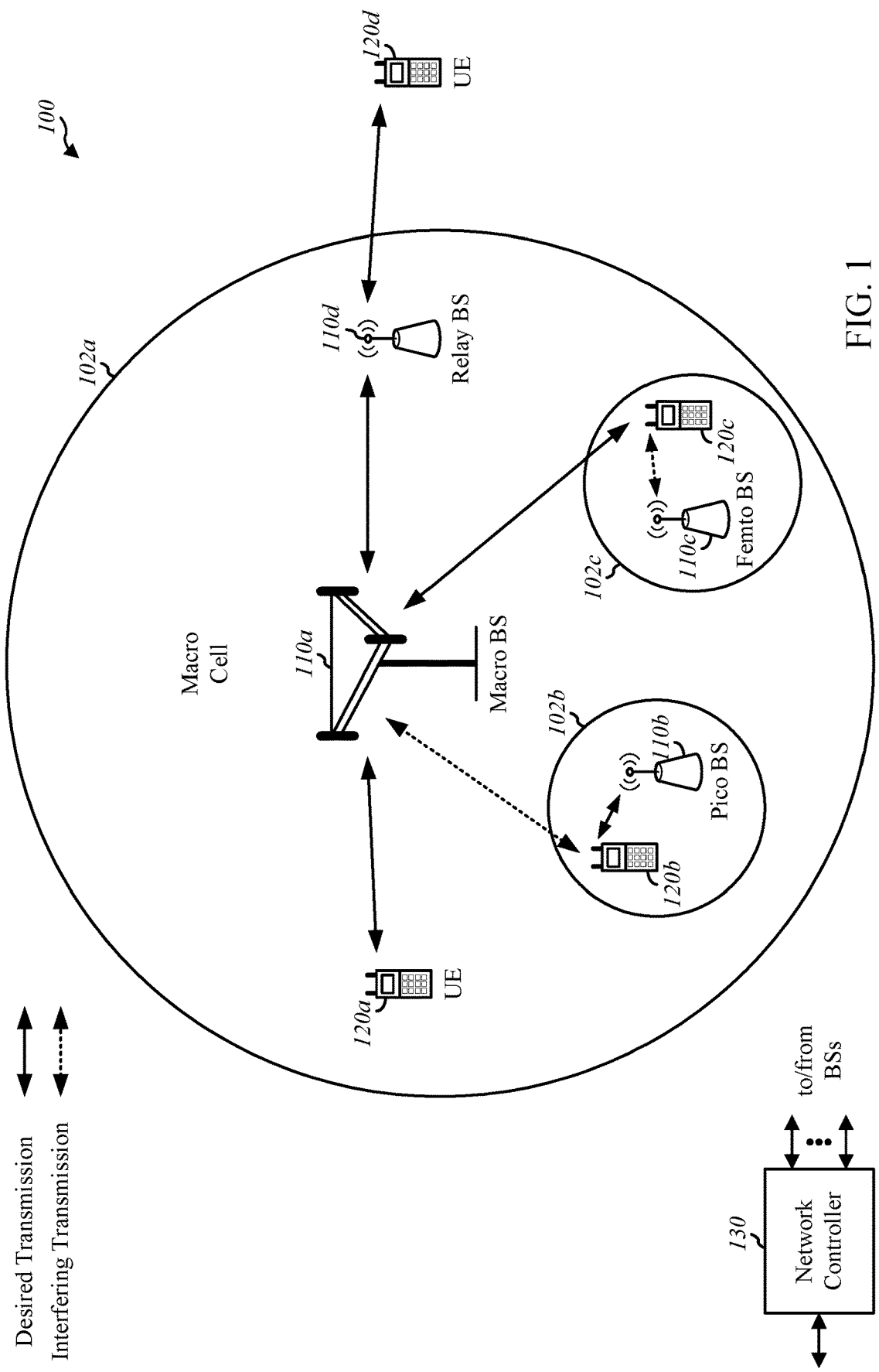
FIG. 1 is a block diagram conceptually illustrating an example wireless communications system, in accordance with certain aspects of the present disclosure.

Aspects of the present disclosure provide apparatus, methods, processing systems, and computer program products for encoding (and/or decoding) for new radio (NR) access technology (e.g., 5G radio access). NR may refer to radios configured to operate according to a new air interface or fixed transport layer. NR may include support for enhanced mobile broadband (eMBB) service targeting wide bandwidth (e.g., 80 MHz and beyond), millimeter wave (mmW) service targeting high carrier frequency (e.g., 60 GHz), massive machine type communications (mMTC) service targeting non-backward compatible MTC techniques, and/or mission critical (MiCr) service targeting ultra-reliable low-latency communications (URLLC) service. These services may include latency and reliability requirements. NR may use low-density parity-check (LDPC) coding and/or polar codes.

Certain aspects of the present disclosure generally relate to methods and apparatus for encoding and/or decoding using LDPC code designs that may be high-performance, flexible, and compact. The LDPC code designs may support large ranges of code rates, blocklengths, and granularity. The LDPC code designs may support fine incremental redundancy hybrid automatic repeat request (IR-HARQ) extension. The LDPC code designs may have a good floor performance, a high level of parallelism to deliver high throughput performance, and a low description complexity.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method, which is practiced using other structure, functionality, or structure and functionality in addition to or other than the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wireless technologies, system configurations, networks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

The techniques described herein may be used for various wireless communication networks such as Long Term Evolution (LTE), Code Division Multiple Access (CDMA) networks, Time Division Multiple Access (TDMA) networks, Frequency Division Multiple Access (FDMA) networks, Orthogonal FDMA (OFDMA) networks, Single-Carrier FDMA (SC-FDMA) networks, etc. The terms "networks" and "systems" are often used interchangeably. A CDMA network may implement a radio technology such as Universal Terrestrial Radio Access (UTRA), CDMA2000, etc. UTRA includes Wideband-CDMA (W-CDMA) and Low Chip Rate (LCR). CDMA2000 covers IS-2000, IS-95, and IS-856 standards. A TDMA network may implement a radio technology such as Global System for Mobile Communications (GSM). An OFDMA network may implement a radio technology such as NR (e.g., 5G RA), Evolved UTRA (E-UTRA), IEEE 802.11, IEEE 802.16, IEEE 802.20, Flash-OFDM®, etc. UTRA, E-UTRA, and GSM are part of Universal Mobile Telecommunication System (UMTS). 3GPP LTE and LTE-Advanced (LTE-A) are releases of UMTS that use E-UTRA. UTRA, E-UTRA, UMTS, LTE, LTE-A and GSM are described in documents from an organization named "3rd Generation Partnership Project" (3GPP). CDMA2000 is described in documents from an organization named "3rd Generation Partnership Project 2" (3GPP2). NR is an emerging wireless communications technology under development in conjunction with the 5G Technology Forum (5GTF). These communications networks are merely listed as examples of networks in which the techniques described in this disclosure may be applied; however, this disclosure is not limited to the above-described communications network.

For clarity, while aspects may be described herein using terminology commonly associated with 3G and/or 4G wireless technologies, aspects of the present disclosure can be applied in other generation-based communication systems, such as 5G and later, including NR technologies.

An Example Wireless Communication System

FIG. 1 illustrates an example wireless communications network 100 in which aspects of the present disclosure may be performed. Wireless communications network 100 may be a new radio (NR) or 5G network. Wireless communications network 100 may include a transmitting device such as a user equipment (UE) 120 or a base station (BS) 110. The transmitting device can encode a set of information bits based on a low-density parity-check (LDPC) code to produce a code word, the LDPC code defined by a matrix having a first number of variable nodes and a second number of check nodes. The LDPC code used by the transmitting device may be designed according to the LDPC code designs described herein for high-performance, flexible, and compact LDPC code. The LPDC code design may be used by the transmitting device to encode the set of information bits, to support large ranges of code rates, blocklengths, and granularity.

As illustrated in FIG. 1, wireless communications network 100 may include a number of BSs 110 and other network entities. ABS may be a station that communicates with UEs. Each BS 110 may provide communication coverage for a particular geographic area. In 3GPP, the term "cell" can refer to a coverage area of a Node B and/or a Node B subsystem serving this coverage area, depending on the context in which the term is used. In NR systems, the term "cell" and gNB, Node B, 5G NB, AP, NR BS, NR BS, TRP, etc., may be interchangeable. In some examples, a cell may not necessarily be stationary, and the geographic area of the cell may move according to the location of a mobile BS. In some examples, the BSs may be interconnected to one another and/or to one or more other BSs or network nodes (not shown) in wireless communications network 100 through various types of backhaul interfaces such as a direct physical connection, a virtual network, or the like using any suitable transport network.

In general, any number of wireless networks may be deployed in a given geographic area. Each wireless network may support a particular radio access technology (RAT) and may operate on one or more frequencies. A RAT may also be referred to as a radio technology, an air interface, etc. A frequency may also be referred to as a carrier, a frequency channel, etc. Each frequency may support a single RAT in a given geographic area in order to avoid interference between wireless networks of different RATs. In some cases, NR or 5G RAT networks may be deployed.

A BS may provide communication coverage for a macro cell, a pico cell, a femto cell, and/or other types of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a Closed Subscriber Group (CSG), UEs for users in the home, etc.). A BS for a macro cell may be referred to as a macro BS. A BS for a pico cell may be referred to as a pico BS. A BS for a femto cell may be referred to as a femto BS or a home BS. In the example shown in FIG. 1, BS 110a, BS 110b, and BS 110c may be macro BSs for the macro cell 102a, macro cell 102b, and macro cell 102c, respectively. BS 110x may be a pico BS for pico cell 102x. BS 110y and BS 110z may be femto BS for the femto cell 102y and femto cell 102z, respectively. A BS may support one or multiple (e.g., three) cells.

Wireless communications network 100 may also include relay stations. A relay station is a station that receives a transmission of data and/or other information from an upstream station (e.g., a BS 110 or a UE 120) and sends a transmission of the data and/or other information to a downstream station (e.g., a UE 120 or a BS 110). A relay station may also be a UE that relays transmissions for other UEs. In the example shown in FIG. 1, relay station 110r may communicate with BS 110a and UE 120r in order to facilitate communication between BS 110a and UE 120r. A relay station may also be referred to as a relay, a relay eNB, etc.

Wireless communications network 100 may be a heterogeneous network that includes BSs of different types, for example, macro BS, pico BS, femto BS, relays, etc. These different types of BSs may have different transmit power levels, different coverage areas, and different impact on interference in the wireless communications network 100. For example, a macro BS may have a high transmit power level (e.g., 20 Watts) whereas pico BS, femto BS, and relays may have a lower transmit power level (e.g., 1 Watt).

Wireless communications network 100 may support synchronous or asynchronous operation. For synchronous operation, the BSs may have similar frame timing, and transmissions from different BSs may be approximately aligned in time. For asynchronous operation, the BSs may have different frame timing, and transmissions from different BSs may not be aligned in time. The techniques described herein may be used for both synchronous and asynchronous operation.

Network controller 130 may couple to a set of BSs and provide coordination and control for these BSs. Network controller 130 may communicate with BSs 110 via a backhaul. BSs 110 may also communicate with one another, e.g., directly or indirectly via wireless or wireline backhaul.

UEs 120 (e.g., UE 120x, UE 120y, etc.) may be dispersed throughout wireless communications network 100, and each UE may be stationary or mobile. A UE may also be referred to as a mobile station, a terminal, an access terminal, a subscriber unit, a station, a Customer Premises Equipment (CPE), a cellular phone, a smart phone, a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device or medical equipment, a biometric sensor/device, a wearable device such as a smart watch, smart clothing, smart glasses, a smart wrist band, smart jewelry (e.g., a smart ring, a smart bracelet, etc.), an entertainment device (e.g., a music device, a video device, a satellite radio, etc.), a vehicular component or sensor, a smart meter/sensor, industrial manufacturing equipment, a global positioning system device, or any other suitable device that is configured to communicate via a wireless or wired medium. Some UEs may be considered evolved or machine-type communication (MTC) devices or evolved MTC (eMTC) devices. MTC and eMTC UEs include, for example, robots, drones, remote devices, sensors, meters, monitors, location tags, etc., that may communicate with a BS, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices.

In FIG. 1, a solid line with double arrows indicates desired transmissions between a UE and a serving BS, which is a BS designated to serve the UE on the downlink and/or uplink. A finely dashed line with double arrows indicates interfering transmissions between a UE and a BS.

Certain wireless networks (e.g., LTE) utilize orthogonal frequency division multiplexing (OFDM) on the downlink and single-carrier frequency division multiplexing (SC-FDM) on the uplink. OFDM and SC-FDM partition the system bandwidth into multiple (K) orthogonal subcarriers, which are also commonly referred to as tones, bins, etc. Each subcarrier may be modulated with data. In general, modulation symbols are sent in the frequency domain with OFDM and in the time domain with SC-FDM. The spacing between adjacent subcarriers may be fixed, and the total number of subcarriers (K) may be dependent on the system bandwidth. For example, the spacing of the subcarriers may be 15 kHz and the minimum resource allocation (called a "resource block" (RB)) may be 12 subcarriers (i.e., 180 kHz). Consequently, the nominal Fast Fourier Transform (FFT) size may be equal to 128, 256, 512, 1024 or 2048 for system bandwidth of 1.25 MHz, 2.5 MHz, 5 MHz, 10 MHz, or 20 MHz, respectively. The system bandwidth may also be partitioned into subbands. For example, a subband may cover 1.08 MHz (i.e., 6 RBs), and there may be 1, 2, 4, 8 or 16 subbands for system bandwidth of 1.25 MHz, 2.5 MHz, 5 MHz, 10 MHz, or 20 MHz, respectively.

NR may utilize OFDM with a CP on the uplink and downlink and include support for half-duplex operation using TDD. A single component carrier bandwidth of 100 MHz may be supported. NR RBs may span 12 subcarriers with a subcarrier bandwidth of 75 kHz over a 0.1 ms duration. Each radio frame may consist of 50 subframes with a length of 10 ms. Consequently, each subframe may have a length of 0.2 ms. Each subframe may indicate a link direction (i.e., downlink or uplink) for data transmission and the link direction for each subframe may be dynamically switched. Each subframe may include DL/UL data as well as DL/UL control data. UL and DL subframes for NR may be as described in more detail below with respect to FIGS. 6 and 7. Beamforming may be supported and beam direction may be dynamically configured. MIMO transmissions with precoding may also be supported. MIMO configurations in the DL may support up to 8 transmit antennas with multi-layer DL transmissions up to 8 streams and up to 2 streams per UE. Multi-layer transmissions with up to 2 streams per UE may be supported. Aggregation of multiple cells may be supported with up to 8 serving cells. Alternatively, NR may support a different air interface, other than an OFDM-based.

In some examples, access to the air interface may be scheduled. For example, a scheduling entity (e.g., a BS 110 or UE 120) allocates resources for communication among some or all devices and equipment within its service area or cell. Within the present disclosure, as discussed further below, the scheduling entity may be responsible for scheduling, assigning, reconfiguring, and releasing resources for one or more subordinate entities. That is, for scheduled communication, subordinate entities utilize resources allocated by the scheduling entity. BSs are not the only entities that may function as a scheduling entity. That is, in some examples, a UE may function as a scheduling entity, scheduling resources for one or more subordinate entities (e.g., one or more other UEs). In this example, the UE is functioning as a scheduling entity, and other UEs utilize resources scheduled by the UE for wireless communication. A UE may function as a scheduling entity in a peer-to-peer (P2P) network, and/or in a mesh network. In a mesh network example, UEs may optionally communicate directly with one another in addition to communicating with the scheduling entity.

Thus, in a wireless communication network with a scheduled access to time-frequency resources and having a cellular configuration, a P2P configuration, and a mesh configuration, a scheduling entity and one or more subordinate entities may communicate utilizing the scheduled resources.

The NR radio access network (RAN) may include one or more central units (CU) and distributed units (DUs). A NR BS (e.g., a gNB, a 5G NB, a NB, a 5G NB, a TRP, an AP) may correspond to one or multiple BSs. NR cells can be configured as access cells (ACells) or data only cells (DCells). DCells may be cells used for carrier aggregation or dual connectivity, but not used for initial access, cell selection/reselection, or handover.

Figure 2:
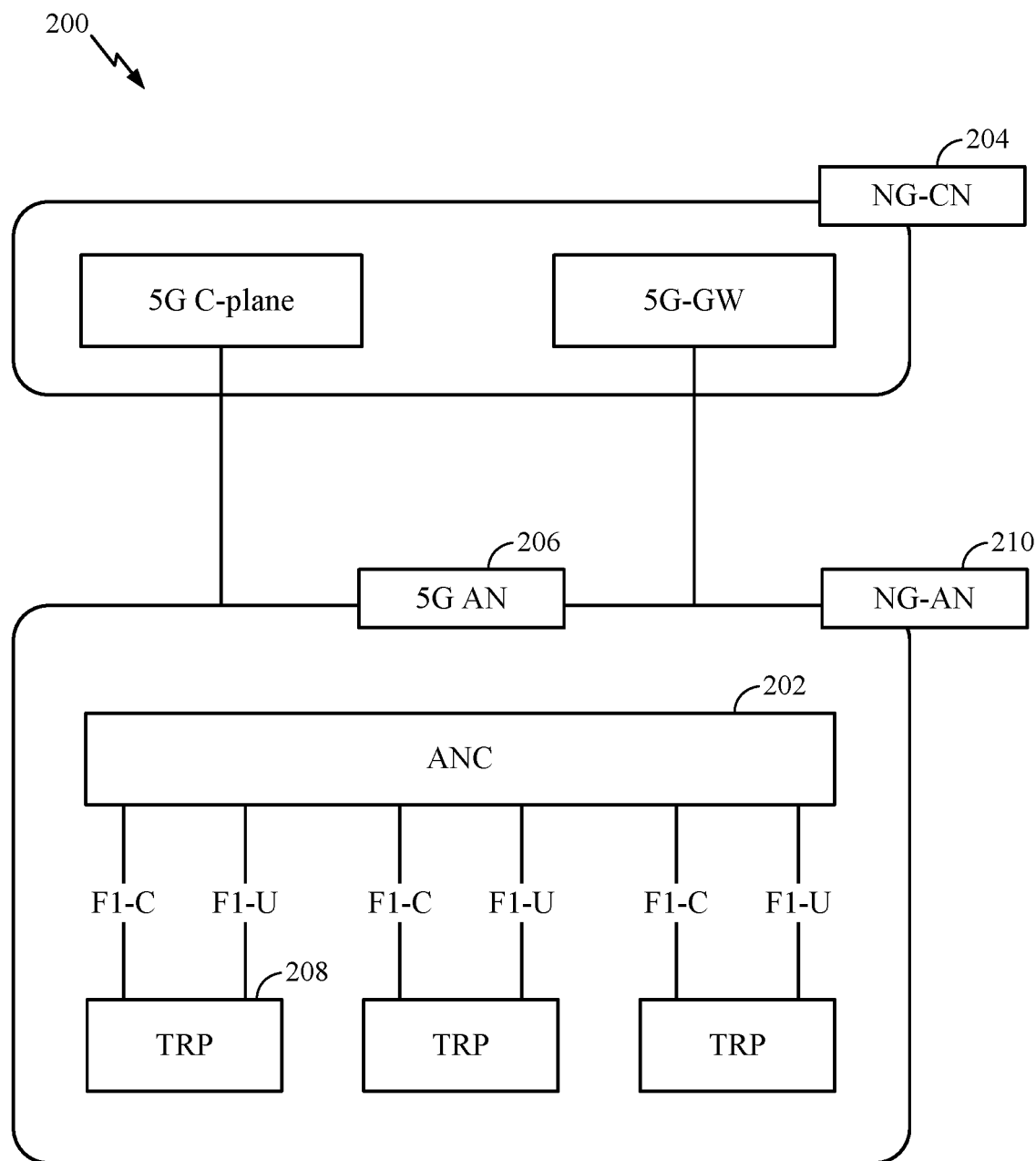
FIG. 2 is a block diagram illustrating an example logical architecture of a distributed RAN, in accordance with certain aspects of the present disclosure.

FIG. 2 illustrates an example logical architecture of a distributed RAN 200, which may be implemented in wireless communications system 100 illustrated in FIG. 1. 5G access node (AN) 206 may include access node controller (ANC) 202. ANC 202 may be a CU of distributed RAN 200. A backhaul interface to next generation core network (NG-CN) 204 may terminate at ANC 202. A backhaul interface to neighboring next generation access nodes (NG-ANs) may terminate at ANC 202. ANC 202 may include one or more TRPs 208.

TRPs 208 comprise DUs. TRPs 208 may be connected to one ANC (ANC 202) or more than one ANC (not illustrated). For example, for RAN sharing, radio as a service (RaaS), and service specific AND deployments, the TRP may be connected to more than one ANC 202. A TRP 208 may include one or more antenna ports. TRPs 208 may be configured to individually (e.g., dynamic selection) or jointly (e.g., joint transmission) serve traffic to a UE (e.g., a UE 120).

Example logical architecture of the distributed RAN 200 may be used to illustrate fronthaul definition. The logical architecture may support fronthauling solutions across different deployment types. For example, the logical architecture may be based on transmit network capabilities (e.g., bandwidth, latency, and/or jitter). The logical architecture may share features and/or components with LTE. NG-AN 210 may support dual connectivity with NR. NG-AN 210 may share a common fronthaul for LTE and NR. The logical architecture may enable cooperation between and among TRPs 208. For example, cooperation may be pre-configured within a TRP 208 and/or across TRPs 208 via ANC 202. There may be no inter-TRP interface.

The logical architecture for distributed RAN 200 may include a dynamic configuration of split logical functions. As will be described in more detail with reference to FIG. 5, the Radio Resource Control (RRC) layer, Packet Data Convergence Protocol (PDCP) layer, Radio Link Control (RLC) layer, Medium Access Control (MAC) layer, and a Physical (PHY) layers may be placed at the DU (e.g., a TRP 208) or the CU (e.g., ANC 202).

Figure 3:
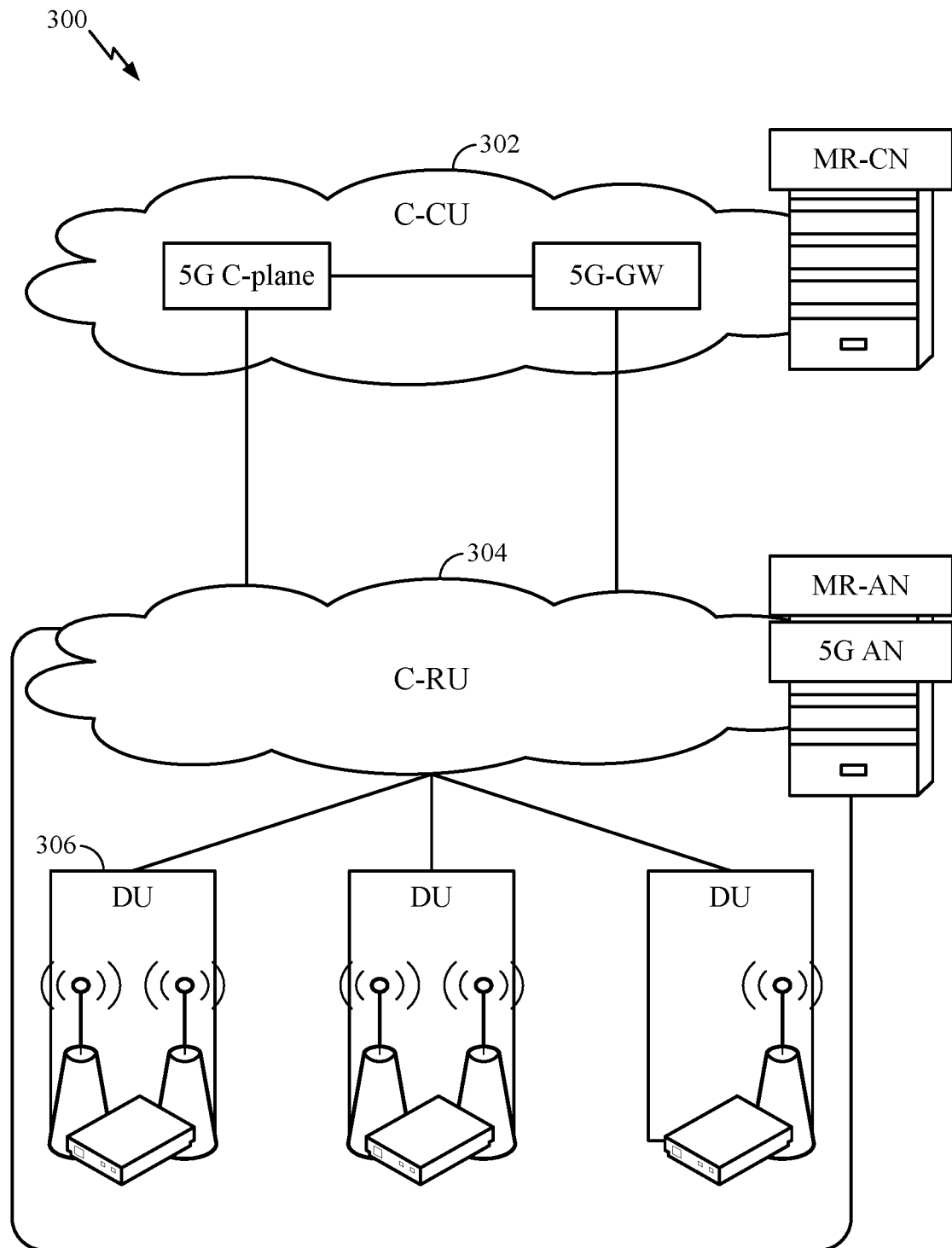
FIG. 3 is a diagram illustrating an example physical architecture of a distributed RAN, in accordance with certain aspects of the present disclosure.

FIG. 3 illustrates an example physical architecture of a distributed RAN 300, according to aspects of the present disclosure. As shown in FIG. 3, distributed RAN 300 includes centralized core network unit (C-CU) 302, centralized RAN unit (C-RU) 304, and DU 306.

C-CU 302 may host core network functions. C-CU 302 may be centrally deployed. C-CU 302 functionality may be offloaded (e.g., to advanced wireless services (AWS)), in an effort to handle peak capacity. C-RU 304 may host one or more ANC functions. Optionally, C-RU 304 may host core network functions locally. C-RU 304 may have a distributed deployment. C-RU 304 may be located near an edge the network. DU 306 may host one or more TRPs (edge node (EN), an edge unit (EU), a radio head (RH), a smart radio head (SRH), or the like). DU 306 may be located at edges of the network with radio frequency (RF) functionality.

Figure 4:
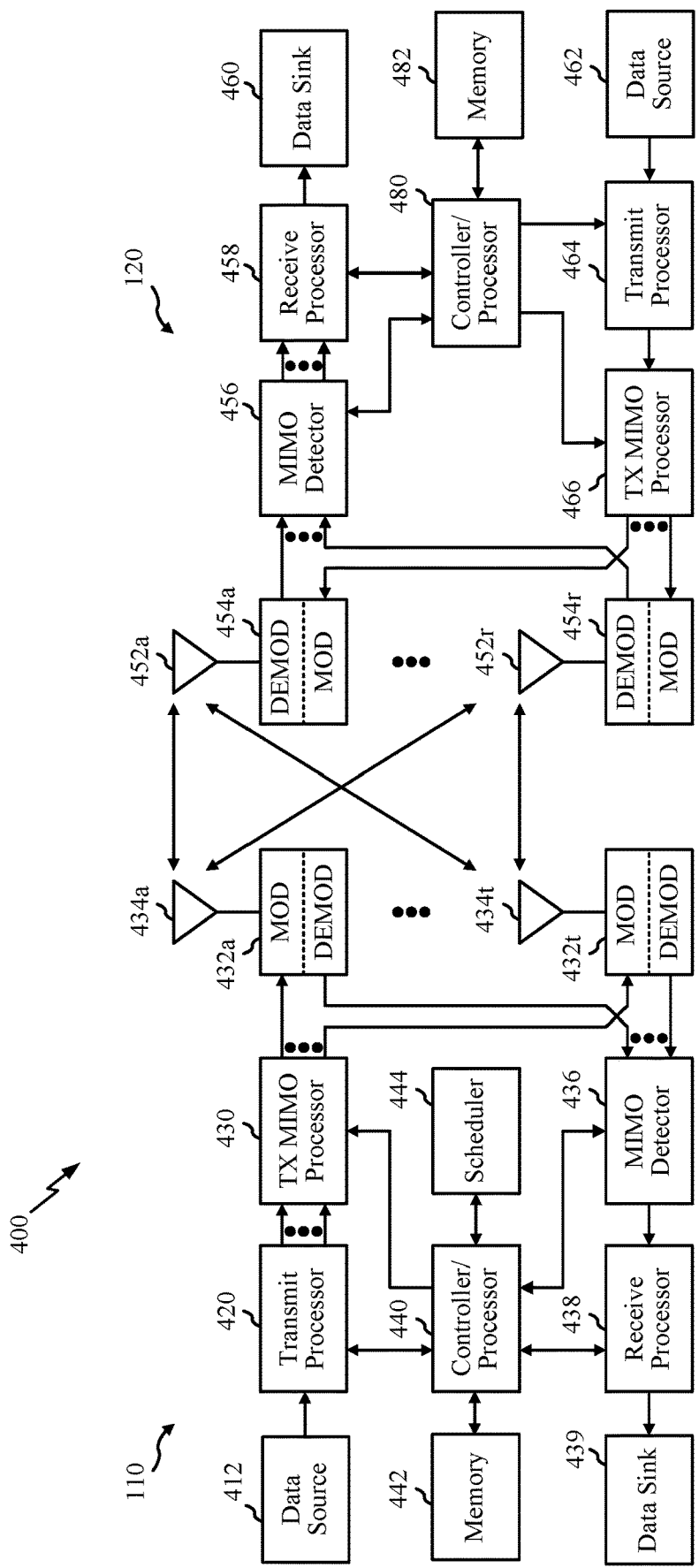
FIG. 4 is a block diagram conceptually illustrating a design of an example base station (BS) and user equipment (UE), in accordance with certain aspects of the present disclosure.

FIG. 4 illustrates example components of the BS 110 and the UE 120 illustrated in FIG. 1, which may be used to implement aspects of the present disclosure for high performance, flexible, and compact LDPC coding. One or more of the components of BS 110 and UE 120 illustrated in FIG. 4 may be used to practice aspects of the present disclosure. For example, antenna(s) 452a-454r, Demodulator(s)/Modulator(s) 454a-454r, TX MIMO processor 466, Receive Processor 458, Transmit Processor 464, and/or Controller/Processor 480 of UE 120 and/or antenna(s) 434a-434t, Demodulator(s)/Modulator(s) 432a-434t, TX MIMO Processors 430, Transmit Processor 420, Receive Processor 438, and/or Controller/Processor 440 of BS 110 may be used to perform the operations 1300-1500, 2400, and 2500 described herein and illustrated with reference to FIGS. 13-15, 24, and 25, respectively.

For a restricted association scenario, BS 110 may be macro BS 110c in FIG. 1, and UE 120 may be UE 120y. BS 110 may also be a BS of some other type. BS 110 may be equipped with antennas 434a through 434t and UE 120 may be equipped with antennas 452a through 452r.

At BS 110, transmit processor 420 may receive data from data source 412 and control information from controller/processor 440. The control information may be for the Physical Broadcast Channel (PBCH), Physical Control Format Indicator Channel (PCFICH), Physical Hybrid ARQ Indicator Channel (PHICH), Physical Downlink Control Channel (PDCCH), or other control channel or signal. The data may be for the Physical Downlink Shared Channel (PDSCH), or other data channel or signal. Transmit processor 420 may process (e.g., encode and symbol map) the data and control information to obtain data symbols and control symbols, respectively. For example, transmit processor 420 may encode the information bits using LPDC code designs discussed in greater detail below. Transmit processor 420 may also generate reference symbols, for example, for the primary synchronization signal (PSS), secondary synchronization signal (SSS), and cell-specific reference signal (CRS). Transmit (TX) multiple-input multiple-output (MIMO) processor 430 may perform spatial processing (e.g., precoding) on the data symbols, the control symbols, and/or the reference symbols, if applicable, and may provide output symbol streams to the modulators (MODs) 432a through 432t. Each modulator 432 may process a respective output symbol stream (e.g., for OFDM, etc.) to obtain an output sample stream. Each modulator 432 may further process (e.g., convert to analog, amplify, filter, and upconvert) the output sample stream to obtain a downlink signal. Downlink signals from modulators 432a through 432t may be transmitted via antennas 434a through 434t, respectively.

At UE 120, antennas 452a through 452r may receive the downlink signals from BS 110 and may provide received signals to the demodulators (DEMODs) 454a through 454r, respectively. Each demodulator 454 may condition (e.g., filter, amplify, downconvert, and digitize) a respective received signal to obtain input samples. Each demodulator 454 may further process the input samples (e.g., for OFDM, etc.) to obtain received symbols. MIMO detector 456 may obtain received symbols from all the demodulators 454a through 454r, perform MIMO detection on the received symbols if applicable, and provide detected symbols. Receive processor 458 may process (e.g., demodulate, deinterleave, and decode) the detected symbols, provide decoded data for UE 120 to a data sink 460, and provide decoded control information to controller/processor 480.

On the uplink, at UE 120, transmit processor 464 may receive and process data (e.g., for the Physical Uplink Shared Channel (PUSCH) or other data channel or signal) from data source 462 and control information (e.g., for the Physical Uplink Control Channel (PUCCH) or other control channel or signal) from controller/processor 480. Transmit processor 464 may also generate reference symbols for a reference signal. The symbols from transmit processor 464 may be precoded by TX MIMO processor 466 if applicable, further processed by demodulators 454a through 454r (e.g., for SC-FDM, etc.), and transmitted to BS 110. At BS 110, the uplink signals from the UE 120 may be received by antennas 434, processed by modulators 432, detected by MIMO detector 436 if applicable, and further processed by receive processor 438 to obtain decoded data and control information sent by UE 120. Receive processor 438 may provide the decoded data to data sink 439 and the decoded control information to controller/processor 440.

Memory 442 may store data and program codes for BS 110 and memory 482 may store data and program codes for UE 120. Scheduler 444 may schedule UEs for data transmission on the downlink and/or uplink.

Figure 5:
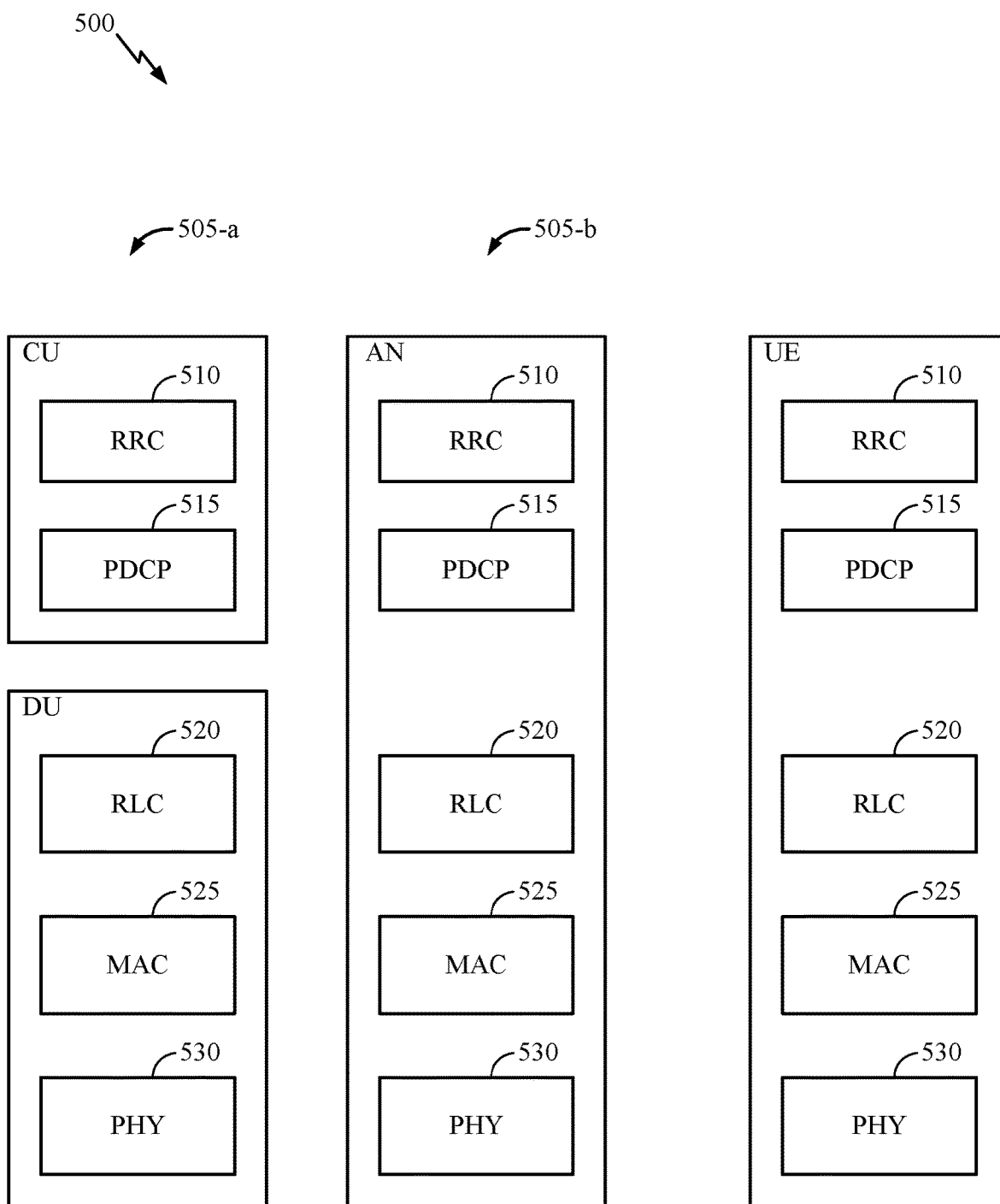
FIG. 5 is a diagram showing examples for implementing a communication protocol stack, in accordance with certain aspects of the present disclosure.

FIG. 5 illustrates a diagram 500 showing examples for implementing a communications protocol stack, according to aspects of the present disclosure. The illustrated communications protocol stacks may be implemented by devices operating in a in a 5G system (e.g., a system that supports uplink-based mobility). Diagram 500 illustrates a communications protocol stack including RRC layer 510, PDCP layer 515, RLC layer 520, MAC layer 525, and PHY layer 530. In an example, the layers of a protocol stack may be implemented as separate modules of software, portions of a processor or ASIC, portions of non-collocated devices connected by a communications link, or various combinations thereof. Collocated and non-collocated implementations may be used, for example, in a protocol stack for a network access device (e.g., ANs, CUs, and/or DUs) or a UE.

A first option 505-a shows a split implementation of a protocol stack, in which implementation of the protocol stack is split between a centralized network access device (e.g., ANC 202) and distributed network access device (e.g., DU 208). In the first option 505-a, RRC layer 510 and PDCP layer 515 may be implemented by the CU, and RLC layer 520, MAC layer 525, and PHY layer 530 may be implemented by the DU. In various examples the CU and the DU may be collocated or non-collocated. The first option 505-a may be useful in a macro cell, micro cell, or pico cell deployment.

A second option 505-b shows a unified implementation of a protocol stack, in which the protocol stack is implemented in a single network access device (e.g., access node (AN), NR BS, a NR NBa network node (NN), TRP, gNB, etc.). In the second option, RRC layer 510, PDCP layer 515, RLC layer 520, MAC layer 525, and PHY layer 530 may each be implemented by the AN. The second option 505-b may be useful in a femto cell deployment.

Regardless of whether a network access device implements part or all of a protocol stack, a UE may implement the entire protocol stack (e.g., RRC layer 510, PDCP layer 515, RLC layer 520, MAC layer 525, and PHY layer 530).

Figure 6:
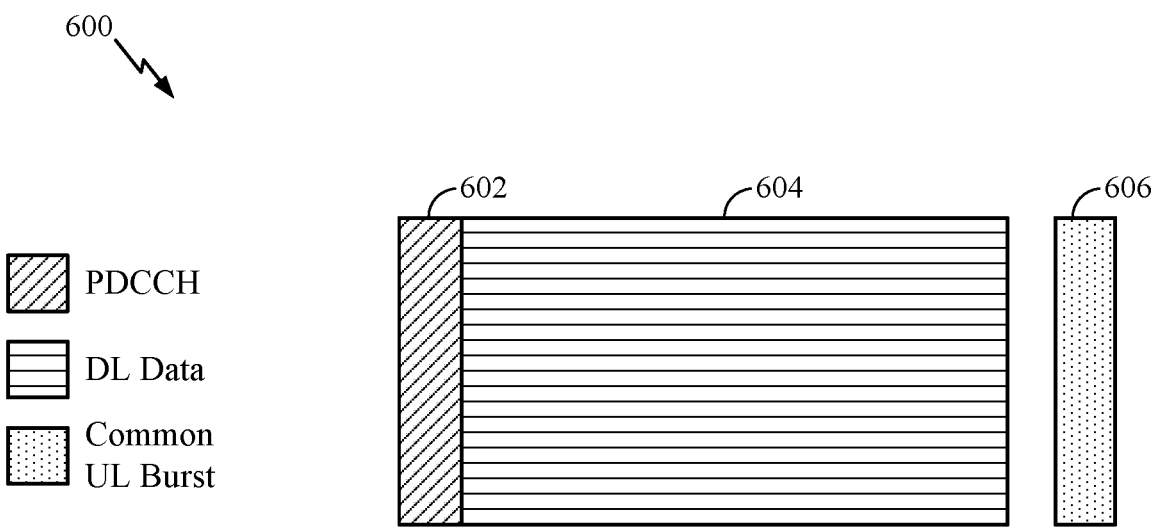
FIG. 6 illustrates an example of a downlink (DL)-centric subframe, in accordance with certain aspects of the present disclosure.

FIG. 6 is a diagram showing an example of a DL-centric subframe 600. The DL-centric subframe 600 may include control portion 602. Control portion 602 may exist in the initial or beginning portion of DL-centric subframe 600. Control portion 602 may include various scheduling information and/or control information corresponding to various portions of DL-centric subframe 600. In some configurations, control portion 602 may be a physical DL control channel (PDCCH), as shown in FIG. 6. DL-centric subframe 600 may also include DL data portion 604. DL data portion 604 may be referred to as the payload of DL-centric subframe 600. DL data portion 604 may include the communication resources utilized to communicate DL data from the scheduling entity (e.g., UE or BS) to the subordinate entity (e.g., UE). In some configurations, DL data portion 604 may be a physical DL shared channel (PDSCH).

DL-centric subframe 600 may also include common UL portion 606. Common UL portion 606 may be referred to as an UL burst, a common UL burst, and/or various other suitable terms. Common UL portion 606 may include feedback information corresponding to various other portions of DL-centric subframe 600. For example, common UL portion 606 may include feedback information corresponding to control portion 602. Non-limiting examples of feedback information may include an acknowledgment (ACK) signal, a negative acknowledgment (NACK) signal, a HARQ indicator, and/or various other suitable types of information. Common UL portion 606 may additionally or alternatively include information, such as information pertaining to random access channel (RACH) procedures, scheduling requests (SRs), and various other suitable types of information. As illustrated in FIG. 6, the end of DL data portion 604 may be separated in time from the beginning of common UL portion 606. This time separation may be referred to as a gap, a guard period, a guard interval, and/or various other suitable terms. This separation provides time for the switch-over from DL communication (e.g., reception operation by the subordinate entity (e.g., UE)) to UL communication (e.g., transmission by the subordinate entity (e.g., UE)). The foregoing is merely one example of a DL-centric subframe and alternative structures having similar features may exist without necessarily deviating from the aspects described herein.

Figure 7:
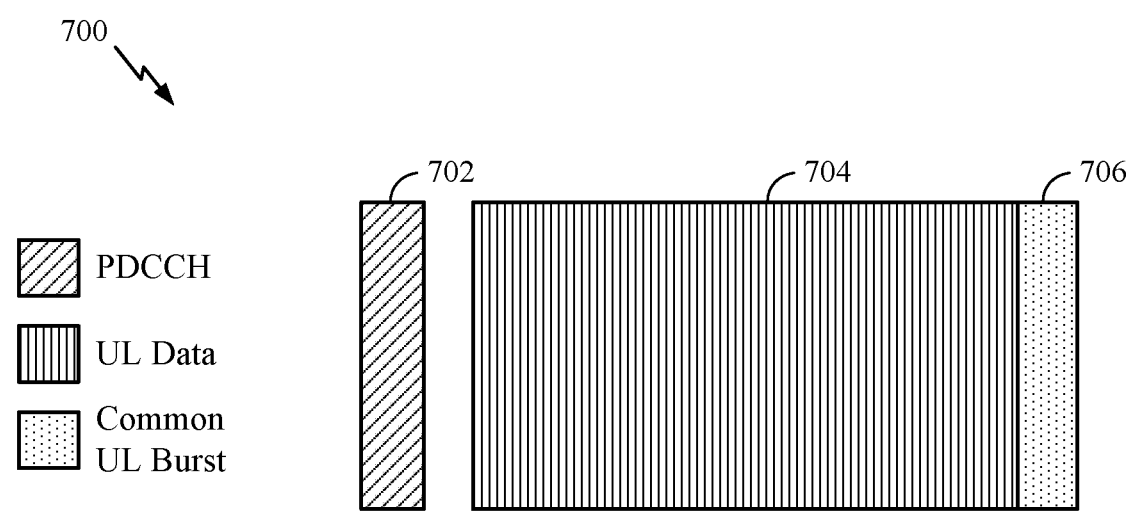
FIG. 7 illustrates an example of an uplink (UL)-centric subframe, in accordance with certain aspects of the present disclosure.

FIG. 7 is a diagram showing an example of an UL-centric subframe 700. UL-centric subframe 700 may include control portion 702. Control portion 702 may exist in the initial or beginning portion of UL-centric subframe 700. Control portion 702 in FIG. 7 may be similar to control portion 602 described above with reference to FIG. 6. UL-centric subframe 700 may also include UL data portion 704. UL data portion 704 may be referred to as the payload of UL-centric subframe 700. UL data portion 704 may refer to the communication resources utilized to communicate UL data from the subordinate entity (e.g., UE) to the scheduling entity (e.g., UE or BS). In some configurations, control portion 702 may be a PDCCH.

As illustrated in FIG. 7, the end of control portion 702 may be separated in time from the beginning of UL data portion 704. This time separation may be referred to as a gap, guard period, guard interval, and/or various other suitable terms. This separation provides time for the switchover from DL communication (e.g., reception operation by the scheduling entity) to UL communication (e.g., transmission by the scheduling entity). UL-centric subframe 700 may also include common UL portion 706. Common UL portion 706 in FIG. 7 may be similar to the common UL portion 606 described above with reference to FIG. 6. Common UL portion 706 may additionally or alternatively include information pertaining to channel quality indicator (CQI), sounding reference signals (SRSs), and various other suitable types of information. The foregoing is merely one example of an UL-centric subframe and alternative structures having similar features may exist without necessarily deviating from the aspects described herein.

In some circumstances, two or more subordinate entities (e.g., UEs) may communicate with each other using sidelink signals. Real-world applications of such sidelink communications may include public safety, proximity services, UE-to-network relaying, vehicle-to-vehicle (V2V) communications, Internet-of-Everything (IoE) communications, IoT communications, mission-critical mesh, and/or various other suitable applications. Generally, a sidelink signal may refer to a signal communicated from one subordinate entity (e.g., UE1) to another subordinate entity (e.g., UE2) without relaying that communication through the scheduling entity (e.g., UE or BS), even though the scheduling entity may be utilized for scheduling and/or control purposes. In some examples, the sidelink signals may be communicated using a licensed spectrum (unlike wireless local area networks (WLAN), which typically use an unlicensed spectrum).

A UE may operate in various radio resource configurations, including a configuration associated with transmitting pilots using a dedicated set of resources (e.g., a radio resource control (RRC) dedicated state, etc.) or a configuration associated with transmitting pilots using a common set of resources (e.g., an RRC common state, etc.). When operating in the RRC dedicated state, the UE may select a dedicated set of resources for transmitting a pilot signal to a network. When operating in the RRC common state, the UE may select a common set of resources for transmitting a pilot signal to the network. In either case, a pilot signal transmitted by the UE may be received by one or more network access devices, such as an AN, or a DU, or portions thereof. Each receiving network access device may be configured to receive and measure pilot signals transmitted on the common set of resources, and also receive and measure pilot signals transmitted on dedicated sets of resources allocated to the UEs for which the network access device is a member of a monitoring set of network access devices for the UE. One or more of the receiving network access devices, or a CU to which receiving network access device(s) transmit the measurements of the pilot signals, may use the measurements to identify serving cells for the UEs, or to initiate a change of serving cell for one or more of the UEs.

Example Error Correction Coding

Many communications systems use error-correcting codes. Specifically, error correcting codes compensate for the intrinsic unreliability of information transfer in these systems by introducing redundancy into the data stream. Low-density parity-check (LDPC) codes are a particular type of error correcting codes which use an iterative coding system. In particular, Gallager codes are an early example of "regular" LDPC codes. Regular LDPC codes are linear block code in which most of the elements of its parity check matrix H are '0'.

LDPC codes can be represented by bipartite graphs (often referred to as "Tanner graphs"). In a bipartite graph, a set of variable nodes corresponds to bits of a code word (e.g., information bits or systematic bits), and a set of check nodes correspond to a set of parity-check constraints that define the code. Edges in the graph connect variable nodes to check nodes. Thus, the nodes of the graph are separated into two distinctive sets and with edges connecting nodes of two different types, variable and check.

A lifted graph is created by copying a bipartite base graph (G), which may also be known as a protograph, a number of times, Z (referred to herein as the lifting, lifting size, or lifting size value). A variable node and a check node are considered "neighbors" if they are connected by an "edge" (i.e., the line connecting the variable node and the check node) in the graph. In addition, for each edge (e) of the bipartite base graph (G), a permutation (generally an integer value associated with the edge permutation is represented by k and referred to as the lifting value) is applied to the Z copies of edge (e) to interconnect the Z copies of G. A bit sequence having a one-to-one association with the variable node sequence is a valid code word if and only if, for each check node, the bits associated with all neighboring variable nodes sum to zero modulo two (i.e., they include an even number of 1's). The resulting LDPC code may be quasi-cyclic (QC) if the permutations (lifting values) used are cyclic.

Figures 8, 8A:
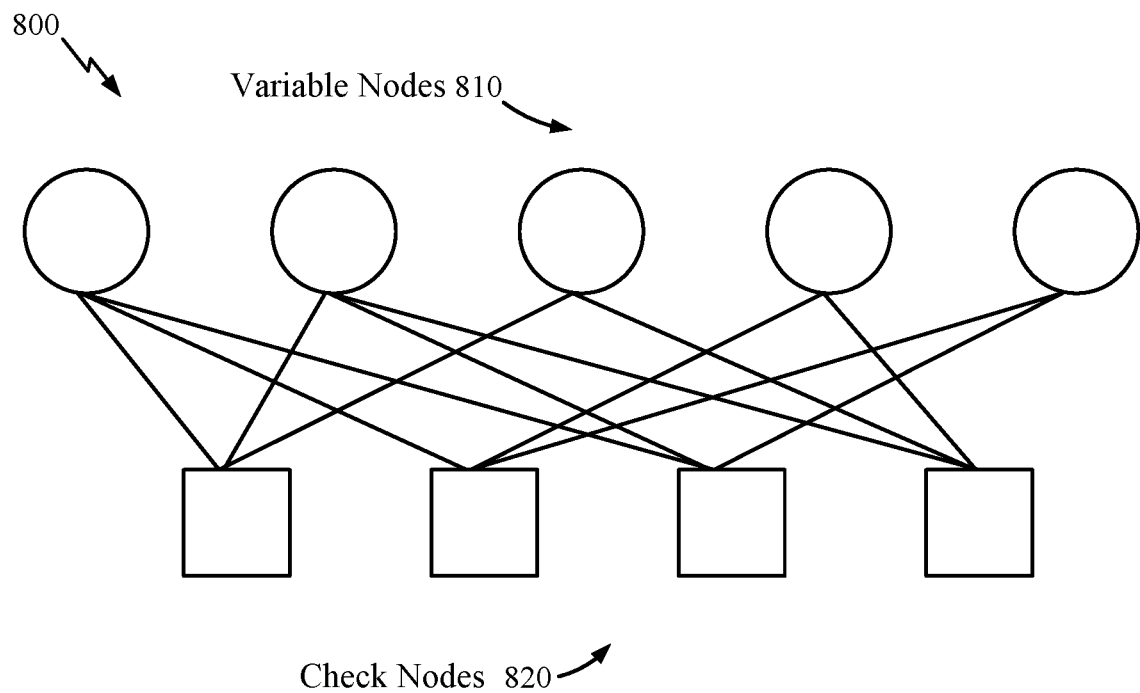
FIG. 8 is a graphical representation of an example low-density parity-check (LDPC) code, in accordance with certain aspects of the present disclosure.
FIG. 8A is a matrix representation of the example LDPC code of FIG. 8, in accordance with certain aspects of the present disclosure.

FIGS. 8-8A show graphical and matrix representations, respectively, of an example LDPC code, in accordance with certain aspects of the present disclosure. For example, FIG. 8 shows a bipartite graph 800 representing the LDPC code. Bipartite graph 800 includes a set of five variable nodes 810 (represented by circles) connected to four check nodes 820 (represented by squares). Edges in bipartite graph 800 connect variable nodes 810 to check nodes 820 (the edges are represented by the lines connecting variable nodes 810 to check nodes 820). Bipartite graph 800 consists of $|V|=5$ variable nodes and $|C|=4$ check nodes, connected by $|E|=12$ edges.

Bipartite graph 800 may be represented by a simplified adjacency matrix, which may also be known as a parity check matrix (PCM). FIG. 8A shows a matrix representation 800A of bipartite graph 800. Matrix representation 800A includes a parity check matrix H and a code word vector x, where x1-x5 represent bits of the code word x. H is used for determining whether a received signal was normally decoded. H has C rows corresponding to j check nodes and V columns corresponding to i variable nodes (i.e., a demodulated symbol), where the rows represent the equations and the columns represents the bits of the code word. In FIG. 8A, matrix H has 4 rows and 5 columns corresponding to 4 check nodes and 5 variable nodes respectively. If a j-th check node is connected to an i-th variable node by an edge (i.e., the two nodes are neighbors), then there is a "1" in the i-th column and in the j-th row of the parity check matrix H. That is, the intersection of an i-th row and a j-th column contains a "1" where an edge joins the corresponding vertices and a "0" where there is no edge. The code word vector x represents a valid code word if and only if $Hx=0$, for example, if for each constraint node, the bits neighboring the constraint (via their association with variable nodes) sum to zero modulo two (0 mod 2)—i.e., they comprise an even number of "1s". Thus, if the code word is received correctly, then Hx=0 (mod 2). When the product of a coded received signal and the PCM H becomes "0", this signifies that no error has occurred.

The number of demodulated symbols or variable nodes is the LDPC code length. The number of non-zero elements in a row (column) is defined as the row (column) weight d(c)d(v).

The degree of a node refers to the number of edges connected to that node. This feature is illustrated in the matrix H shown in FIG. 8A where the number of edges incident to a variable node 810 is equal to the number of "1s" in the corresponding column and is called the variable node degree d(v). Similarly, the number of edges connected with a check node 820 is equal to the number of ones in a corresponding row and is called the check node degree d(c).

A regular graph or code is one for which all variable nodes have the same degree, j, and all constraint nodes have the same degree, k. On the other hand, an irregular code has constraint nodes and/or variable nodes of differing degrees. For example, some variable nodes may be of degree 4, others of degree 3 and still others of degree 2.

"Lifting" enables LDPC codes to be implemented using parallel encoding and/or decoding implementations while also reducing the complexity typically associated with large LDPC codes. Lifting helps enable efficient parallelization of LDPC decoders while still having a relatively compact description. More specifically, lifting is a technique for generating a relatively large LDPC code from multiple copies of a smaller base code. For example, a lifted LDPC code may be generated by producing Z number of parallel copies of a base graph (e.g., protograph) and then interconnecting the parallel copies through permutations of edge bundles of each copy of the base graph. The base graph defines the (macro) structure of the code and consists of a number (K) of information bit columns and a number (N) of code bit columns. Lifting the base graph a number of liftings Z results in a final block length of KZ. Thus, a larger graph can be obtained by a "copy and permute" operation where multiple copies of the base graph are made and connected to form a single lifted graph. For the multiple copies, like edges that are a set of copies of a single base edge, are permutated and connected to form a connected graph Z times larger than the base graph.

Figure 9:
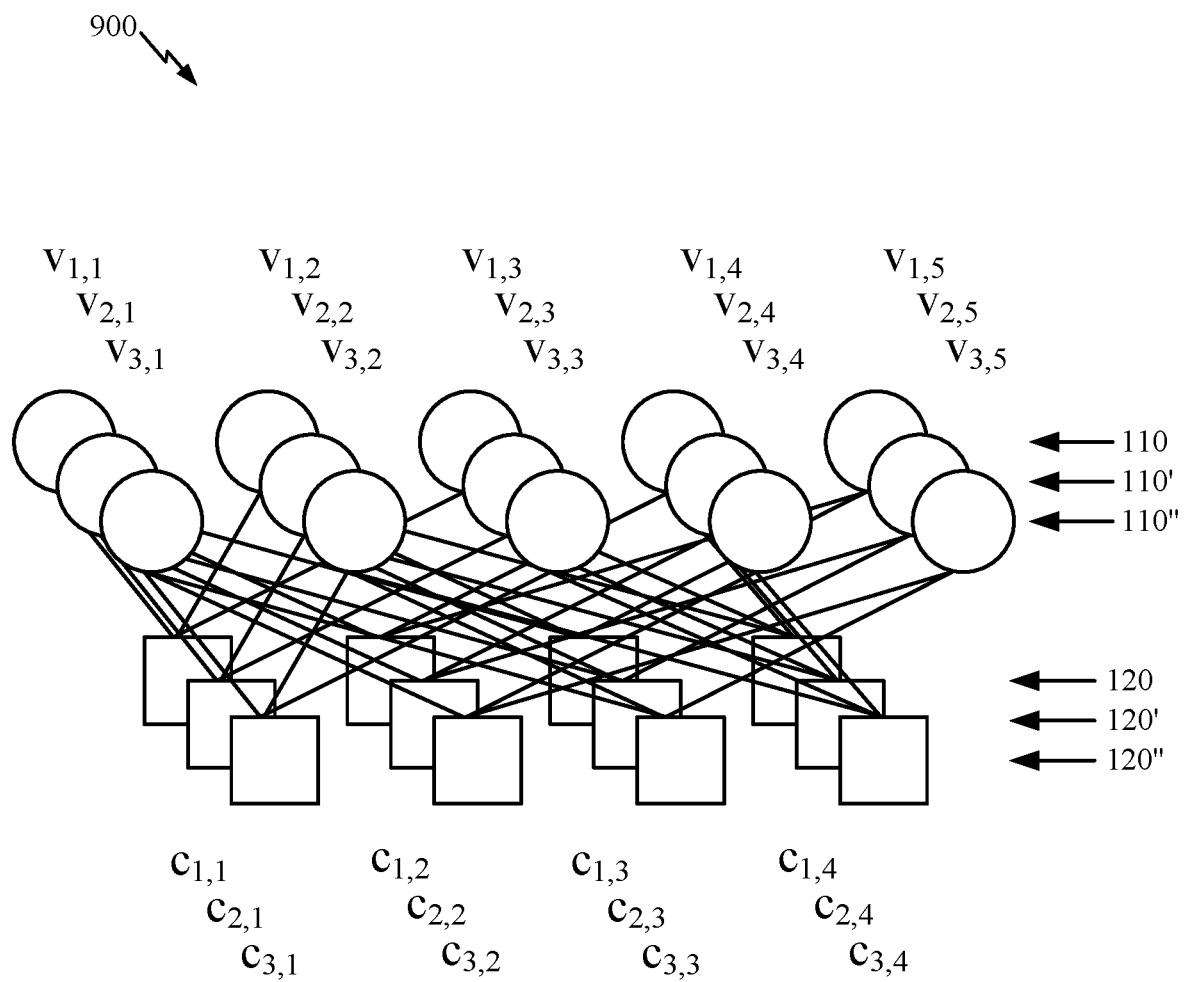
FIG. 9 is a graphical representation of liftings of the LDPC code of FIG. 8, in accordance with certain aspects of the present disclosure.

FIG. 9 is a bipartite graph 900 illustrating the liftings of three copies of the bipartite graph 800 of FIG. 8. Three copies may be interconnected by permuting like edges among the copies. If the permutations are restricted to cyclic permutations, then the resulting bipartite graph 900 corresponds to a quasi-cyclic LDPC with lifting Z=3. The original graph from which three copies were made is referred to herein as the base graph. To obtain graphs of different sizes, a "copy and permute" operation can be applied to the base graph.

A corresponding parity check matrix of the lifted graph can be constructed from the parity check matrix of the base graph by replacing each entry in the base parity check matrix with a Z×Z matrix. The "0" entries (those having no base edges) are replaced with the 0 matrix and the 1 entries (indicating a base edge) are replaced with a Z×Z permutation matrix. In the case of cyclic liftings the permutations are cyclic permutations.

A cyclically lifted LDPC code can also be interpreted as a code over the ring of binary polynomials modulo $x^z+1$. In this interpretation, a binary polynomial, $(x)=b_0+b_1x+b_2x^2++b_{z-1}x^{z-1}$ may be associated to each variable node in the base graph. The binary vector $(b_0, b_1, b_2, \ldots, b_{z-1})$ corresponds to the bits associated to Z corresponding variable nodes in the lifted graph, that is, Z copies of a single base variable node. A cyclic permutation by k (referred to as a lifting value associated to the edges in the graph) of the binary vector is achieved by multiplying the corresponding binary polynomial by $x^k$ where multiplication is taken modulo $x^z+1$. A degree d parity check in the base graph can be interpreted as a linear constraint on the neighboring binary polynomials $B_i(x), \ldots, B_d(x)$, written as $x^{k_1}B_i(x)+x^{k_2}B_2(x)++x^{k_d}B_d(x)=0x^{k_1}B_i(x)+x^{k_2}B_2(x)++x^{k_d}B_d(x)=0$, the values, $k_1, \ldots, k_d$ are the cyclic lifting values associated to the corresponding edges.

This resulting equation is equivalent to the Z parity checks in the cyclically lifted Tanner graph corresponding to the single associated parity check in the base graph. Thus, the parity check matrix for the lifted graph can be expressed using the matrix for the base graph in which 1 entries are replaced with monomials of the form $x^k$ and 0 entries are lifted as 0, but now the 0 is interpreted as the 0 binary polynomial modulo $x^z+1$. Such a matrix may be written by giving the value k in place of $x^k$. In this case the 0 polynomial is sometimes represented as "−1" and sometimes as another character in order to distinguish it from $x^0$.

Figure 10:
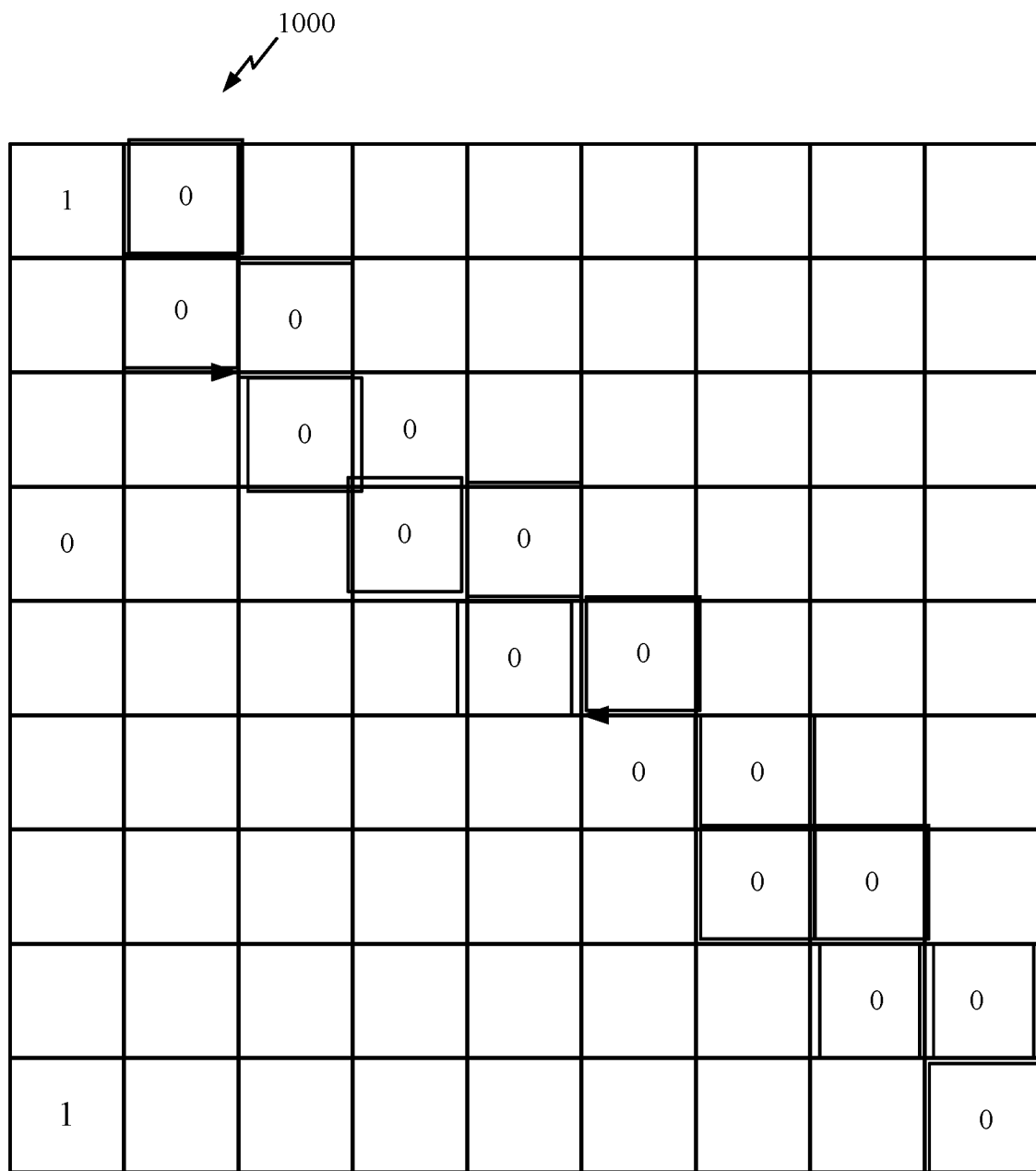
FIG. 10 is an integer representation of a matrix for a quasi-cyclic 802.11 LDPC code, in accordance with certain aspects.

Typically, a square submatrix of the parity check matrix represents the parity bits of the code. The complementary columns correspond to information bits that, at the time of encoding, are set equal to the information bits to be encoded. The encoding may be achieved by solving for the variables in the aforementioned square submatrix in order to satisfy the parity check equations. The parity check matrix H may be partitioned into two parts M and N where M is the square portion. Thus, encoding reduces to solving $M_c=s=Nd$ where c and d comprise x. In the case of quasi-cyclic codes, or cyclically lifted codes, the above algebra can be interpreted as being over the ring of binary polynomials modulo $x^z+1$. In the case of the 802.11 LDPC codes, which are quasi-cyclic, the encoding submatrix M has an integer representation as shown in FIG. 10.

A received LDPC code word can be decoded to produce a reconstructed version of the original code word. In the absence of errors, or in the case of correctable errors, decoding can be used to recover the original data unit that was encoded. Redundant bits may be used by decoders to detect and correct bit errors. LDPC decoder(s) generally operate by iteratively performing local calculations and passing those results by exchanging messages within the bipartite graph 800, along the edges, and updating these messages by performing computations at the nodes based on the incoming messages. These steps may typically be repeated several times and may be referred to as message passing steps. For example, each variable node 810 in the graph 800 may initially be provided with a "soft bit" (e.g., representing the received bit of the code word) that indicates an estimate of the associated bit's value as determined by observations from the communications channel. Using these soft bits the LDPC decoders may update messages by iteratively reading them, or some portion thereof, from memory and writing an updated message, or some portion thereof, back to, memory. The update operations are typically based on the parity check constraints of the corresponding LDPC code. In implementations for lifted LDPC codes, messages on like edges are often processed in parallel.

LDPC codes designed for high speed applications often use quasi-cyclic constructions with large lifting factors and relatively small base graphs to support high parallelism in encoding and decoding operations. LDPC codes with higher code rates (e.g., the ratio of the message length to the code word length) tend to have relatively fewer parity checks. If the number of base parity checks is smaller than the degree of a variable node (e.g., the number of edges connected to a variable node), then, in the base graph, that variable node is connected to at least one of the base parity checks by two or more edges (e.g., the variable node may have a "double edge"). If the number of base parity checks is smaller than the degree of a variable node (e.g., the number of edges connected to a variable node), then, in the base graph, that variable node is connected to at least one of the base parity checks by two or more edges. Having a base variable node and a base check node connected by two or more edges is generally undesirable for parallel hardware implementation purposes. For example, such double edges may result in multiple concurrent read and write operations to the same memory locations, which in turn may create data coherency problems. A double edge in a base LDPC code may trigger parallel reading of the same soft bit value memory location twice during a single parallel parity check update. Thus, additional circuitry is typically needed to combine the soft bit values that are written back to memory, so as to properly incorporate both updates. Eliminating double edges in the LDPC code helps to avoid this extra complexity.

LDPC code designs based on cyclic lifting can be interpreted as codes over the ring of polynomials modulo may be binary polynomials modulo $x^z+1$, where Z is the lifting size (e.g., the size of the cycle in the quasi-cyclic code). Thus encoding such codes can often be interpreted as an algebraic operation in this ring.

In the definition of standard irregular LDPC code ensembles (degree distributions) all edges in the Tanner graph representation may be statistically interchangeable. In other words, there exists a single statistical equivalence class of edges. A more detailed discussion of lifted LDPC codes may be found, for example, in the book titled, "Modern Coding Theory," published Mar. 17, 2008, by Tom Richardson and Ruediger Urbanke. For multi-edge LDPC codes, multiple equivalence classes of edges may be possible. While in the standard irregular LDPC ensemble definition, nodes in the graph (both variable and constraint) are specified by their degree, i.e., the number of edges they are connected to, in the multi-edge type setting an edge degree is a vector; it specifies the number of edges connected to the node from each edge equivalence class (type) independently. A multi-edge type ensemble is comprised of a finite number of edge types. The degree type of a constraint node is a vector of (non-negative) integers; the i-th entry of this vector records the number of sockets of the i-th type connected to such a node. This vector may be referred to as an edge degree. The degree type of a variable node has two parts although it can be viewed as a vector of (non-negative) integers. The first part relates to the received distribution and will be termed the received degree and the second part specifies the edge degree. The edge degree plays the same role as for constraint nodes. Edges are typed as they pair sockets of the same type. The constraint that sockets must pair with sockets of like type characterizes the multi-edge type concept. In a multi-edge type description, different node types can have different received distributions (e.g., the associated bits may go through different channels).

Puncturing is the act of removing bits from a code word to yield a shorter code word. Thus, punctured variable nodes correspond to code word bits that are not actually transmitted. Puncturing a variable node in an LDPC code creates a shortened code (e.g. due to the removal of a bit), while also effectively removing a check node. Specifically, for a matrix representation of an LDPC code, including bits to be punctured, where the variable node to be punctured has a degree of one (such a representation may be possible through row combining provided the code is proper), puncturing the variable node removes the associated bit from the code and effectively removes its single neighboring check node from the graph. As a result, the number of check nodes in the graph is reduced by one.

Figure 11:
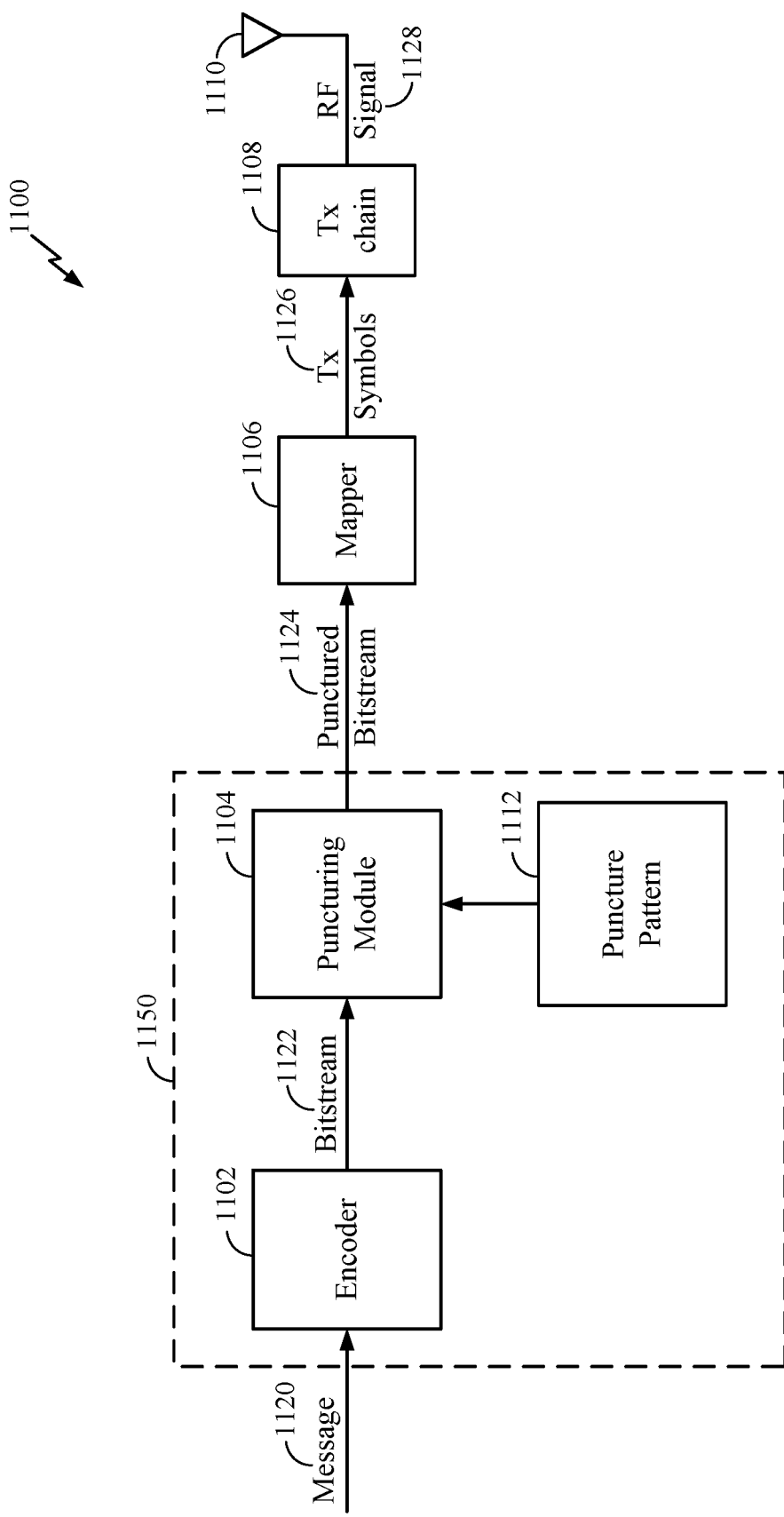
FIG. 11 is a simplified block diagram illustrating an example encoder, in accordance with certain aspects of the present disclosure.

FIG. 11 is a simplified block diagram illustrating am encoder, in accordance with certain aspects of the present disclosure. FIG. 11 is a simplified block diagram 1100 illustrating a portion of radio frequency (RF) modem 1150 that may be configured to provide a signal including an encoded message for wireless transmission. In one example, convolutional encoder 1102 in a BS 110 (or a UE 120 on the reverse path) receives message 1120 for transmission. Message 1120 may contain data and/or encoded voice or other content directed to the receiving device. Encoder 1102 encodes the message using a suitable modulation and coding scheme (MCS), typically selected based on a configuration defined by the BS 110 or another network entity. Encoded bit stream 1122 produced by encoder 1102 may then be selectively punctured by puncturing module 1104, which may be a separate device or component, or which may be integrated with encoder 1102. Puncturing module 1104 may determine that the bit stream should be punctured prior to transmission or transmitted without puncturing. The decision to puncture bit stream 1122 may be made based on network conditions, network configuration, RAN defined preferences, and/or for other reasons. Bit stream 1122 may be punctured according to puncturing pattern 1112 and used to encode message 1120. Puncturing pattern 1112 may be based on LDPC code designs as described in more detail below. Puncturing module 1104 provides output 1124 to mapper 1106 that generates a sequence of Tx symbols 1126 that are modulated, amplified and otherwise processed by Tx chain 1108 to produce RF signal 1128 for transmission through antenna 1110.

Output 1124 of puncturing module 1104 may be the unpunctured bit stream 1122 or a punctured version of bit stream 1122, according to whether modem portion 1150 is configured to puncture bit stream 1122. In one example, parity and/or other error correction bits may be punctured in output 1124 of encoder 1102 in order to transmit message 1120 within a limited bandwidth of the RF channel. In another example, bit stream 1122 may be punctured to reduce the power needed to transmit message 1120, to avoid interference, or for other network-related reasons. These punctured code word bits are not transmitted.

The decoders and decoding algorithms used to decode LDPC code words operate by exchanging messages within the graph along the edges and updating these messages by performing computations at the nodes based on the incoming messages. Each variable node in the graph is initially provided with a soft bit, termed a received value, that indicates an estimate of the associated bit's value as determined by observations from, for example, the communications channel. Ideally, the estimates for separate bits are statistically independent. This ideal may be violated in practice. A received word is comprised of a collection of received values.

Figure 12:
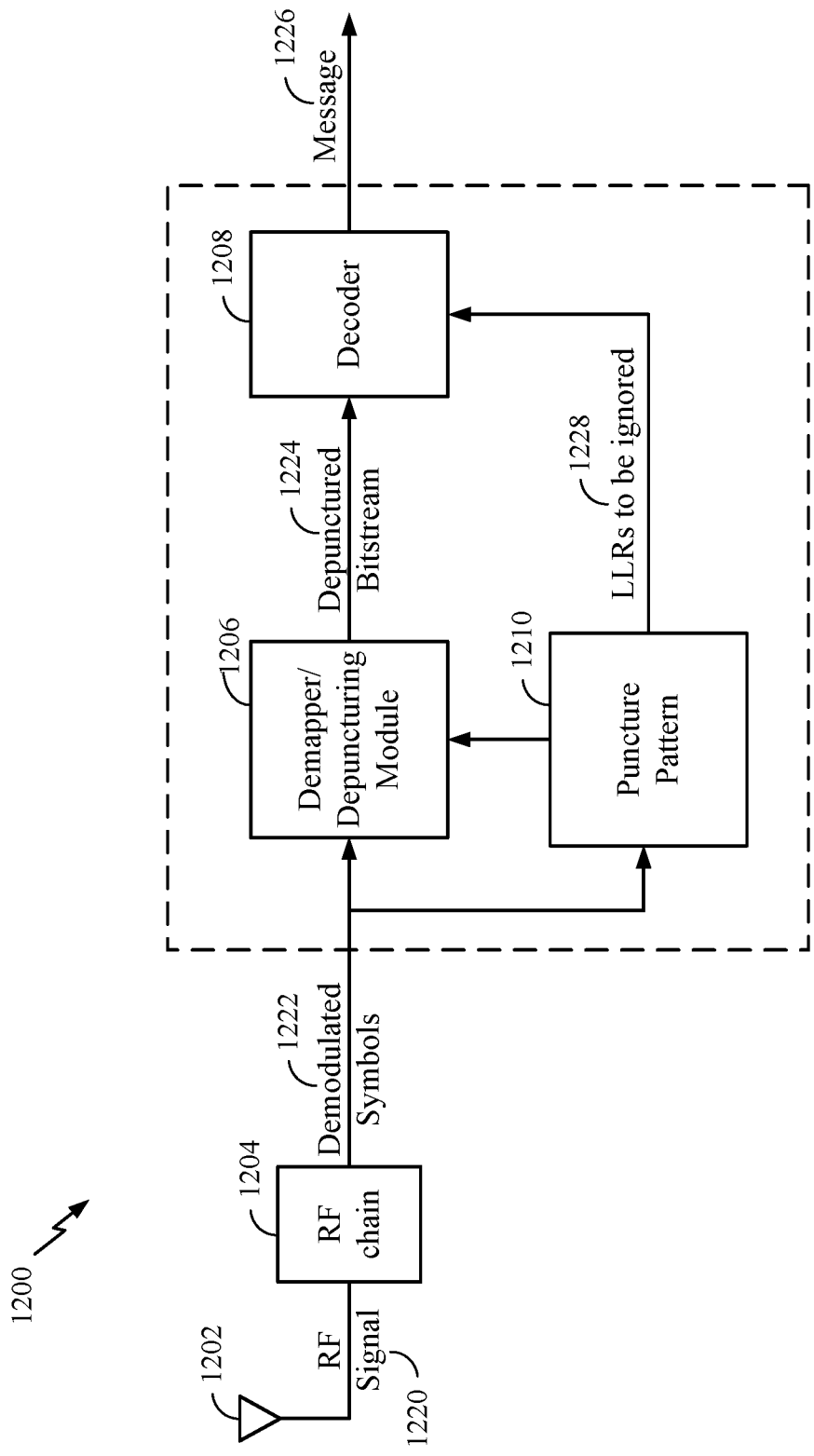
FIG. 12 is a simplified block diagram illustrating an example decoder, in accordance with certain aspects of the present disclosure.

FIG. 12 is a simplified block diagram illustrating a decoder, in accordance with certain aspects of the present disclosure. FIG. 12 is a simplified schematic 1200 illustrating a portion of RF modem 1250 that may be configured to receive and decode a wirelessly transmitted signal including a punctured encoded message. The punctured code word bits may be treated as erased. For example, the LLRs of the punctured nodes may be set to "0" at initialization. Depuncturing may also include deshortening of shortened bits. These shortened bits are not included in a transmission and, at the receiver, shortened bits are treated as known bits, typically set to "0", allowing LLR magnitude to be set to the maximum possible. In various examples, modem 1250 receiving the signal may reside at the access terminal (e.g., UE 120), at the base station (e.g., BS 110), or at any other suitable apparatus or means for carrying out the described functions. Antenna 1202 provides an RF signal 1220 to the receiver. RF chain 1204 processes and demodulates RF signal 1220 and may provide a sequence of symbols 1222 to demapper 1206, which produces bit stream 1224 representative of the encoded message (e.g., message 1120).

Demapper 1206 may provide a depunctured bit stream 1224. In one example, demapper 1206 may include a depuncturing module that can be configured to insert null values at locations in the bit stream at which punctured bits were deleted by the transmitter. The depuncturing module may be used when puncture pattern 1210 used to produce the punctured bit stream at the transmitter is known. Puncture pattern 1210 can be used to identify LLRs 1228 that may be ignored during decoding of bit stream 1224 by convolutional decoder 1208. The LLRs may be associated with a set of depunctured bit locations in bit stream 1224. Accordingly, decoder 1208 may produce decoded message 1226 with reduced processing overhead by ignoring identified LLRs 828. The LDPC decoder may include a plurality of processing elements to perform the parity check or variable node operations in parallel. For example, when processing a code word with lifting size Z, the LDPC decoder may utilize a number (Z) of processing elements to perform parity check operations on all edges of a lifted graph, concurrently.

Processing efficiency of decoder 1208 may be improved by configuring the decoder 1208 to ignore LLRs 1228 that correspond to punctured bits in a message transmitted in punctured bit stream 1222. Punctured bit stream 1222 may have been punctured according to a puncturing scheme that defines certain bits to be removed from an encoded message. In one example, certain parity or other error-correction bits may be removed. A puncturing pattern may be expressed in a puncturing matrix or table that identifies the location of bits to be punctured in each message. A puncturing scheme may be selected to reduce processing overhead used to decode message 1226 while maintaining compliance with data rates on the communication channel and/or with transmission power limitations set by the network. A resultant punctured bit stream typically exhibits the error-correcting characteristics of a high rate error-correction code, but with less redundancy. Accordingly, puncturing may be effectively employed to reduce processing overhead at decoder 1208 in the receiver when channel conditions produce a relatively high signal to noise ratio (SNR).

At the receiver, the same decoder used for decoding non-punctured bitstreams can typically be used for decoding punctured bitstreams, regardless of how many bits have been punctured. In conventional receivers, the LLR information is typically de-punctured before decoding is attempted by filling LLRs for punctured states or positions (de-punctured LLRs) with zeros. The decoder may disregard de-punctured LLRs that effectively carry no information based in part, on what bits are punctured. The decoder may treat shortened bits as known bits (e.g., set to "0").

Example High Performance, Flexible, and Compact Low-Density Parity-Check (LDPC) Code Certain aspects of the present disclosure provide low-density parity-check (LDPC) code designs that offer high-performance and are flexible and compact. As will be described in greater detail below, the LDPC codes may be used for large ranges of code rates, blocklengths, and granularity, while being capable of fine incremental redundancy hybrid automatic repeat request (IR-HARQ) extension and maintaining good error floor performance, a high-level of parallelism for high throughout performance, and a low description complexity.

Example Independent Clustering Scheme for Efficiently Lifting LDPC Codes

In a wireless communication system (e.g., wireless communications system 100), a set of error correcting codes (e.g., LDPC codes) may be used, for example, for various ranges of blocklengths and/or code rates to be used. To increase efficiency in terms of implementation and compactness of description, it is desirable that the set of codes are related.

As described above with respect to FIG. 9, a base graph or parity check matrix (PCM) (having K information bits-columns and N total transmitted bit-columns) can be copied, and random permutations to each edge bundle to interconnect the copies, to provide a lifted LDPC code. Practical codes use cyclic permutations or circulant permutation matrices to interconnect the copies of the lifted base graph, resulting in quasi-cyclic codes, which may be easier to implement in hardware. In an example, for a lifting value Z, each edge in the base PCM is associated with an integer lifting value k in the range [0, Z−1]. The associated integer represents the cyclic shift of the identity matrix by that integer. A table may be used for the base PCM showing entries for the bit columns and check nodes. Each entry corresponds to the circulant matrix that is the identity matrix cyclically shifted by the integer value associated with an edge between a variable node and a check node. The entry '.' May be used when there is no edge present between a base variable node and a base check node.

When the base graph is reused without alteration the code rate (given by K/N) is same for all liftings Z (corresponding to the number of liftings or copies of the base graph). Using different lifting values can provide a set of codes (e.g., a code family) to achieve a range of block lengths (given by KZ). Thus, using different lifting values for the unaltered base graph can achieve a set of codes with a similar code rate but for different block lengths. For different codes rates, different base graphs may be used.

To generate/describe a set of codes (e.g., code family) for a range of code rates and/or block lengths, one way to design the code family is to design a different base PCM for each code rate and each lift value. For example, in 802.11n there are four code rates (1/2, 2/3, 3/4 5/6) and three blocklengths (648, 1296, 1944) corresponding to the lift values of (27, 54, 81). There is a unique base PCM of size 24 bit-columns for each "tuple" (i.e., each pair of code rate and lift value) resulting in twelve base PCMs (e.g., for the combinations of code rate and lift value: (1/2, 27), (1/2, 54), (1/2, 81), . . . (5/6, 81)). Thus, for large Z, the set of liftings Z and lifting values k can lead to a large description complexity.

Techniques for efficiently describing/generating the set of liftings are desirable.

A set of liftings for a single parity matrix may be efficiently described as an increasing series of liftings that are closely spaced to each other in value. This allows liftings to be specified in a narrow range with a common set of bits, allowing for a compact description and good performance.

Figure 13:
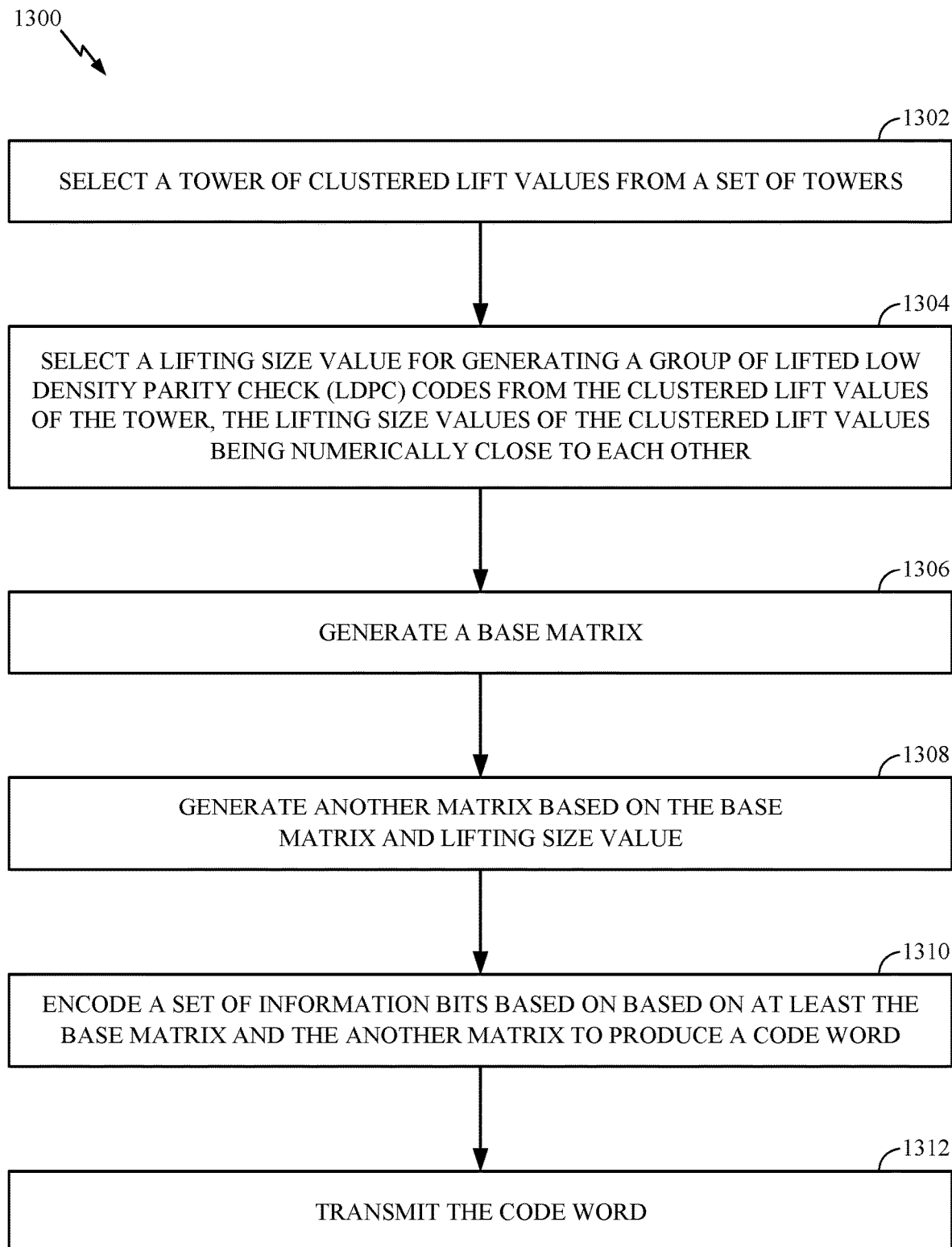
FIG. 13 is a flow diagram illustrating example operations for encoding and transmitting a code word using a base graph structure that may be performed by a transmitting device, in accordance with certain aspects of the present disclosure.

FIG. 13 is a flow diagram illustrating example operations 1300 for encoding and transmitting a code word using a base graph structure, according to aspects of the present disclosure. Operations 1300 may be performed, for example, by a transmitter/encoder device (e.g., such as a BS 110 or a UE 120). Operations 1300 begin at 1302 by determining a base matrix. The base matrix is associated with a cluster of lifting size values. At 1304, the transmitter device selects a lifting size value, Z, for generating a lifted LDPC codes by permutations of edges in the base matrix. The lifting size values in the cluster of lifting size values are within a defined range of each other. At 1306, the transmitter device generates a lifted matrix based, at least in part, on the base matrix and the selected lifting size value. At 1308, the transmitter device uses the generated lifted matrix to generate the lifted LDPC code. At 1310, the transmitter device encodes a set of information bits based on the lifted LDPC code to produce a code word. At 1312, the transmitter device transmits the code word over a wireless medium.

According to aspects of the present disclosure, a set liftings Z for a single base graph or PCM, to obtain a family of LDPC codes can be described (e.g., determined/generated) using lifting values that are close to each other in value for a compact description.

The family of LDPC codes can be obtained using a base graph together with an increasing series of liftings with lifting values $Z_1, Z_2, \ldots, Z_n$ which may be referred to herein as a "tower" of liftings. A cluster includes members which are within a defined range of each other. For example, members of a cluster may be within a certain ratio of each other. In some cases, the values of the members of the cluster may be within a ratio of two of each other.

One example of a cluster is the set of lifting values $\{4, 5, 6, 7\}$ having a maximum ratio of $7/4$. A tower can be obtained by applying an exponential power to an integer, such as a power of 2. Thus, a tower of clustered liftings may consist of the integers $2^j \{4, 5, 6, 7\}$ for $j=1, \ldots, 7$. This gives an approximately exponentially spaced set of 28 values for Z. Put another way, this gives the tower $Z_1$, $Z_2, \ldots, Z_{28}$=8 ($2^1*4$), 10, 12, 14, $\ldots$, 896 ($2^7*7$). For a fixed j the four lifting values are within a factor of $7/4$ of each other and may form a cluster of lifting values. For $j=1, \ldots, 7$, a tower of clustered liftings may be represented as $2^j \{4,5,6,7\}$. While the present example includes a set of lifts within a factor of 2 as clustered, other factors, (e.g., 3, 4 . . . , etc.) may be used. These factors need not be consecutive, but should be numerically within a defined range of each other.

According to certain aspects, for any lifting size Z in the set of clustered liftings, the associated integer lifting values k for the edge permutations may be used for any of the other liftings in the set of clustered liftings. For example, lifting values may be designed for $Z=2^j4$ that are also good for $2^j\{5, 6, 7\}$. Thus, describing (e.g., determining/generating/indicating/storing) a family of LDPC codes may be performed by identifying sets of clustered lift values (associated to edges in a base graph) that are close to each other, such as within a factor (e.g., a factor 2 or 3) of each other. In the example above, this corresponds to identifying the set of lifting values $\{4, 5, 6, 7\}$ and the other sets in the tower of liftings, $\{16, 20, 24, 28\}$, $\{32, 40, 48, 56\}$, . . . $\{512, 640, 768, 896\}$, which are within a factor of 2 of each other. For each clustered set of liftings, the base PCM for the smallest lift value in the cluster (e.g., Z=8) may be optimized. That optimized base PCM may be used for the other lift values in that cluster (e.g., Z=10, Z=12, Z=14). Similarly, the optimized base PCM can be determined for the other sets of clustered liftings.

Thus, liftings within a defined range of each can be specified (e.g., stored/indicated) other with a common set of bits. For example, j+2 bits per lifting value may be used to specify all lifts for the four stated liftings in the cluster $2^j \{4,5,6,7\}$.

These liftings may be further improved by having additional bits. For example, using j+3 bit to represent the lifting values k on an edge and defining the lifting by taking the j+3 bit value modulo Z for Z in $2^j \{4,5,6,7\}$ results in a lifting for $Z=2^j*4$ given by the j+2 lower order bits and the higher order bit affects only the other 3 liftings. Higher order bits can similarly be used. The example presents a range of liftings within a factor of 2 of each other and all are specified using a j+2 (or slightly larger) bits. However, other factors may be used, so long as the factors are numerically within a defined range of each other.

Generally, optimization of lifts and graphs targets reducing the number of small loops in the Tanner graph of the LDPC code. A loop in the lifted Tanner graph corresponds with a loop in the base graph by projecting the loop onto the base graph. Additional optimizations may take into account the degrees of nodes in the loops In the case of matched lifted graphs (e.g., cyclically lifted graphs) a loop in the base graph is also a loop in the lifted Tanner graph precisely when the lifting values traversed in the loop reduce to the identity permutation.

According to certain aspects, using j+3 bit to represent the lifting and defining the lifting by taking the j+3 bit value modulo Z for Z in $2^j \{4,5,6,7\}$ results in a lifting for $Z=2^j 4$ given by the j+2 lower order bits and the higher order bit affects only the other 3 liftings.

For the optimization of the base graph for a set of clustered liftings, liftings values may be selected within a range $[0,(2^j*4)-1]$. In other words, the lifting values may be selected from a range that is smaller than the smallest lifting size in the set of clustered liftings. Thus, in example described herein, for the tower of clustered liftings for j=1, the lifting size values may be selected from the range [0:7].

For cyclically lifted graphs, each edge in the base graph has an associated integer as a lifting value. The value is taken positively when the edge is traversed in the variable-to-check direction and negatively in the check-to-variable direction. Given a loop in the base graph and a lifting size Z, the base loop will also be a lifted loop if the loop sum of the corresponding integers is 0 or has Z as a factor. Thus, when choosing integer value in the range $[0,2^j4]$ for the lifting values, the goal for $Z=2^j4$ is to avoid summing to 0 or to having a factor of $2^j4$ in the loop sum. For small loops, the sum generally will not be large, so in general, there are more such loops with a sum of magnitude $2^j4$ Than those with a sum of magnitude $2*2^j4$ or $3*2^j4$. Similarly, on average, sums of magnitude $2^j\{5, 6, 7\}$ and its multiples are less frequent. Thus, the small loop avoidance design problem is similar for these closely related values, where lift values in the range $[0:2^j 4]$ uses more than half the range available for $Z=2^j\{5, 6, 7\}$. For a much larger Z, the used portion would be smaller and there may be a bigger gap between the best performance available for the large Z and that achievable by restricting liftings to a smaller Z. Thus, applying this approach over a relatively small range of Z values (e.g., within a factor of 2) is prudent. Hence, it is possible to find lift values that give good performance for four values simultaneously.

By utilizing a range of liftings which are numerically within a defined range along with an independent set of bits for each j with j=1, ..., 7 the number of bits required is 3+4+5+6+7+8+9=42 bits per edge to specify all of the liftings. By creating dependencies between different values of j this requirement may be further reduced. Additionally, often a structured LDPC graph will have special edges whose lifting values may be determined directly. For example, the edges connecting degree one variable nodes may always have lifting value 0. Edges on accumulate chains in encoding structures are also often set to 0. Such fixed lifting structure may not vary as the liftings vary and may be referred to as having a special invariant structure. The lifting values for such edges can be more compactly represented. However, the number of edges having such a special invariant structure is a small portion of the total number of edges in the graph and does not significantly detract from the benefits of the above method for those edges that do not have a special invariant structure.

Example Nested Scheme for Efficiently Lifting LDPC Codes

As described above, liftings in a clustered set of liftings (e.g., a "tower" of liftings") can use the same lifting values (integers associated with the edge permutations) and, thus, the number of bits used to specify all of the liftings and lifting values may be reduced. This size reduction may allow for a reduced amount of memory for storing descriptions of all of the LDPC codes.

According to aspects of the present disclosure, a nested scheme for efficiently lifting LPDC codes may be used that further reduces the number of bits per edge in the base PCM.

As all liftings, even for different j values (e.g., liftings in different clustered sets), are based on the same base graph, the structures found to work for a small j value (i.e., for liftings in the corresponding set of clustered liftings) may be scaled and reused for larger j values (i.e., for larger liftings in another set). For example, a structure optimized for a smaller j may be retained and scaled for a larger j in order to reuse optimized bits found for the smaller j.

Figure 14:
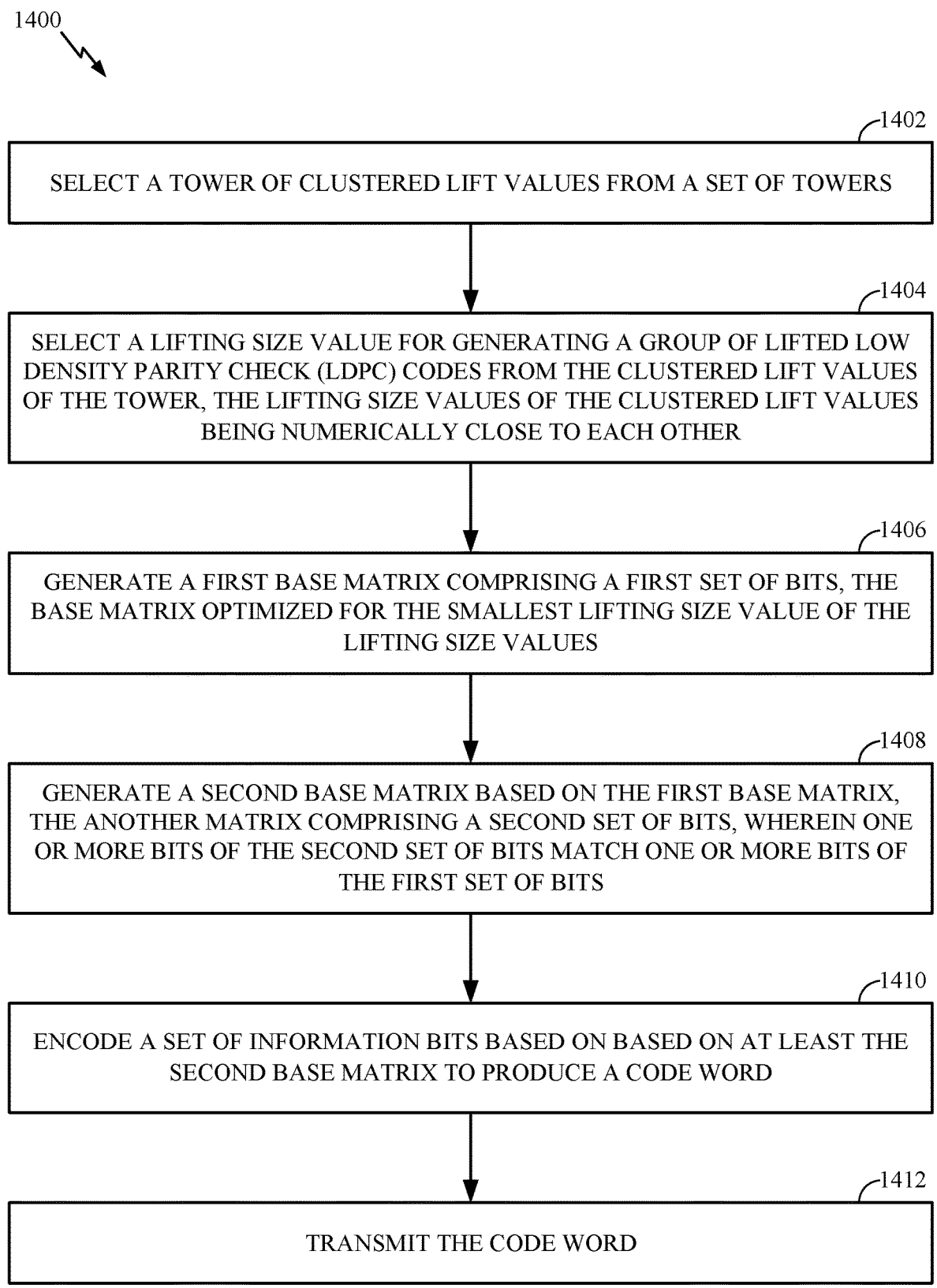
FIG. 14 is a flow diagram illustrating example operations for encoding and transmitting a code word using a base graph structure that may be performed by a transmitting device, in accordance with certain aspects of the present disclosure.

FIG. 14 is a flow diagram illustrating example operations 1400 for encoding and transmitting a code word using a base graph structure, according to aspects of the present disclosure. Operations 1400 may be performed, for example, by a transmitter/encoder device (e.g., such as a BS 110 or a UE 120). Operations 1400 begin at 1402 by determining a base matrix. The base matrix is associated with a cluster of lifting size values. At 1404, the transmitting device selects a first lifting size value from the cluster of lifting size values for generating a lifted low density parity check (LDPC) codes by permutations of edges in the base matrix. The lifting size values in the cluster of lifting size values are within a defined range of each other. At 1406, the transmitting device generates a first lifted matrix based, at least in part, on the base matrix and selected first lifting size value. At 1408, the transmitting device selects a set of bits associated with the selected first lifting size value. At 1410, the transmitting device selects a second lifting size value from the cluster of lifting size values. At 1412, the transmitting device generates a second lifted matrix, based, at least in part, on the base matrix, second selected lifting size value, and the set of bits. At 1414, the transmitting device uses the generated second lifted matrix to generate the lifted LDPC code. At 1416, the transmitting device encodes a set of information bits based on the lifted LDPC code to produce a code word. At 1418, the transmitting device transmits the code word. In the example described above, for j=1, the set of clustered liftings is Z={8, 10, 12, 14} may be designed using lifting values in the range [0, 1, 2, ... 7]. According to certain aspects, the liftings values selected for the j=1 graph can be multiplied by 2 and used for the j=2 graph, where the set of clustered liftings is Z={16, 20,24, 28}. In this case, the larger lifted graph (for j=2) inherits and improves on the loop structure of the smaller graph as the larger graph for lifting 2Z consists of two parallel copies of the original smaller graph with lifting Z. Because the smaller graph is designed to avoid loops summing to a factor of Z, it also avoids loops summing to factors of 2Z. j=1 and j=2 are merely exemplary. In aspects, the lifting values for any set of clustered liftings may be used for another set of larger clustered liftings, and the lifting values can be multiplied by the factor of the difference in the liftings sizes of the two sets of liftings.

Further optimization of the larger graph could be achieved by altering the lowest order bit in the liftings. For example, after multiplication by 2 all liftings would have their lowest order bit set to 0. More generally, to achieve the best possible performance, more than just the lowest order bit may be altered. For example, two or three least significant bits may be altered. Generally, optimizing the three least significant bits results in nearly optimal performance. This preserves the large scale properties of the liftings (the most significant) bits, scaled up accordingly (by multiplying by 2) and then refines the details (the lower order bits) to find an optimal solution for the base graph for the next set of clustered liftings.

In one example, the three lowest order bits may be re-optimized. For the set of clustered liftings j=1, a 3-bit optimized lift per edge may be obtained. If the lifting values for an edge in the base graph (e.g., for the smallest lifting in the set j=1) are a, y, and z (i.e., 3 bits) in base 2 (i.e., where each of a, y, and z is an integer values of 0 or 1), then for the base graph for the set of clustered liftings j=2, the same edge will have lifting values of a, b, w, x, (i.e., 4 bits with one bit copied from the j=1 family) and in the base graph for the set of clustered liftings j=3, the edge will have lifting values a, b, c, u, v, (5 bits with 2 bits copied from the j=2 family) etc. Thus, the base graph for the set of clustered liftings j=7, the edge will have lifting value a, b, c, d, e, f g, r, s (i.e., 9 bits with 7 bits copied from the j=6 family) and the bits a, b, c, d, e, f g are reused for smaller set of clustered liftings j while the bits r and s are unique to j=7. The base graph for the set of clustered liftings uses j common bits and 2 unique bits. Thus, for all of the families j=1 ... 7, there is a total of seven common bits and fourteen unique bits (i.e., 2 unique bits for each j), for a total of 21 bits to describe all seven code families. This is referred to as a "nested" scheme for describing the families of LDPC codes. If only the two lowest order bits were re-optimized then only 14 bits total would be needed. In some examples, most significant bits (MSBs) or any subset of consecutive bits can be used as common bits, rather than the LSBs. Both cases offer a substantial improvement on the 42-bit independent case.

As discussed above, certain structured LDPC graph may have a special invariant structure, for example, some special edges may have liftings that are invariant. For example, the 802.11 encoding structure, uses liftings of values 0 and 1. If this structure is retained, the structure is consistent with the above optimization of lower order bits only when at least two of the lower order bits are optimized. This is because 2×l=2; so if only the lowest order bit is optimized, the value 1 cannot be reached as only 2 and 3 are possible values. In this case it may be preferable to retain the lifting value of 1.

A similar technique can be used in which the low order bits are retained across different j and the higher order bits are re-optimized. In general, some bits from a smaller j may be reused to define values for the larger j while leaving enough bits for optimization so as to achieve good performance.

Example Compactly Described Family of LDPC Codes

As described above, large collections of lifting values and liftings for sets of clustered LDPC codes may be compactly described (e.g., represented/generated/determined/stored). For a given base graph, this provides a compact way of obtaining a large range of blocklengths. However, it may be desirable to also support many different code rates, which may require many different base graphs. In addition, the granularity of the block lengths is exponential. In practice, finer granularity in blocklength may be desirable. Finer granularity can be achieved through puncturing and shortening, thus proper code design accounting for the puncturing and/or shortening may be desirable to ensure high performance of the coding system. LDPC codes can be designed with HARQ extensions (e.g., IR-HARQ extensions). Thus, the base graph structure may support a range of code rates from a highest rate, which may be used for a first transmission in a HARQ sequence, down to some lowest supported rate.

Aspects of the present disclosure provide a base graph structure to combine with a set of liftings Z (for example, with a set clustered lifting values or a family of liftings), for a single-bit granularity in blocklength over a wide range of block sizes.

Figure 15:
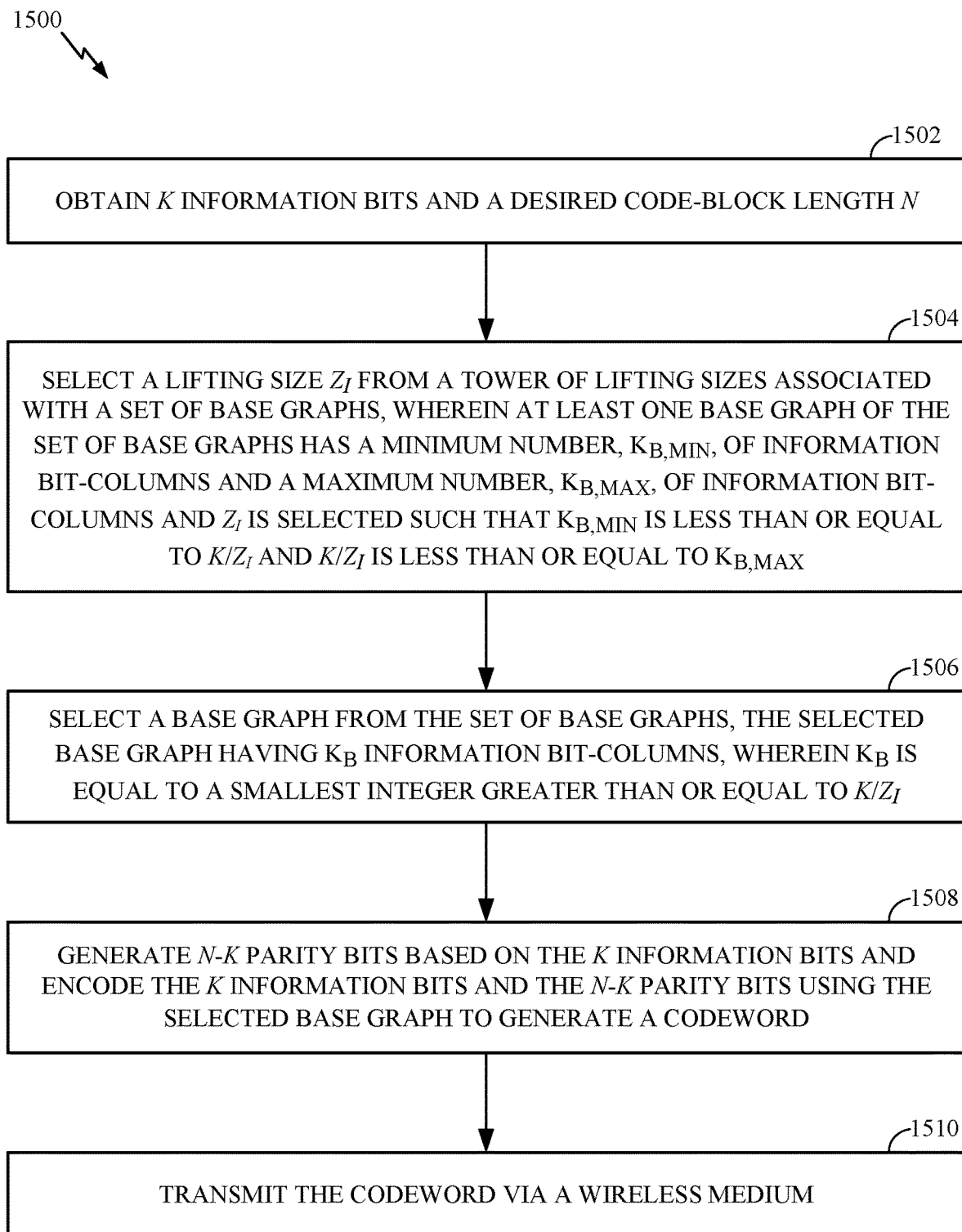
FIG. 15 is a flow diagram illustrating example operations that may be performed by a wireless device, according to aspects of the present disclosure.

FIG. 15 is a flow diagram illustrating example operations 1500 for encoding and transmitting a codeword using a base graph structure, according to aspects of the present disclosure. Operations may be performed by a wireless device, for example, the transmitting device (e.g., a BS 110 or a UE 120). Operations 1500 begin at 1502 with obtaining K information bits and a desired code-block length N. At 1504, the wireless device selects a lifting size $Z_i$ from a tower of lifting sizes associated with a set of base graphs. At least one base graph of the set of base graphs has a minimum number, $k_{b,min}$, of information bit-columns and a maximum number, $k_{b,max}$, of information bit-columns and $Z_i$ is selected such that $k_{b,min}$ is less than or equal to $K/Z_i$ and $K/Z_i$ is less than or equal to $k_{b,max}$. At 1506, the wireless device selects a base graph from the set of base graphs, the selected base graph having $k_b$ information bit-columns. $k_b$ is equal to a smallest integer greater than or equal to $K/Z_i$. At 1508, the wireless device generates N-K parity bits based on the K information bits and encoding the K information bits and the N-K parity bits using the selected base graph to generate a code word. At 1510, the wireless device transmits the code word via a wireless medium.

Figure 16:
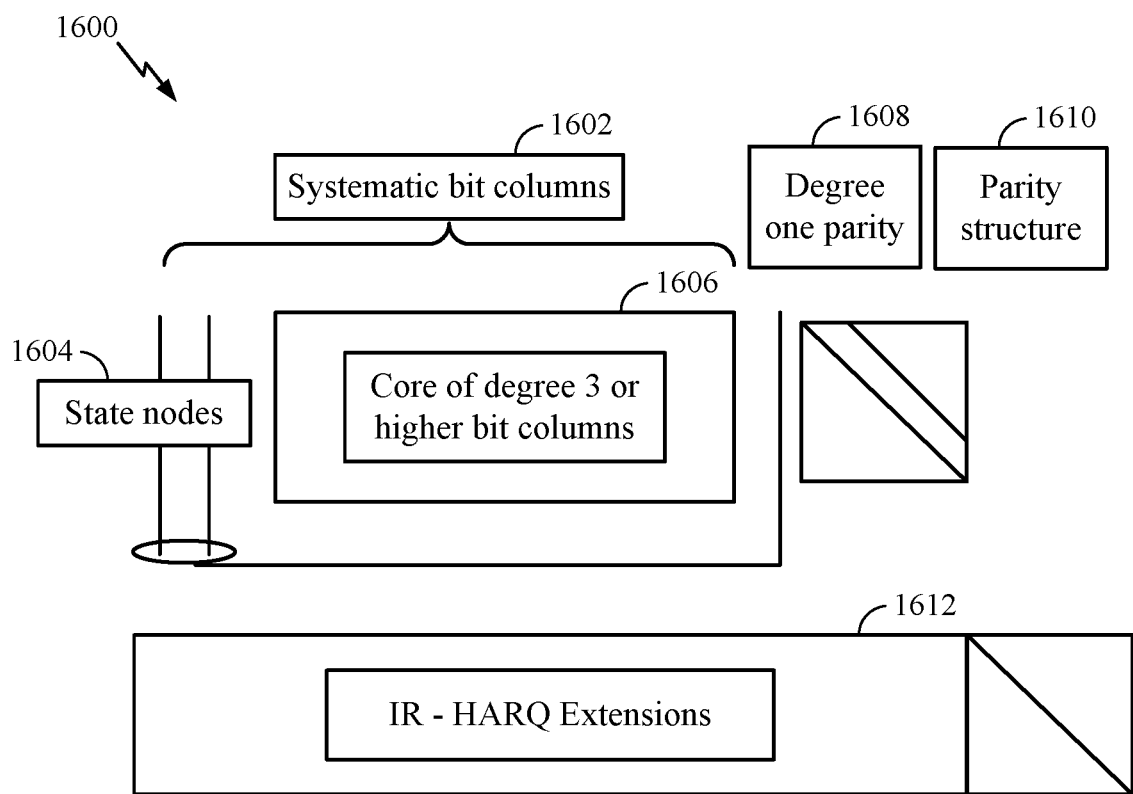
FIG. 16 shows a structure of an example base parity check matrix (PCM), in accordance with aspects of the present disclosure.

FIG. 16 shows a structure of an example base PCM 1600, in accordance with certain aspects of the present disclosure. As shown in FIG. 16, the example base PCM 1600 has information (systematic) bit columns 1602 (i.e., variable nodes) which include a "core" structure 1606 of some number of degree 3 or higher variable nodes along with some state (punctured) nodes 1602 that are of higher degree, which together form the set of information bit columns 1602. For simplicity of description, all of the systematic bit columns other than the high degree punctured state nodes are degree 3, but the disclosed techniques are not so limited.

As shown in FIG. 16, the base PCM 1600 structure includes a parity structure 1610. The parity structure 1610 includes an accumulate chain terminated by a degree 3 node (e.g., similar to the IEEE 802.11n standard LDPC code). Alternate encoding structures may be used, for example to support deeper error floors, and the disclosed techniques may be applied to such variations on the encoding structure. As shown in FIG. 16, the base PCM 1600 structure may also include one or more degree one parity bits 1608. The degree one parity bits 1608 are connected via a check node only to the state nodes.

The bit columns 1602 and parity structure 1610 may be referred to as the "core graph" or "core PCM". As shown in FIG. 16, the core graph can be extended using additional parity-bits further IR-HARQ transmissions (IR-HARQ extensions 1612) to define codes of a lower code rate than the rate associated to the core graph. The complete graph or some portion beyond the core graph may be referred to as an "extended graph". The core graph has an associated code rate determined by its parameters (i.e., variable nodes, check nodes, edges, puncturing, etc.). Some parity bits in the core graph can be punctured to support code rates above the code rate of the core graph. Lower coding rates may be obtained by extending the core graph with parity bits.

Aspects of the present disclosure focus on the degree three core variable nodes, but the aspects may be applied even if some of the variable nodes involved have a different core degree. The core degree could be higher than three, for example. A base graph design may be combined with a suitable set of lifting values to achieve fine granularity in blocklength (single-bit granularity).

According to certain aspects, shortening of the base graph and the lifted graph may be used to achieve the finer granularity in blocklength. The core graph may have a maximum number of information columns, denoted by $k_{b,max}$. When the base code is shortened, one or more information bits are declared known (e.g., by setting the bit to 0} and they are not used in the transmitted code. When a bit in the base graph is known, the entire corresponding column of Z bits in the lifted graph is declared known. The receiver may know a priori the bits that are fixed to 0 and can exploit that knowledge in the decoding process. In parallel decoding architectures an entire known column can be skipped in the decoding process, so the known column incurs no operations at the receiver, hence the coding system can operate as if the base graph were actually smaller. This does not typically apply to shortening that is less than an entire column.

According to aspects of the present disclosure, a base graph structure that gives very good performance for shortening over some range is provided. The shortening of the base graph results in a range of supported information columns from a minimum value of $k_{b,min}$ up to a maximum value of $k_{b,max}$. The structure of the shortening guarantees that at most one lifted column of information bits of the lifted graph will be partially shortened. All other information bit columns may be completely used or completely shortened (e.g., shortened at the base graph level).

According to aspects of the present disclosure, a base graph structure is provided which, when combined with carefully chosen lift values, provides a compact coding solution and allows transmissions using arbitrary rates and blocklengths with good performance.

The tower of liftings is a discrete set $\{Z_1, Z_2, \ldots, Z_m\}$ where $Z_1$ denotes the minimum lifting size and $Z_m$ denotes the maximum lifting size. According to certain aspects, $k_{b,min}$ and $k_{b,max}$ may be selected such that the ratio $k_{b,min}/k_{b,min}$ is at least as large as the maximum value of $Z_{i+1}/Z_i$ for all values of i. This may provide the basis for fine granularity in information blocklength.

In addition to the information bits in the base graph, the base graph structure can support a number or parity bits in the range from a minimum of $c_{b,min}$ to a maximum of $c_{b,max}$. The minimum may be less than the number of parity bits in the core graph (e.g., some parity bits may be punctured) to support higher transmission rates. The maximum number of parity bits $c_{b,max}$ corresponds to the maximum number of the parity bits in the extended graph and may be substantially larger than the number of parity bits in the core graph.

Figure 17:
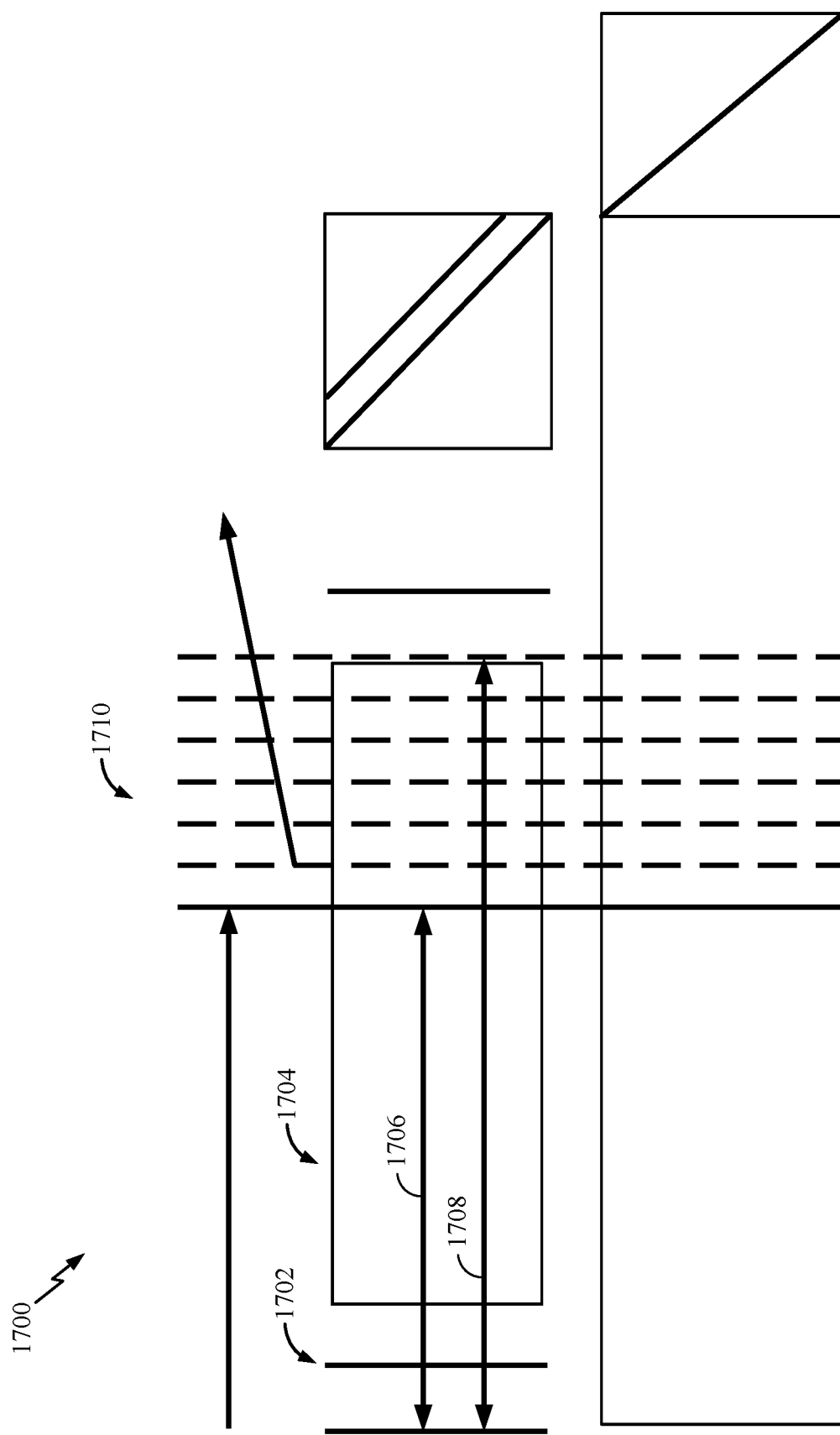
FIG. 17 illustrates an exemplary optimized base graph, in accordance with aspects of the present disclosure.

According to aspects of the present disclosure, the base graph can be designed by a process of successive optimization to ensure that the base graphs for all supported shortenings yield good performance. An exemplary technique for designing an optimized base graph 1700 is discussed with respect to FIG. 17. To obtain the optimized base graph 1700, a base graph with $k_{b,min}$ information bit columns 1706 (for both the core and the extended base graph), including the state nodes 1702 and core 1704, may be optimized. The total number of parity bits is equal to $c_{b,max}-c_{b,min}$ and may be obtained by puncturing degree two parity bit columns in the core graph so that the base graph yields the desired highest possible coding rate. Once the base graph with $k_{b,min}$ information bit columns is obtained, a column 1710 to optimize the base graph for performance over $k_{b,min+1}$ information bit columns. Adding of bit columns 1710 to the base graph is repeated in an iterative process until an optimized base graph on $k_{b,max}$ information bit columns 1708 is obtained.

The maximum rate and the minimum rate that can support all blocklengths in the range of blocklength ($k_{b,min}$ to $k_{b,max}$) are given by $r_{max}=k_{b,min}/(k_{b,min}-p_b+c_{b,min})$ and $r_{min}=k_{b,max}/(k_{b,max}-p_b+c_{b,max})$, where $p_b$ denotes the number of punctured information columns. In general, $c_{b,min}$ can be less than the number of parity bits in the core, because the design can support puncturing of core parity bits. $c_{b,core}$ can be used to denote the number of parity bits in the core. The code rate of the core can be given by $r_{core}=k_{b,min}/(k_{b,min}-p_b+c_{b,core})$ as the highest rate which can be supported by all $k_{b,min} \leq k_b \leq k_{b,max}$ without puncturing core bits. In principle, one can always take $k_{b,min}$ to be very small, but then the performance of the code at the highest rate $r_{max}$ might degrade. $k_{b,min}$ should be large enough to provide desirable performance at the highest rate.

The technique of nested base graph construction described above ensures that for any $k_{b,min} \cdot Z_1 \leq K \leq k_{b,max} \cdot Z_m$ and any N such that $r_{min} \leq K/N \leq r_{max}$, a code from the base graph that has a desirable performance can be obtained. For any pair of lifts $Z_1$ and $Z_{i+1}$, $k_{b,min} \cdot Z_{i+1} \leq k_{b,max} \cdot Z_i$ by construction. Thus, as long as the desired information blocklength size K is in the range, $k_b \cdot Z_1 \leq K \leq k_{b,max} \cdot Z_m$, then there exists a $k_b$ in $k_{b,min} \leq k_b \leq k_{b,max}$ and a $Z_1$ in $Z_1 \leq Z_i \leq Z_m$ such that $k_b \cdot Z_j \leq K \leq (k_b+1) \cdot Z_i$. Thus, a desired information blocklength $\tilde{K}$ may be obtained by using the base graph with $k_b$ information bit columns followed by shortening of at most $Z_i$ information bits. The parity bits may then be obtained by puncturing of at most $Z_i$ parity-bits from the end. An exception to this might occur in the case where the number of base parity bits is fewer than the number of base core parity bits. In this case is may be desirable to keep all core parity bits in the description of the code and puncture as needed to achieve the desired code rate. Since the base graph was constructed using the nested procedure described above, the shortening and puncturing by at most $Z_i$ may still have desirable performance.

The above optimized base graph structure, which can support rates in the range [$r_{min}$, $r_{max}$] and blocklengths in the range $k_{b,min} \cdot Z_i \leq K \leq k_{b,max} \cdot Z_m$, may be referred to as a family. Typically, the set of lifts in the family is a tower of clustered liftings, as previously described.

Thus, to construct a code of a desired blocklength N (K information bits), the $Z_i$ can be selected that satisfies $k_{b,min} \leq K/Z_i \leq k_{b,max}$, which is always possible because $\gamma \geq k_{b,max}/k_{b,min}$. The base graph can be set to $k_b = K/Z_i$. In general, $k_b \cdot Z_i \leq K \leq (k_b+1) Z_i$, so at most one column may be shortened. Parity bits N−K in the range [$c_{b,min} \cdot Z_i$: $c_{b,max} \cdot Z_i$] can be added to the base graph.

In an example, a base graph may have information bit columns with [$k_{b,min}$:$k_{b,max}$]=[24:30] with two punctured bits, $p_b$=2, and parity bit columns for each $k_b$ with [$c_{b,min}$: $c_{b,max}$][5:152] and $c_{b,core}$=7. The core 1800 of the PCM for this example base graph is illustrated in FIG. 18.

Figure 18A:
FIG. 18A is a table illustrating a core part of the PCM for the optimized base graph of FIG. 17, used to get the table illustrated in FIG. 18, in accordance with certain aspects of the present disclosure.

FIG. 18 is a table illustrating degree three checks and puncturing for a high rate code, in accordance with certain aspects of the present disclosure. FIG. 18A is a table illustrating the core part of the PCM for the optimized base graph of FIG. 17, used to get the table illustrated in FIG. 18, in accordance with certain aspects of the present disclosure.

The maximum rate and the minimum rate for which all blocklengths in range are supported is $r_{max}$=8/9=24/27 (if two additional core parity bits are punctured) and $r_{min}$=1/6. For lifting sizes (e.g., a set of clustered liftings as described in the sections above) given by Z={4,5,6,7} with $2 \leq j \leq 7$, $Z_1$, $Z_2$, ..., $Z_{max}$=8, 10, 12, 14, 16, 20, 24, 28, 32, ..., 512, 640, 768, 896. If one defines $\gamma=\max_i[Z_{i+1}/Z_i]$=5/4, then it follows that $k_{b,max}/k_{b,min} \geq \gamma$. Therefore, this family of base graphs can generate codes that support all (K, N) where $192 \leq K \leq 26,880$ and $1/6 \leq K/N \leq 8/9$. Thus, one family of codes that supports all rates from 8/9 to 1/6 and all blocklengths from a minimum of 192 to a maximum of 26,880 with desirable performance for any rate and blocklength pair is provided.

Example Compactly Described Family of LDPC Codes Using Regular Check Degrees

Techniques for compactly representing large collections of liftings in lifted LDPC codes and shortening of base graphs with a set of lifting values to provide fine granularity in blocklength are described above.

Techniques are provided herein for designing the base graphs for performance across the shortened sequence. Aspects of the present disclosure describe properties and structure for the base graph of a family that provides for high performance in base graphs that use shortening. For example, aspects of the present disclosure describes examples of how the shortened information nodes may be connected in the base graph.

Density evolution analysis (which reveals asymptotic performance of an LDPC structure) indicates that desirable performance can be achieved when the submatrix of the degree 3 portion of the core is row regular. Row regular means that the number of edges in each row is the same. Precise row regularity is not always achievable, because the number of edges may not be a factor of the number of rows. However, it is always possible to ensure that the row degrees differ by at most one. In view of this, it is desirable that the degree 3 portion of the core be nearly row regular for all submatrices induced by the shortening. The submatrix with $k_{b,min}$ information columns may have the property that the degree 3 portion of the core is nearly row regular. More generally, the submatrices with information columns $k_{b,min}+i$ for $i=0, 1, \ldots, k_{b,max}-k_{b,min}$ can be row regular (or mostly row regular). This may provide desirable performance of shortened base graphs.

In some cases, it may be desirable for general performance or error floor reasons to have some check irregularity in the degree 3 portion of the core. For example, it may be desirable to have one or more of the check nodes connected to a single punctured variable node to have a maximal number of degree 3 core edges. In the irregular case, the additional core degree 3 nodes in the nesting sequence may have their edges placed so as to preserve the desired irregularity. This can generally be achieved by having the additional degree 3 nodes connected as in the regular case, i.e., so that differences in the degrees present in the first member of the nested sequence are preserved across the sequence. This can be achieved by connecting the additional degree 3 nodes in a way that is consistent with the regular case for some starting values.

FIGS. 19-21A show example code families, in accordance with certain aspects of the present disclosure. The example code families are based on the example tower of clustered liftings given by $Z=2^j\{4,5,6,7\}$ where the maximum of $Z_{i+1}/Z_i$ is $5/4=1.25$. The examples code families in FIGS. 19, 20, and 21, use a PCM with $(k_{b,min}, k_{b,max})=(24,30)$, $(16,20)$, and $(8,10)$, respectively.

This example code family illustrated in FIG. 19 has $(k_{b,min}, k_{b,max})=(24,30)$. The bottom row in the graph 1900 is for the parity bit of the punctured nodes and is not a part of the degree 3 submatrix that is desired to be row regular. The relevant submatrix for the example code family, shown in the table 1900A in FIG. 19A, consists of the first six rows and columns 3 through 30 from the graph 1900. If the code family is shortened to $k_b=24$, columns 30 through 25 are removed successively. As seen in the table 1900A, each row in the submatrix has entries that differ by at most one, so near regularity is achieved for all shortened base graphs.

FIG. 20 is graph 2000 showing the core of the another example code family. This code family has $(k_{b,min}, k_{b,max})=(16,20)$ and the relevant rows are the first eight rows. The corresponding shortened table of degrees is shown in FIG. 20A. As shown in table 2000A, near row regularity is maintained.

FIG. 21 shows the core of yet another example code family. This code family has $(k_{b,min}, k_{b,max})=(8,10)$. In this case, the code family includes three HARQ extension bits. The first ten rows are the rows in which near row regularity of the degree portion (columns 3 through 10) is desired. The corresponding table of row degrees is as shown in FIG. 21A. As shown in table 2100A, near row regularity is maintained.

In the base PCM, there may be two punctured nodes. The core encoding parity check nodes, for example, all core check nodes except the one connected to the two punctured nodes and a degree 1 variable node (e.g., also referred to as a parity bit), have either one edge connected to the high degree punctured nodes or two such edges. Best performance may be achieved when the number of core degree 3 edges from the checks with a single edge connected to the high degree punctured variable nodes is generally higher than the number of core degree three edges from the checks with two edges connected to the high degree punctured variable nodes. This may be the case for all base matrices in a set of nested base matrices.

The connectivity of the set of nested base matrices should be such that, for each base matrix in the nested sequence, the maximal number of degree three core edges from any core check node is found on a core check node with a single edge to the punctured variable nodes. The average degree 3 core for a set of check nodes can be defined as the average of their degree 3 core degrees. Another way of characterizing the preferred irregularity indicated by density evolution is that the average 3 three core degree of the check nodes with single edges to the high degree punctured nodes should be higher than the average degree 3 core degree of the check nodes with two edges to the high degree punctured nodes.

Figure 22A:
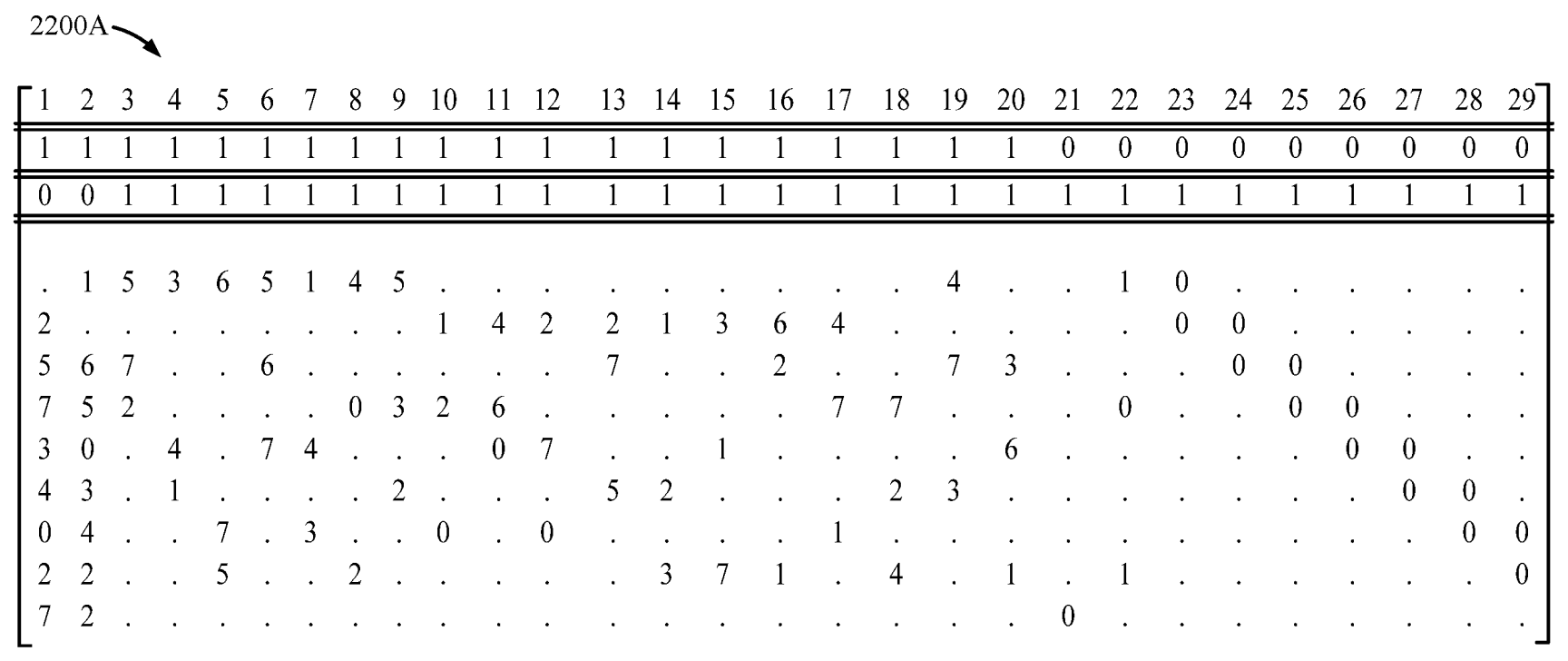
Figure 23A:
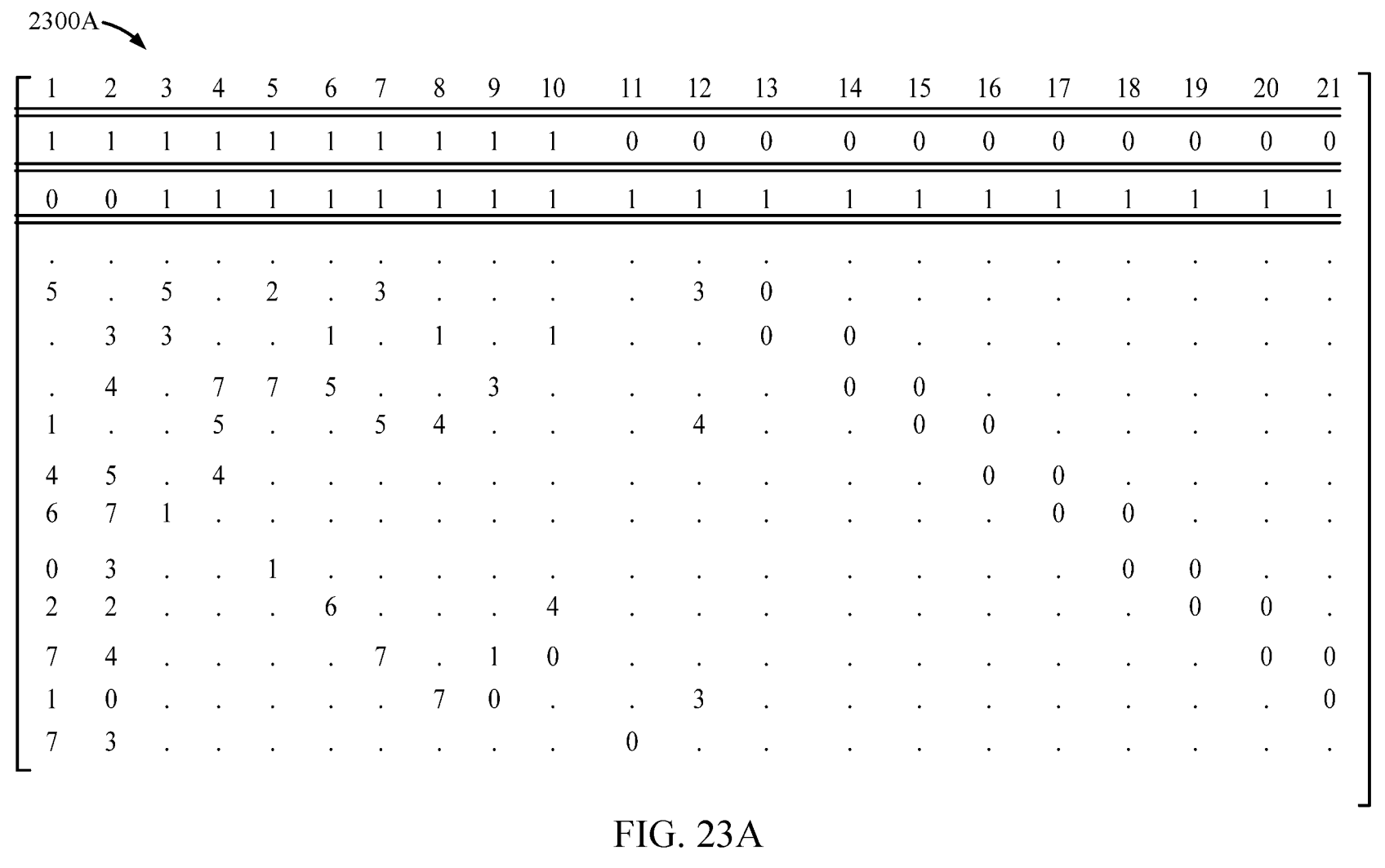

Tables 1800, 2200, and 2300, illustrated in FIGS. 18, 22, and 23, respectively, illustrate examples for the high rate case, medium rate case, and low rate case, respectively. FIGS. 18A, 22A, and 23A are graphs 1800A, 2200A, and 2300A, respectively, illustrating the core part of the PCM, having a lifting size value of 8, corresponding to the tables 1800, 2200, and 2300, respectively.

Example LDPC Code Family Selection for Encoding Based on Desired Transmission Rate As described in the sections above, fine granularity of blocklengths can be achieved by shortening of lifted parity check matrices (PCM) (also referred to as the base graph or base matrix). A higher-rate base graph can be extended to a lower rate by adding hybrid automatic repeat request (HARQ) extension bits (e.g., IR-HARQ extension) to the base graph. Performance can be achieved at all levels of HARQ extension. It is therefore possible to design LDPC codes covering many code rates and blocklengths by starting with a single high-rate base matrix and adding a large HARQ extension. LDPC codes generated from a base graph structure, including the HARQ extension, that can support code rates in the range $[r_{min}, r_{max}]$ and blocklengths in the range $k_{b,min} \cdot Z_1 \leq K \leq k_{b,max} \cdot Z_m$ may be referred to as a family of codes. The set of liftings in the code family may be a tower of clustered liftings, as described above.

It may be desirable to use more than one family of LDPC codes for encoding information to be transmitted. Optimized HARQ extensions of the base PCM may be of higher degree than the core PCM. Therefore, lower rate codes formed from higher rate codes with HARQ extensions may be more complex than core designs for those lower rates. In order to avoid double edges in the base graph, it may be undesirable for base graphs for high rate codes to have few variable nodes, since the number of check nodes is not few. For few variable nodes at high rates, the number of check nodes is few. To achieve a low code rate, a relatively large number of extension bits may be required, which may be undesirable from an implementation standpoint where higher parallelism (i.e., larger Z) and a smaller base graph may be preferable.

Accordingly, techniques for using more than one family of LDPC codes are desirable.

Techniques are provided herein for selecting a family of LDPC codes to use for encoding information to be transmitted based on a desired rate for the transmission.

Figure 24:
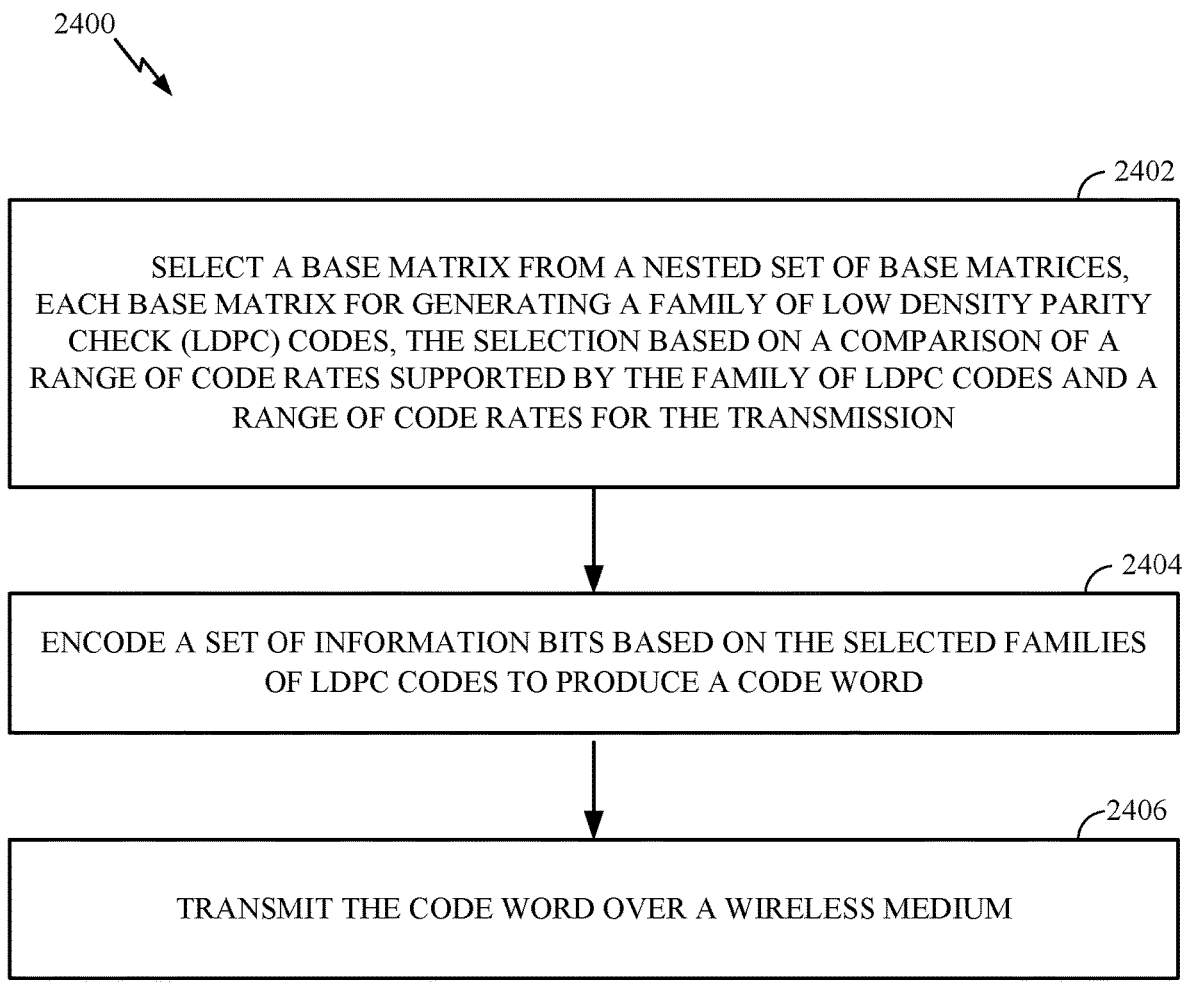
FIG. 24 is a flow diagram illustrating example operations for selecting a family of LDPC codes to use for encoding information by a transmitting device, in accordance with certain aspects of the present disclosure.

FIG. 24 is a flow diagram illustrating example operations 2400 for selecting a family of LDPC codes to use for encoding information, in accordance with certain aspects of the present disclosure. Operations 2400 may be performed by a transmitting device (e.g., BS 110 or a UE 120). A transmission can be transmitted using a set of ranges of code rates (e.g., code rate regions) for the transmission. At 2402, the transmitting device selects a base matrix from a nested set of base matrices, each base matrix for generating a family of low density parity check (LDPC) codes, the selection based on a comparison of a range of code rates supported by the family of LDPC codes and a range of code rates for the transmission. The base matrices may correspond to different first transmission rates and have an approximately equal number of base variables at full HARQ extension or achieve approximately equal lowest code rates. Different base matrices can be selected for different ranges of code rates for the transmission. The base matrices may be core base matrices corresponding to a highest code rate in the family of the code rates. Each family of LDPC codes may be associated with a set of lifting values k used to generate members of the family from a base matrix. A base matrix associated with a family of LDPC codes that supports a range of codes having a lowest maximum code rate in the range of code rates that is greater than a maximum code rate of the range of code rates for the transmission may be selected. At 2404, the transmitting device encodes a set of information bits based on the selected families of LDPC codes to produce a code word. For example, the selected base matrix can be used to generate members of the family of LDPC codes having code rates corresponding to the range of code rates. At 2406, the transmitting device transmits the code word over a wireless medium.

According to certain aspects, a collection of families may be used for encoding. As described in the section above, each family may include a tower of clustered liftings and base graph designs that support shortening.

According to certain aspects, a set of base graphs (corresponding to the collection of families) can be used. The cores of the different base graphs may have different starting rates. As described above, a family includes a base graph having a minimum of $k_{b,min}$ information columns and a maximum of $k_{b,max}$ information columns and its extension for HARQ. The core refers to the highest-rate graph in that code family.

Referring back to the three example base graphs 1800, 2200, and 2300 for the three example code families described in the preceding section, these three base graphs have near regularity in check node degrees with information bit shortening. In these example code families, the cores have a number of parity checks equal to 7, 9, and 11, respectively, and $k_{b,min}$ ($k_{b,max}$) values of 24 (30), 16 (20), and 8 (10), respectively. Each base graph has two high-degree punctured nodes. Thus, the starting rates for the three code families are 24/29 (($k_{b,min}$=24)/(24 information bits+7 parity bits-2 punctured bits=29), 16/23 (($k_{b,min}$=16)/(16 information bits+9 parity bits-2 punctured bits=23), and 8/19 (($k_{b,min}$=8)/(8 information bits+11 parity bits-2 punctured bits=19), respectively. Higher code rates can be achieved by puncturing core variable bits. For example, a code rate 8/9 can be achieved with the first example code family by puncturing two base degree 2 variable nodes, to achieve a 24/27 code rate (i.e., 8/9 code rate) from the 24/29 code rate.

As described in the sections above, the core rate is defined as the highest rate which can be supported by all $k_{b,min} \leq k_b \leq k_{b,max}$ and is given by $r_{max}=k_{b,min}/(k_{b,min}-p_b+c_{b,min})$. Each of the base graphs can be extended with HARQ extension parity bits. For example, the three example base graphs, mentioned in the paragraph above, can be extended to 122 variable columns. In this case, the example code family shown in FIG. 18 may support the highest code rates in the range [1/4, 8/9], the example code family shown in FIG. 22 may support the second highest code rates in the range [1/6, 16/23], and the example code family shown in FIG. 23 may support the lowest code rates in the range [1/12, 8/19]. These rate regions overlap so that for some blocklengths and code rates, there will be multiple solutions. Sometimes even a single code family may have multiple solutions.

Since lower rate cores may have better performance than the corresponding code in a higher core rate code family, it may be desirable to use the lowest rate code family for code rates starting below the core code rate of that code family. Even if the performance is not better for the lower rate core, since the number of base variable node is smaller, the lifting size Z will be larger for a given block size. Thus, more parallelism is available for the lower rate core. In addition, complexity, as measured by edge density in the Tanner graph, may be lower for the lower rate core.

Figure 25:
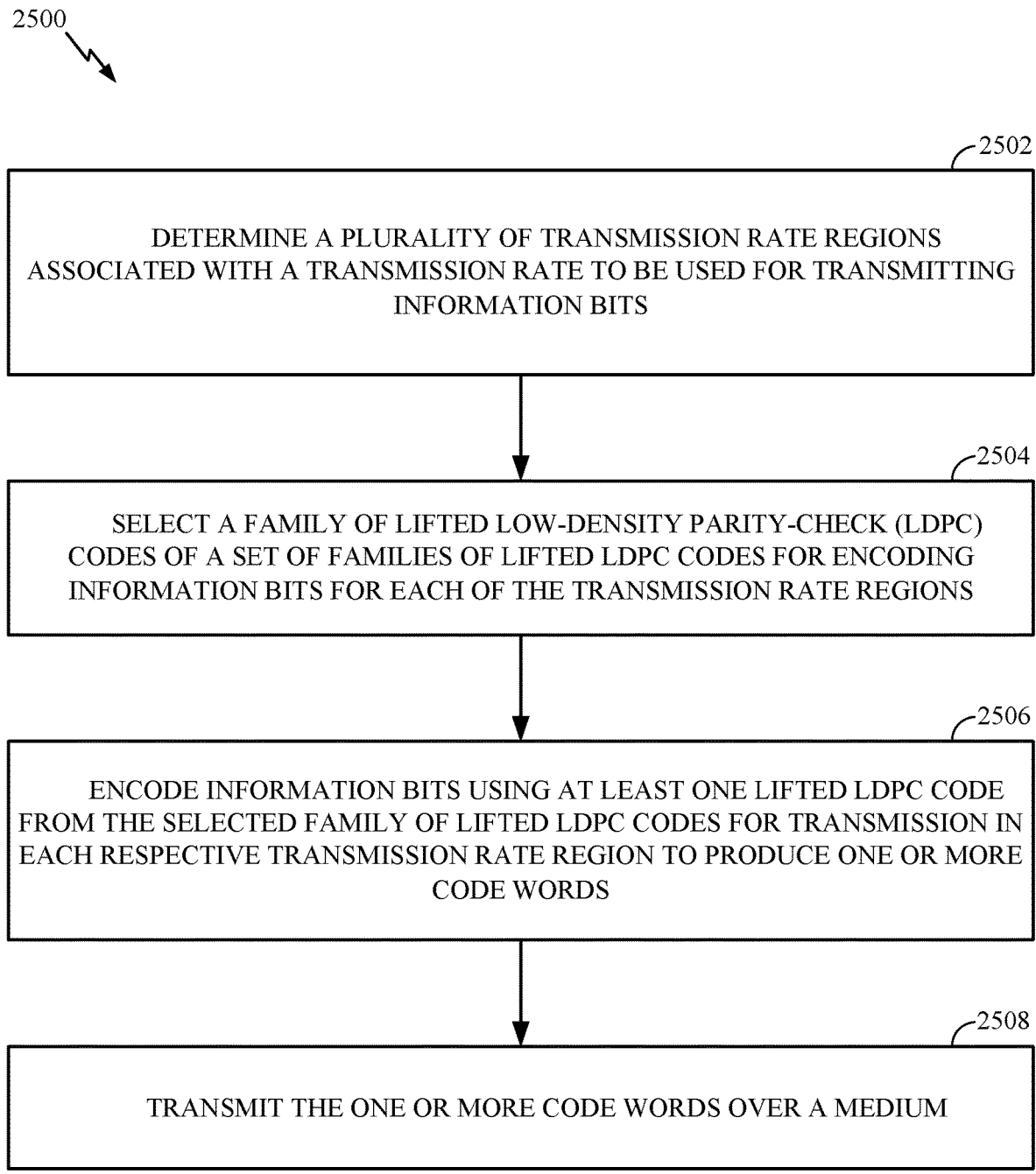
FIG. 25 is a flow diagram illustrating example operations for wireless communications by a transmitting device, in accordance with certain aspects of the present disclosure.

FIG. 25 is a flow diagram illustrating example operations 2500 for wireless communications, in accordance with certain aspects of the present disclosure. Operations 2500 may be performed by a transmitting device (e.g., BS 110 or a UE 120). At 2502, the transmitting device determines a plurality of transmission rate regions associated with a transmission rate to be used for transmitting information bits. At 2504, the transmitting device selects a family of lifted LDPC codes of a set of families of LDPC codes for encoding information bits for transmission in each of the transmission rate regions. At 2506, the transmitting device encodes the information bits using at least one lifted LDPC code from the selected family of lifted LDPC codes t for transmission in each respective transmission rate region to produce one or more code words. At 2508, the transmitting device transmits the one or more code words over a (e.g., wireless) medium.

According to certain aspects, the desired transmission rate range (e.g., for first transmission) can be divided into multiple parts or rate ranges. For example, a desired rate range of [1/12, 8/9] can be divided into the following four parts or ranges: [1/12, 1/5]; [1/5, 2/5]; [2/5, 2/3]; [2/3, 8/9]. For the part of the desired transmission rate range corresponding to the largest rates, in this example, [2/3, 8/9], the extended graph of the highest rate code family, in this example the first code family supporting the range [1/4, 8/9], can be selected to obtain codes for all first transmission rates in the range [2/3, 8/9]. For the example desired transmission range [2/5, 2/3], the second example code family corresponding to the second largest rates, in this example, [1/6, 16/23], can be selected to obtain the codes. If the first transmission rate is below rate 2/5 then the lowest core rate code family would be used. Thus, for the example desired transmission ranges [1/12, 1/5] and [1/5, 2/5], the third example code family corresponding to the lowest rates, in this example, [1/12, 8/19], can be selected to obtain the codes.

Example Selection of LDPC Code from a Family of LDPC Codes for a Desired Transmission Rate As described in the sections above, a coding scheme can be used that uses two or more LDPC families (i.e., multiple lifted base graphs with shortening and puncturing), where different LDPC families can be used for encoding information to be transmitted depending on the desired (starting) transmission rate (and other factors).

For a desired K (number of information bits) and N (number of code bit columns), there may be multiple solutions by varying the number of base graph columns used, the value of the lifting, and the number of shortened/punctured bits. As described in the section above, for a given K, N, a family of LDPC codes may be selected that has a minimum and maximum number of information columns denoted by $k_{b,min}$ and $k_{b,max}$. The supported lift sizes form a tower given by $\{Z_1, Z_2, \ldots, Z_m\}$. Thus, for a desired K, N there could be multiple ways to construct the code by choosing $k_{b,min} \leq K \leq k_{b,max}$ and using shortening.

Accordingly, techniques for selecting a particular code from within a family of codes for encoding information for a desired transmission rate are desirable.

According to certain aspects, among the possible solution, the LDPC that uses minimum base information columns may be selected. In other words, the LDPC code that uses the largest lift size in the selected family of liftings may be selected. This may allow a higher parallelism for the desired K, N, resulting in larger throughputs. Alternatively, the performance of the multiple codes may be predetermined (known), and the code with the best performance can be selected for use.

Example Encoding Structure for Compactly Described LDPC Codes for Low Error-Floor Using Different Cyclic Permutations on the Degree 3 Parity Bit in the Accumulate Chain As described above, quasi-cyclic lifted LDPC code can be constructed by lifting a base graph detailing the macro structure of the code (i.e., the number of variable nodes and check nodes in the base graph and their connections) to obtain the final graph or final PCM. The base graph can be lifted by copying the base graph Z times (i.e., the lifting sizes and interconnecting the copies by a random permutation. The permutations used are from the cyclic group of integers modulo the lift values.

LDPC code words may be considered a subgroup of the algebra of polynomials modulo $x^z-1$. The encoding problem may reduce to solving a linear system:

$$D(x)=M(x)C(x),$$

where M(x) is the square m×m submatrix of the m×n PCM (H), C(x) is the part of the code word corresponding to the parity bits, and D(x) is the syndrome obtained using the systematic bits. For example, in 802.11n, there is an accumulate chain of degree 2 parity bits terminated using a degree 3 parity bit. This is represented by the polynomial matrix shown below.

$$M(x) = \begin{bmatrix} x & 1 & 0 & 0 & 0 & 0 \\ 0 & 1 & 1 & 0 & 0 & 0 \\ 0 & 0 & 1 & 1 & 0 & 0 \\ 1 & 0 & 0 & 1 & 1 & 0 \\ 0 & 0 & 0 & 0 & 1 & 1 \\ x & 0 & 0 & 0 & 0 & 1 \end{bmatrix}$$

For the entries in M(x), an all zero matrix is represented by a 0, an identity matrix is represented by a 1, and x represents the identity matrix cyclically shifted by x.

Encoding can be performed by multiplying M(x) with the vector [1 1 1 1 1 1] to obtain $C_1(x)=[1\ 1\ 1\ 1\ 1\ 1]\ D(x)$. The first parity may then be solved for, followed by the rest of the parities using back substitution. An equivalent structure may be obtained by replacing the x,1,x sequence in the first column with any sequence xa, xb, xa as long as |a−b|=1. This equivalence may be exploited to obtain a transition from this encoding scheme to the one outlined above that is consistent with earlier described nested representations of towers of clustered liftings.

The above encoding structure creates loops of degree 2 and size m with one degree 3 check node. In some cases, this encoding structure leads to high error-floors. Hence, it is desirable to modify this structure so that deeper error floors may be achieved. In the case of LDPC families, such as described above, it may not be straightforward to provide a solution that supports the optimization of multiple liftings. Thus, aspects of the present disclosure provide techniques that allow for optimization of multiple lifting simultaneously. This may involve introducing a different permutation on the edges of a degree 3 parity-bit in the encoding matrix.

Small loops in the lifted encoding structure may be avoided using an encoding submatrix in the form:

$$M(x) = \begin{bmatrix} x^{Z/4} & 1 & 0 & 0 & 0 & 0 \\ 0 & 1 & 1 & 0 & 0 & 0 \\ 0 & 0 & 1 & 1 & 0 & 0 \\ x & 0 & 0 & 1 & 1 & 0 \\ 0 & 0 & 0 & 0 & 1 & 1 \\ 1 & 0 & 0 & 0 & 0 & 1 \end{bmatrix}$$

This structure, instead of having Z loops of size 6, has Z/4 loops of size 4*6=24.

If, M(x) is multiplied with the vector [1 1 1 1 1 1], the encoding equation $Q(x)\ C_i(x)=[1\ 1\ 1\ 1\ 1\ 1]D(x)$ is obtained, where $Q(x)=1+x+x^{z/4}$. As can be seen, in order to solve for $C_i(x)$, Q(x) needs to be inverted. A general property of binary polynomials P(x) is that $(P(x))^2=P(x^2)$. Thus, $Q(x^4)=x^4=Q(x^2)Q(x)Q(x)$, and the inverse of Q(x) is given by $x^{Z-4} Q(x^2)Q(x)$. Unfortunately, this approach cannot be used directly for multiple liftings since the exponent of $x^{Z/4}$ depends on Z. The challenge is to find a similar solution that works for multiple Z.

To mimic the above construction, a solution may take the form of a polynomial $Q(x)=1+x^a+x^b$, where it may be assumed that b>a, so that for some power of 2, given by h, Q(x) is a monomial modulo $x^z+1$ for several Z. In a particular case, aspects of the present disclosure may focus on a particular tower of clustered values, an example of which has been described above, given by $2^j\{4,5,6,7\}$.

To reduce $Q(x^h)=1+x^{ha}+x^{hb}$ to a monomial modulo $x^z+1$, Z must be a factor of either 'ha', 'hb', or 'hb−ha'. These three terms must have a factor of 3, a factor of 5, and a factor of 7. Since 'h' is a power of 2, these primes are factors of 'a', 'b', or 'b−a'. 'a' and 'b' may be less than $2^j4$. Since, in a particular scheme, all of the graphs may be optimized using liftings less than $2^j4$, it is helpful in the optimization if the encoding matrix also satisfies this condition. In some cases, a desirable solution may be found when j is at least 2. For example, one solution is a=5, b=12, since 12 has 3 as a factor and b−a=7. Then for h=4, $Q(x^4)=1+x^{20}+x^{48}$ which is monomial modulo $x^z+1$ for Z in {16,20,24,28}.

Because 12 is a factor of 4, h=4 covers the case Z=16. An essentially equivalent solution is a=7 and b=12. Another solution of h=4 is (a,b)=(7,15). It can be verified that these are the only solutions for h=4. When h=8, other solutions arise such as (a,b)=(9,14) and (a,b)=(7,10) and (a,b)=(7,15).

According to certain aspects, for some choices of Z, a smaller 'h' may suffice. For example, when (a,b)=(7,15), h=2 may be acceptable when Z=16. Additionally, it should be noted that if $x^0+x^a+x^b$ is a solution, then so is $x^1+x^{a+1}+x^{b+1}$ for any 1 provided b+1<16. In general, the idea is to use a polynomial $x^1(1+x^a+x^b)$ where, for 'h' being some power of 2, at least one of ha, hb, or hb−ha has Z as a factor for Z in {16,20,24,28} and 'b' less than 16.

Given a solution (a,b) for Z in {16,20,24,28} with a given 'h', it is also a solution for Z in $2^j\{16,20,24,28\}$ with $2^jh$. More generally, for k, at most j, $(2^ka, 2^kb)$ is a solution with $2^{j-k}h$. A convenient solution for the family Z={4,5,6,7} for $j>1$ is $(2^{j-2} a, 2^{j-2} b)$ where $(a,b)$ is a solution for the case $j=2$. For example, choosing $(a,b)=(5,12)$ a solution so that $Q(x^4)$ is monomial for all $Z$ in the tower may be obtained.

With the above choice the encoding matrix for the set of $Z$ given by $\{16,20,24,28\}$ is:

$$M(x) = \begin{bmatrix} x^5 & 1 & 0 & 0 & 0 & 0 \\ 0 & 1 & 1 & 0 & 0 & 0 \\ 0 & 0 & 1 & 1 & 0 & 0 \\ 1 & 0 & 0 & 1 & 1 & 0 \\ 0 & 0 & 0 & 0 & 1 & 1 \\ x^{12} & 0 & 0 & 0 & 0 & 1 \end{bmatrix}$$

and for $j=3$, $\{32,40,48,56\}$:

$$M(x) = \begin{bmatrix} x^{10} & 1 & 0 & 0 & 0 & 0 \\ 0 & 1 & 1 & 0 & 0 & 0 \\ 0 & 0 & 1 & 1 & 0 & 0 \\ 1 & 0 & 0 & 1 & 1 & 0 \\ 0 & 0 & 0 & 0 & 1 & 1 \\ x^{24} & 0 & 0 & 0 & 0 & 1 \end{bmatrix}$$

Multiplying by 2 is consistent with the nested representation of the tower of clustered liftings described earlier. Accordingly, following the encoding procedure described above may allow for optimization of multiple liftings simultaneously.

In general for $j>1$ and $h=2^{j-2}$, the non-zero terms in the first column for the corresponding solution for the jth cluster are $1=x^0, x^{5h}$, and $x^{12h}$. This solution is consistent with the previously mentioned nested strategy. The solution may not, however, extend to the case $j=1$ thus the solution does not extend to the full tower of clusters in a way that is consistent with the compressed representation of the lifting values associated to the tower of clustered lifting sizes.

The above change in the encoding structure is intended to lower error floor effects and is most valuable for the larger lifting sizes in the cluster. For smaller lifting values, the 802.11 encoding structure has been found to be adequate. Thus it would be advantageous to have a solution that uses the 802.11 encoding structure for $j=1$ that transitions to the above solution for $j>1$ in a way that is consistent with the nested representation of the tower of lifting sizes. Such a solution is possible if the order of the terms in the first column is set appropriately and an encoding structure that is equivalent, but not equal to the 802.11 encoding structure, is used for $j=1$. In the case of compressed liftings with 2 independent bits per cluster a solution is as follows. First, for $j=2$ the terms $x^0$, $x^5$, and $x^{12}$ should be put in a different order with $x^{12}$ occupying the middle position. In a 4-bit binary representation the sequence 0, 12, 5 is 0000, 1100, 0101, so a $j=1$ solution, to be consistent with the nested lifting strategy with two independent bits per cluster, should take the form 0xx, 1xx, 0xx where x indicates an arbitrary bit.

A solution equivalent (up to relabeling of lifted nodes) to the 802.11 encoding scheme is any sequence of the form a, b, a where $|b-a|=1$. One equivalent solution under the above constraint in 3-bit binary representation is 011, 100, 011, which as an integer sequence is 3, 4, 3. Thus the solution for $j=1$ takes the form $$M(x) = \begin{bmatrix} x^3 & 1 & 0 & 0 & 0 & 0 \\ 0 & 1 & 1 & 0 & 0 & 0 \\ 0 & 0 & 1 & 1 & 0 & 0 \\ x^4 & 0 & 0 & 1 & 1 & 0 \\ 0 & 0 & 0 & 0 & 1 & 1 \\ x^3 & 0 & 0 & 0 & 0 & 1 \end{bmatrix}$$

And for $j>1$ the solution is:

$$M(x) = \begin{bmatrix} x^{5h} & 1 & 0 & 0 & 0 & 0 \\ 0 & 1 & 1 & 0 & 0 & 0 \\ 0 & 0 & 1 & 1 & 0 & 0 \\ x^{12h} & 0 & 0 & 1 & 1 & 0 \\ 0 & 0 & 0 & 0 & 1 & 1 \\ x^0 & 0 & 0 & 0 & 0 & 1 \end{bmatrix}$$

where $h=2^{j-2}$. This solution is consistent with the nested representation of the tower of clustered lifting values.

Example Encoding Structure for Compactly Described LDPC Codes for Low Error-Floors Using Degree 3 Parity Bits As previously noted, different cyclic permutations (i.e., different lifting values k) on the degree 3 parity bit in the accumulate chain may be used to obtain deep error-floors. In some cases, it may be desirable to achieve even deeper error-floor behavior than attainable with an accumulate chain. For example, the accumulate chain can be shortened by promoting one or more of the variable nodes in the accumulate chain to a degree-3 node by adding an additional edge to the variable node. The additional edge may be added in a way that facilitates simple encoding.

As described above, one way to reduce the effect of loops on decoding performance is to add an extra edge in the encoding structure by converting one of the degree 2 parity bits to a degree 3 parity bit. The degree 2 loops may converge faster to the correct values and, hence, eliminate the error-floor. It may be desirable to ensure ease of encoding (e.g., simple, less complex, implementations) for the $M(x)$ submatrix of the PCM.

Aspects of the present disclosure provide $M(x)$ submatrix design that provides ease of encoding. The $M(x)$ submatrix may have the form:

$$M(x) = \begin{bmatrix} x^a & 1 & 0 & 0 & 0 & 0 \\ 0 & 1 & 1 & x^{\frac{Z}{4}} & 0 & 0 \\ 0 & 0 & 1 & 1 & 0 & 0 \\ 1 & 0 & 0 & 1 & 1 & 0 \\ 0 & 0 & 0 & 0 & 1 & 1 \\ x^b & 0 & 0 & 0 & 0 & 1 \end{bmatrix}$$

$M(x)$ may be multiplied by the vector $[1, 1, 1, 1+x^{Z/4}, 1+x^{Z/4}, 1+x^{Z/4}]$ to obtain $Q(x)C(x)$, where $Q(x)=x^a+(1+x^{Z/4})(1+x^b)$. $Q(x^4)=x^{4a}$; thus, multiplying $Q(x)$ with $Q(x^2)Q(x)$ $Q(x^2)$ $(Q(x))^2$ $Q(x^4)=x^{4a}$ (e.g., by leveraging the characteristic 2 of the ground field). Thus, $Q(x)$ may be inverted efficiently.

However, these techniques may not be straight forward when multiple (e.g., a tower) of clustered liftings is used.

Accordingly, aspects of the present disclosure provide techniques for extending the construction (i.e., adding an additional edge in the base graph) for application to a tower of clustered liftings. For example, a corresponding solution for a tower of clustered liftings is provided (e.g., which is not dependent on the lifting size Z).

An example tower of clustered liftings, as described above, is given by $2^j\{4,5,6,7\}$. An example submatrix M(x) may have the following form:

$$M(x) = \begin{bmatrix} x^a & 1 & 0 & 0 & 0 & 0 \\ 0 & 1 & 1 & x^c & 0 & 0 \\ 0 & 0 & 1 & 1 & 0 & 0 \\ 1 & 0 & 0 & 1 & 1 & 0 \\ 0 & 0 & 0 & 0 & 1 & 1 \\ x^b & 0 & 0 & 0 & 0 & 1 \end{bmatrix}$$

M(x) may be left-multiplied by the vector $[1, 1, 1, 1+x^c, 1+x^c, 1+x^c]$ to obtain Q(x)C(x), where $Q(x)=x^a+(1+x^c)(1+x^b)$. For an 'h' ofa power of 2, $Q(x^h)$ should be a monomial modulo $x^z+1$ for a lifting Z in the tower of clustered liftings $2^j\{4,5,6,7\}$. For example, for j=2 (i.e., Z={16,20,24,28}), $Q(x^h)$ reduces to a monomial only if $(1x^{hc})(1+x^{hh})$ reduced to 0 modulo $x^z+1$. Thus, the choice of 'a' (i.e., in $x^a$) is arbitrary. The reduction to a monomial occurs only if Z is a factor of hc or hb, or Z is a factor of hb–hc and also a factor of hb+hc.

Some of the solutions described above may be used for the case of multiple liftings. To determine whether a solution is appropriate, the solution may be checked against the condition that Z is a factor of hb–hc and hb+hc. For example, the solution (5,12) does not carry over because, although 12–5 is a factor of 7, which was used to cover the Z=28 case, 12+5 is not a factor of 7. The solution (7,15) does carry over because the difference 15–7=8 is used only to cover the Z=16 case. If (c,b)=(7,15), $Q(x)=x^{8a}+(1+x^{56})(1+x^{120})$, which is monomial modulo $x^z+1$ for all Z in j=2 (i.e., {Z=16,20,24,28}). The solution may be generalized for the tower of clustered Z as described above. For example, for the j=3 cluster (i.e., Z={32,40,48,56}), a factor of two in the degree of the indeterminate x may be introduced. Thus, the resulting submatrix encoding structure is:

$$M(x) = \begin{bmatrix} x^a & 1 & 0 & 0 & 0 & 0 \\ 0 & 1 & 1 & x^{2c} & 0 & 0 \\ 0 & 0 & 1 & 1 & 0 & 0 \\ 1 & 0 & 0 & 1 & 1 & 0 \\ 0 & 0 & 0 & 0 & 1 & 1 \\ x^{2b} & 0 & 0 & 0 & 0 & 1 \end{bmatrix}$$

For each successive j the tower of clustered liftings, the exponent of the intermediate x is increased by a factor of 2.

In another example. For j>1 encoding structure with the additional edge can be:

$$M(x) = \begin{bmatrix} x^a & 1 & 0 & 0 & 0 & 0 \\ 0 & 1 & 1 & x^{15h} & 0 & 0 \\ 0 & 0 & 1 & 1 & 0 & 0 \\ 1 & 0 & 0 & 1 & 1 & 0 \\ 0 & 0 & 0 & 0 & 1 & 1 \\ x^{7h} & 0 & 0 & 0 & 0 & 1 \end{bmatrix}$$

The value for "a" can be chosen consistent with the nested lifting value representation. For the j=1 cluster of liftings, the submatrix can be:

$$M(x) = \begin{bmatrix} x^3 & 1 & 0 & 0 & 0 & 0 \\ 0 & 1 & 1 & x^7 & 0 & 0 \\ 0 & 0 & 1 & 1 & 0 & 0 \\ 1 & 0 & 0 & 1 & 1 & 0 \\ 0 & 0 & 0 & 0 & 1 & 1 \\ x^3 & 0 & 0 & 0 & 0 & 1 \end{bmatrix}$$

This M(x) supports the encoding techniques described above. For example, M(x) can be left-multiplied by the vector $[1, 1, 1, 1+x^3, 1+x^3, 1+x^3]$ which results in 0 for all columns except the first column. This gives $Q(x)=x^3+(1+x^3)(1+x^7)=1+x^7+x^{10}$. $Q(x^4)$ is a monomial modulo $x^z-1$ for j=1 (i.e., Z={8,10,12,14}). As long as a<8 is chosen for the case j=2, this is consistent with the nested representation of liftings with two independent bits per cluster.

According to certain aspects, following the encoding technique described above by introducing an additional edge and raising the exponential power of the intermediate 'x' by two may provide a lower error-floor while maintaining ease of the encoding procedure.

Example High Rate Code Design

In order to achieve very high rate codes while keeping base graphs relatively small, and supporting HARQ extensions to lower rates, a highest transmission rate can be achieved by puncturing of some of the degree 2 nodes in the encoding structure. If the matrix below represents an 802.11n type encoding submatrix then the parity bits other than the first column are good candidates for puncturing.

$$M(x) = \begin{bmatrix} 1 & 1 & 0 & 0 & 0 & 0 \\ 0 & 1 & 1 & 0 & 0 & 0 \\ 0 & 0 & 1 & 1 & 0 & 0 \\ x & 0 & 0 & 1 & 1 & 0 \\ 0 & 0 & 0 & 0 & 1 & 1 \\ 1 & 0 & 0 & 0 & 0 & 1 \end{bmatrix}$$

Figure 26:
FIG. 26 is an example core lifted PCM with a lifting size value of 8, in accordance with certain aspects of the present disclosure.
Figure 27:
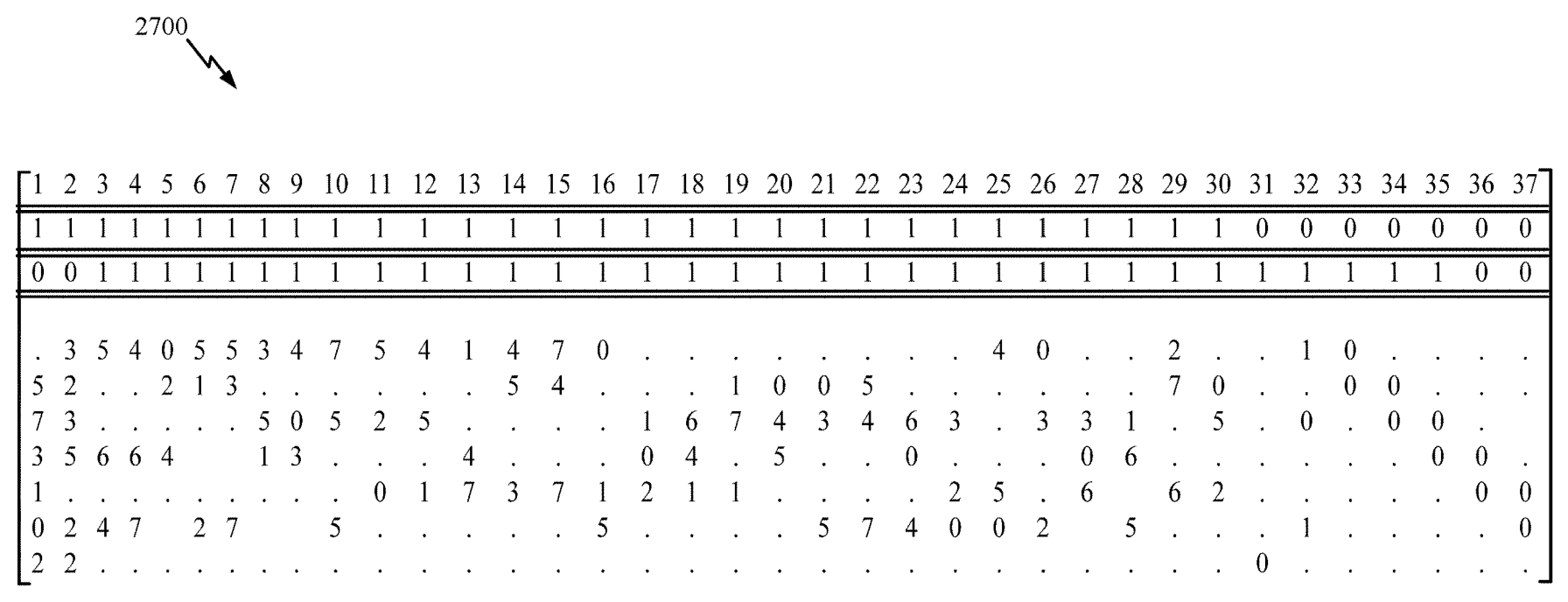

In an exemplary design, shown in FIGS. 26 and 27, a core code of rate 30/35 allows puncturing of the 2 rightmost parity bits in the encoding structure to achieve a rate of 30/33. The exemplary design is also a nested sequence of base graphs intended for a range of information columns from 24 to 30. For each of these base graphs one or two of the rightmost encoding parity bits may be punctured to achieve high rate codes.

FIG. 26 is an example core 2600 of a lifted PCM having a lifting size value of Z=8, in accordance with certain aspects of the present disclosure. In FIGS. 26 and 27, the first row provides the index for the columns, the second row indicates systematic bits (1) or parity bits (0), and the third row indicates transmitted bits (1) or punctured bits (0). As shown in FIG. 26, the first two columns are punctured variable nodes of degree 5 and 6 (not counting the parity bit edges). The first six parity checks (rows) (parity nodes) are the encoding rows. The first parity check has a single edge to the punctured variable nodes and all other parity checks have two edges to punctured variable nodes. The code corresponding to the lifted PCM illustrated in FIG. 26 is a rate 30/35 code.

FIG. 27 is an example of the core 2600 illustrated in FIG. 26 with a single edge removed, in accordance with certain aspects of the present disclosure. As shown in FIG. 27, a single edge has been removed, such that the punctured degrees are now 5 and 5 (e.g., rather than 5 and 6 as in FIG. 26). The fifth check node was chosen for the edge removal because it is the last two degree 2 variable nodes (i.e., the rightmost two columns) that get punctured, in right to left order, in order to achieve higher degree codes, as indicated in the third row above. The code corresponding to the core 2700 illustrated in FIG. 27 is a rate 30/33 code. Puncturing a degree 2 variable node effectively merges the neighboring parity checks. Thus, puncturing a degree 2 variable node effectively joins two parity checks to create a much higher degree single parity check.

For the highest rate exemplary design, which has six check nodes in the core (not counting the check for the parity of the punctured information variable nodes), the best asymptotic performance may be achieved with a punctured node of degree 6 (not counting the edge used to form a parity of the two punctured nodes), that connects to each base parity check, and one of degree 5 that connects to 5 core parity checks. The one parity check with a single edge connected to the degree 6 punctured node is the one that is relied on initiate correct decoding of the punctured nodes.

In the HARQ extensions, having two check nodes with only a single edge to the punctured nodes may be desirable for good performance in the smaller lifting graphs. Thus, the degree 6 punctured node may be reduced to a degree 5 punctured node to create one additional check node with only a single edge to the punctured nodes, as shown in FIG. 27. The impact in asymptotic performance for the non-punctured case was found to be quite small. However, if degree 2 parity bits are punctured, the loss may be much more severe. The increased loss may be due to the effective change in the check node degrees. Assuming punctured nodes of degree 5 and 6, such that there is only one core check node has a single edge to the puncture with the others (5) having two edges to the punctured nodes, a punctured degree 2 variable node effectively merges two checks the merged check has four edges to punctured nodes.

Merging the check with a single edge to punctured nodes may leave all checks with more than one edge to punctured nodes. In that case, the decoding may fail. By reducing the punctured node from degree 6 to degree 5, there may be a significant difference in whether the reduced edge connects to one of the merged checks of one of the others. If it is one of the others, then after merging there is one check with four edges to punctured nodes, one with two edges, and two with one edge. On the other hand, if it is one of the merged check nodes from which the edge is removed, then after merging there is one check with three edges to punctured nodes, two with two edges, and one with one edge. From a decoding perspective, the latter case is much more similar to the situation prior to the removal of the edge to reduce the punctured node degree and results in much better performance.

Thus, a very good solution can be achieved for the high rate case where two checks belonging to the encoding structure have single edges to the punctured node, by merging one of those checks to achieve higher rates. In other words, one of the checks with a single edge is connected to the degree two variable node that will first be punctured to achieve higher rate. In the exemplary code, as many as two degree 2 variable nodes may be punctured. It may be preferable that the two punctured two 2 variable nodes are adjacent in the encoding accumulate chain. After puncturing two degree 2 variable nodes there are three effectively merged check nodes. One of these should be one with a single edge to the punctured nodes. The other check with one edge to punctured nodes should remain unmerged for all puncturing.

Thus, one aspect of the invention is the placement of check nodes having single edges to punctured variable nodes so that one is one of those merged when puncturing degree two variable nodes to achieve higher code rate and the other is not merged.

Example HARQ Extension Arrangement for
Error-Floor Performance

The parity bits formed for the HARQ extension of a core graph can be designed using density evolution to choose the number of placement of bits used to form a parity. Density evolution makes the choice so that asymptotic performance of the structure is optimized. In particular, density evolution may function as if it were operating on an infinitely large graph with no loops. A finite LDPC graph may have loops. These loops may degrade performance in a number of ways. Small structures in the LDPC graphs, called trapping sets or near code words, can lead to error-floor failure events. The optimization performed by density evolution may not consider trapping sets, because trapping sets arise from the loops in the finite graph. Consequently, the density evolution optimization of the HARQ parity bits can leave the solution vulnerable to error floors.

An PCM with HARQ extension has a structure as optimized by density evolution, with lifting Z=8. This example is from the high rate family. The density evolution optimization may produce irregular HARQ extension in that some degree three cores participate in many more HARQ extension parities than others and for some participation in HARQ extension, parity may not occur until many parities have been added; while others participate in the first few HARQ extension parities. For example, a degree 3 core node in certain columns (e.g., columns 17 and 18) of an example PCM may have no participation in HARQ parities for a large number of the first HARQ parities. Similarly, certain other columns (e.g., column 26) in the example PCM may not participate in some HARQ parities, although it may have an early HARQ parity participation. Certain degree 2 parity columns (e.g., columns 35 and 36) in the example PCM may not participate in the HARQ parity equations for many of the early parities.

This combination of variable nodes can lead to bad error floor performance for a large number of the first 50 parity extensions. For example, these variable nodes all connect to the same three check nodes (e.g., rows 3, 4 and 5 in the example PCM). Thus, these variable nodes together with the check nodes form a subgraph that is untouched by HARQ extension bits for many bits in the extension. As HARQ extension bits are added to the code the code rate lowers so the operating signal to noise ratio (SNR) for the code becomes lower. Thus, any trapping sets in the subgraph may become more problematic as the probability of failing on the trapping set increases with lowering SNR.

Density evolution optimization may result in selection of certain nodes having few HARQ extension bits, while certain others nodes have many HARQ extension bits. In the degree 3 core, nodes with exactly the same connectivity to the check nodes may be selected to be the ones with the fewest early HARQ bits. From an error-floor perspective, however, the subgraph of the nodes with the same connectivity may have relatively small trapping sets, which may lead to poor error floor performance.

This problem may be corrected. Although the density evolution optimization of the HARQ involves detailed knowledge of the node connectivity, many of the choices of where to place HARQ edges may be nearly arbitrary. Although the optimization results in selection of a particular node, the selection of another node in its place may have result in little difference. Once some HARQ edges have been placed, additional edge decisions may be affected the by irregularity created by previous edges and should not be altered to maintain performance. Thus, a swap between degree 3 nodes of their entire HARQ extension sequence may be expected to have very little deleterious effect on the density evolution predicted asymptotic performance while potentially significantly improving the error floor. Similarly, the HARQ edge sequence of degree 2 parity nodes may be swapped without significantly affected the density evolution predicted asymptotic performance.

Swapping the HARQ sequence as suggested above can be guided by the following considerations. Certain core degree 3 variable nodes may be selected to participate in relatively few HARQ extension parities. Those variable nodes, ideally, have little overlap in the check nodes so that trapping sets including them would be relatively large, including some degree 2 variable nodes and other degree 3 core variable nodes that do have much participation in HARQ extension bits. In the particular case of the high rate example given above, the last two degree 2 core parity bits can be punctured to achieve a high rate code. Thus, the code may be optimized so that core trapping sets involving those degree 2 variable nodes may be relatively large. Thus, it may be preferable for those degree 2 nodes to be the ones with relatively small participation in the HARQ extension bits.

After swapping HARQ sequences, the HARQ lifting values may be reoptimized. For example, the HARQ parity sequence of certain nodes (e.g., nodes 15 and 17, the nodes 18 and 19, and the nodes 35 and 37) may be swapped. This arrangement may lead to much better error-floor performance.

Thus, in graphs in which some degree 2 parity variable nodes may be punctured, the node that get punctured first may be the that last participates in the HARQ parity sequence. The degree 3 code nodes that have longer initial periods during which they do not participate in the HARQ parity sequence should not connect to the same set of check nodes. Each should have at least one edge that connects to a check node not connected to the others and they should not connect only to those check nodes connected to the degree 2 parity nodes having little early participation in the HARQ parity sequence. The above described swapping may achieve these conditions and result in much better error floor performance while retaining the previous good performance above the error floor region.

CONCLUSION

The encoding techniques described herein for high performance, flexible, and compact LDPC codes may lead to improved processor performance. For example, the techniques may allow for a processor to efficiently encode information of various blocklengths and code rates using good codes (e.g., having few loops). For example, a device, such as a processing system in BS 110 or UE 120 shown in FIG. 1, may encode and/or decode code words according to aspects of the present disclosure more quickly or more efficiently (e.g., consuming less power) than a device encoding and/or decoding code words according to previously known aspects.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

In some cases, rather than actually transmitting a frame, a device may have an interface to output a frame for transmission. For example, a processor may output a frame, via a bus interface, to an RF front end for transmission. Similarly, rather than actually receiving a frame, a device may have an interface to obtain a frame received from another device. For example, a processor may obtain (or receive) a frame, via a bus interface, from an RF front end for transmission.

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for encoding may include one or more processors, such as the TX MIMO processor 430, Transmit processor 420, and/or the Controller/Processor 440 of the BS 110 illustrated in FIG. 4; the TX MIMO processor 466, Transmit Processor 464, and/or the Controller/Processor 480 of the UE 120 illustrated in FIG. 4; and/or the encoder 1102 of the encoder 1100 illustrated in FIG. 11. Means for puncturing may comprise a processing system, which may include one or more of processors of FIG. 4, and/or the puncturing module 1104 of the encoder 1100 illustrated in FIG. 11. Means for transmitting comprises a transmitter, which may include the Transmit processor 420, TX MIMO processor 430, modulator(s) 432*a*-432*t*, and/or the antenna(s) 434*a*-434*t* of the BS 110 illustrated in FIG. 4; the Transmit processor 464, TX MIMO Processor 466, modulator(s) 454*a*-454*r*, and/or antenna(s) 452*a*-452*r* of the UE 120 illustrated in FIG. 4; and/or the TX chain 1108 and antenna 1110 of the encoder 1100 illustrated in FIG. 11.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a wireless node (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer-readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein.

Further, it should be appreciated that modules and/or other appropriate means for performing the methods and techniques described herein can be downloaded and/or otherwise obtained by a wireless node and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a wireless node and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A method for wireless communication by a transmitting device, comprising:
    selecting a base graph, of a set of base graphs, for encoding information bits for transmission at one or more transmission rates in a range of transmission rates, the base graph selected based at least in part on a highest transmission rate in the range of transmission rates, each base graph of the set of base graphs associated with a family of lifted low-density parity-check (LDPC) codes;
    encoding the information bits using at least one lifted LDPC code from the family of lifted LDPC codes associated with the base graph for transmission at the one or more transmission rates to produce one or more code words; and
    transmitting the one or more code words over a medium.

2. The method of claim 1, wherein selecting the base graph comprises:
    selecting a first base graph for transmission rates above a threshold transmission rate; and
    selecting a second base graph for transmission rate below the threshold transmission rate.

3. The method of claim 1, wherein each base graph of the set of base graphs is associated with a different core rate.

4. The method of claim 1, wherein the set of base graphs have an approximately equal maximum number of base variable nodes at full hybrid automatic repeat request (HARD) extension.

5. The method of claim 1, wherein each base graph of the set of base graph is associated with a different set of lifting size values.

6. The method of claim 5, wherein the sets of lifting size values comprise a tower of clustered liftings, the tower of clustered liftings including exponentially spaced clusters of liftings within a factor of each other.

7. The method of claim 5, wherein each family of lifted LDPC codes corresponds to a range of blocklengths associated with the set of clustered lifting size values and a range of code rates, the range of code rates corresponding to different extensions of the base graph associated with the family of LDPC codes.

8. The method of claim 7, wherein selecting the base graph is further based, at least in part, on at least one of: the supported range of blocklengths or codes rates by the family LDPC codes associated with the base graph.

9. The method of claim 8, wherein:
    the supported range of code rates includes a core rate corresponding to a highest code rate in the range of code rates, the core rate associated with a core graph of the base graph, the core graph obtained by puncturing the base graph; and
    the supported range of code rates includes a lowest code rate corresponding to an extended graph of the base graph, the extended graph obtained by adding hybrid automatic repeat request (HARD) extension bits to the base graph.

10. The method of claim 9, wherein selecting the base graph is further based, at least in part, on the core rate and a highest lifting size value associated with the base graph.

11. The method of claim 9, wherein encoding the information bits comprises:
    for the highest transmission rate in the range of transmission rates, using the lifted LDPC code corresponding to the core rate; and
    for lower transmission rates in the range of transmission rates, using lifted LDPC codes corresponding to lower code rates obtained from the extended graph.

12. An apparatus for wireless communication, comprising:
    at least one processor; and
    a memory coupled to the at least one processor, the memory comprising code executable by the at least one processor to cause the apparatus to:
        select a base graph, of a set of base graphs, for encoding information bits for transmission at one or more transmission rates in a range of transmission rates, the base graph selected based at least in part on a highest transmission rate in the range of transmission rates, each base graph of the set of base graphs associated with a family of lifted low-density parity-check (LDPC) codes; and
        encode the information bits using at least one lifted LDPC code from the family of lifted LDPC codes associated with the base graph for transmission at the one or more transmission rates to produce one or more code words; and
    a transmitter configured to transmit the one or more code words over a medium.

13. The apparatus of claim 12, wherein the apparatus is configured to select the base graph by:
    selecting a first base graph for transmission rates above a threshold transmission rate; and
    selecting a second base graph for transmission rate below the threshold transmission rate.

14. The apparatus of claim 12, wherein each base graph of the set of base graphs is associated with a different core rate.

15. The apparatus of claim 12, wherein the set of base graphs have an approximately equal maximum number of base variable nodes at full hybrid automatic repeat request (HARD) extension.

16. The apparatus of claim 12, wherein each base graph of the set of base graph is associated with a different set of lifting size values.

17. The apparatus of claim 16, wherein the sets of lifting size values comprise a tower of clustered liftings, the tower of clustered liftings including exponentially spaced clusters of liftings within a factor of each other.

18. The apparatus of claim 16, wherein each family of lifted LDPC codes corresponds to a range of blocklengths associated with the set of clustered lifting size values and a range of code rates, the range of code rates corresponding to different extensions of the base graph associated with the family of LDPC codes.

19. The apparatus of claim 18, wherein the apparatus is configured to select the base graph further based, at least in part, on at least one of:
    the supported range of blocklengths or codes rates by the family LDPC codes associated with the base graph.

20. The apparatus of claim 19, wherein:
    the supported range of code rates includes a core rate corresponding to a highest code rate in the range of code rates, the core rate associated with a core graph of the base graph, the core graph obtained by puncturing the base graph; and the supported range of code rates includes a lowest code rate corresponding to an extended graph of the base graph, the extended graph obtained by adding hybrid automatic repeat request (HARD) extension bits to the base graph.

21. The apparatus of claim 20, wherein the apparatus is configured to select the base graph further based, at least in part, on the core rate and a highest lifting size value associated with the base graph.

22. The apparatus of claim 20, wherein the apparatus is configured to encode the information bits by:

for the highest transmission rate in the range of transmission rates, using the lifted LDPC code corresponding to the core rate; and for lower transmission rates in the range of transmission rates, using lifted LDPC codes corresponding to lower code rates obtained from the extended graph.

23. An apparatus for wireless communication, comprising:

means for selecting a base graph, of a set of base graphs, for encoding information bits for transmission at one or more transmission rates in a range of transmission rates, the base graph selected based at least in part on a highest transmission rate in the range of transmission rates, each base graph of the set of base graphs associated with a family of lifted low-density parity-check (LDPC) codes;

means for encoding the information bits using at least one lifted LDPC code from the family of lifted LDPC codes associated with the base graph for transmission at the one or more transmission rates to produce one or more code words; and means for transmitting the one or more code words over a medium.

24. The apparatus of claim 23, wherein selecting the base graph comprises:

selecting a first base graph for transmission rates above a threshold transmission rate; and selecting a second base graph for transmission rate below the threshold transmission rate.

25. The apparatus of claim 23, wherein each base graph of the set of base graphs is associated with a different core rate.

26. The apparatus of claim 25, wherein each family of lifted LDPC codes corresponds to a range of blocklengths associated with the set of clustered lifting size values and a range of code rates, the range of code rates corresponding to different extensions of the base graph associated with the family of LDPC codes.

27. The apparatus of claim 26, wherein selecting the base graph is further based, at least in part, on at least one of: the supported range of blocklengths or codes rates by the family LDPC codes associated with the base graph.

28. The apparatus of claim 27, wherein:

the supported range of code rates includes a core rate corresponding to a highest code rate in the range of code rates, the core rate associated with a core graph of the base graph, the core graph obtained by puncturing the base graph; and the supported range of code rates includes a lowest code rate corresponding to an extended graph of the base graph, the extended graph obtained by adding hybrid automatic repeat request (HARD) extension bits to the base graph.

29. The apparatus of claim 28, wherein encoding the information bits comprises:

for the highest transmission rate in the range of transmission rates, using the lifted LDPC code corresponding to the core rate; and for lower transmission rates in the range of transmission rates, using lifted LDPC codes corresponding to lower code rates obtained from the extended graph.

30. A non-transitory computer readable medium that stores instructions that when executed by a transmitting device cause the transmitting device to perform a method for wireless communication, the method comprising:

selecting a base graph, of a set of base graphs, for encoding information bits for transmission at one or more transmission rates in a range of transmission rates, the base graph selected based at least in part on a highest transmission rate in the range of transmission rates, each base graph of the set of base graphs associated with a family of lifted low-density parity-check (LDPC) codes;

encoding the information bits using at least one lifted LDPC code from the family of lifted LDPC codes associated with the base graph for transmission at the one or more transmission rates to produce one or more code words; and transmitting the one or more code words over a medium.

31. The method of claim 1, wherein the base graph is selected further based on a blocklength associated with the transmission.

32. The apparatus of claim 12, wherein the base graph is selected further based on a blocklength associated with the transmission.

33. The apparatus of claim 23, wherein the base graph is selected further based on a blocklength associated with the transmission.

34. The non-transitory computer readable medium of claim 30, wherein the base graph is selected further based on a blocklength associated with the transmission.

* * * * *